US009595951B2

(12) United States Patent
Sprinkle et al.

(10) Patent No.: US 9,595,951 B2
(45) Date of Patent: Mar. 14, 2017

(54) RADIO-FREQUENCY SWITCHES HAVING GATE BIAS AND FREQUENCY-TUNED BODY BIAS

(71) Applicant: SKYWORKS SOLUTIONS, INC., Woburn, MA (US)

(72) Inventors: Steven Christopher Sprinkle, Hampstead, NH (US); Fikret Altunkilic, North Andover, MA (US); Haki Cebi, Waltham, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/474,050

(22) Filed: Aug. 29, 2014

(65) Prior Publication Data

US 2015/0022256 A1 Jan. 22, 2015

Related U.S. Application Data

(63) Continuation of application No. 13/936,180, filed on Jul. 6, 2013, now Pat. No. 9,160,328.

(Continued)

(51) Int. Cl.
*H03K 3/01* (2006.01)
*H03K 17/16* (2006.01)
(Continued)

(52) U.S. Cl.
CPC ....... *H03K 17/161* (2013.01); *H01L 21/8234* (2013.01); *H01L 27/1203* (2013.01); *H03K 17/693* (2013.01)

(58) Field of Classification Search
USPC ....... 327/534, 535, 537, 384, 427, 434, 437, 327/379; 455/78
See application file for complete search history.

(56) References Cited

U.S. PATENT DOCUMENTS

| 4,255,756 A | 3/1981 | Shimotori et al. |
| 4,999,585 A | 3/1991 | Burt et al. |

(Continued)

FOREIGN PATENT DOCUMENTS

| JP | 2005-505657 A | 5/2005 |
| JP | 2008017416 A | 1/2008 |

(Continued)

OTHER PUBLICATIONS

International Search Report and Written Opinion for PCT/US2013/049500 dated Dec. 23, 2013.

(Continued)

*Primary Examiner* — Lincoln Donovan
*Assistant Examiner* — Thomas Skibinski
(74) *Attorney, Agent, or Firm* — Chang & Hale LLP; Tony T. Chen; James Chang

(57) ABSTRACT

Radio-frequency (RF) switch circuits are disclosed providing improved switching performance. An RF switch system includes a plurality of field-effect transistors (FETs) connected in series between first and second nodes, each FET having a gate and a body. A compensation network including a gate-coupling circuit couples the gates of each pair of neighboring FETs. The compensation network may further including a body-coupling circuit that couples the bodies of each pair of neighboring FETs.

18 Claims, 41 Drawing Sheets

Related U.S. Application Data

(60) Provisional application No. 61/669,055, filed on Jul. 7, 2012.

(51) Int. Cl.
*H01L 21/8234* (2006.01)
*H01L 27/12* (2006.01)
*H03K 17/693* (2006.01)

(56) References Cited

U.S. PATENT DOCUMENTS

| | | | |
|---|---|---|---|
| 5,382,826 A | | 1/1995 | Mojaradi et al. |
| 5,448,198 A | * | 9/1995 | Toyoshima et al. ......... 327/530 |
| 5,644,266 A | | 7/1997 | Chen et al. |
| 5,748,016 A | | 5/1998 | Kurosawa |
| 5,753,955 A | | 5/1998 | Fechner |
| 5,969,564 A | | 10/1999 | Komatsu et al. |
| 6,281,737 B1 | * | 8/2001 | Kuang et al. ................ 327/382 |
| 6,989,706 B2 | | 1/2006 | Sekigawa et al. |
| 7,095,266 B2 | | 8/2006 | Miske |
| 7,236,044 B2 | * | 6/2007 | Talwalkar et al. ............ 327/534 |
| 7,385,436 B2 | | 6/2008 | Itoh et al. |
| 7,619,462 B2 | | 11/2009 | Kelly et al. |
| 7,659,765 B2 | | 2/2010 | Ito |
| 7,659,770 B2 | | 2/2010 | Teraguchi et al. |
| 7,683,433 B2 | | 3/2010 | Kapoor et al. |
| 7,848,712 B2 | | 12/2010 | Fu et al. |
| 7,885,614 B2 | | 2/2011 | Jedeloo |
| 7,890,063 B2 | | 2/2011 | Ahn et al. |
| 7,898,297 B2 | | 3/2011 | Kapoor et al. |
| 7,910,993 B2 | | 3/2011 | Brindle et al. |
| 7,928,794 B2 | | 4/2011 | Balboni |
| 8,054,143 B2 | | 11/2011 | Takahashi |
| 8,441,304 B2 | | 5/2013 | Kinoshita et al. |
| 8,461,903 B1 | | 6/2013 | Granger-Jones |
| 8,514,008 B2 | | 8/2013 | Yan et al. |
| 8,723,260 B1 | | 5/2014 | Carroll et al. |
| 8,779,840 B2 | | 7/2014 | Sugiura et al. |
| 2005/0239415 A1 | | 10/2005 | Sagae et al. |
| 2006/0012407 A1 | | 1/2006 | Bechman et al. |
| 2006/0199563 A1 | | 9/2006 | Kelly et al. |
| 2007/0018247 A1 | * | 1/2007 | Brindle ............ H01L 29/78609 257/347 |
| 2008/0258799 A1 | | 10/2008 | Teraguchi et al. |
| 2008/0272824 A1 | | 11/2008 | Fu et al. |
| 2009/0181630 A1 | | 7/2009 | Seshita et al. |
| 2010/0060377 A1 | | 3/2010 | Takahashi |
| 2011/0012669 A1 | | 1/2011 | Stuber et al. |
| 2011/0025403 A1 | | 2/2011 | Cassia |
| 2011/0148501 A1 | | 6/2011 | Granger-Jones et al. |
| 2011/0169550 A1 | | 7/2011 | Brindle et al. |
| 2012/0146722 A1 | * | 6/2012 | Scott ............... H03F 1/223 330/192 |
| 2013/0009725 A1 | | 1/2013 | Heaney et al. |
| 2014/0002171 A1 | | 1/2014 | Nohra |
| 2014/0009203 A1 | | 1/2014 | Cebi et al. |
| 2014/0009208 A1 | | 1/2014 | Smith |
| 2014/0009214 A1 | | 1/2014 | Altunkilic et al. |

FOREIGN PATENT DOCUMENTS

| | | |
|---|---|---|
| JP | 2008270964 A | 11/2008 |
| WO | 2011045442 A2 | 4/2011 |

OTHER PUBLICATIONS

U.S. Appl. No. 13/936,180, Circuits, Devices, Methods and Applications Related to Silicon-on-Insulator Based Radio-Frequency Switches, filed Jul. 6, 2013.

Search Report for European Appl. No. 13817490.9 dated Feb. 3, 2016.

Office Action for U.S. Appl. No. 14/843,212, mailed Aug. 19, 2016.

* cited by examiner

RADIO-FREQUENCY SWITCHES HAVING GATE BIAS AND FREQUENCY-TUNED BODY BIAS

RELATED APPLICATION

This application is a continuation of U.S. patent application Ser. No. 13/936,180, filed on Jul. 6, 2013, and entitled "CIRCUITS, DEVICES, METHODS AND APPLICATIONS RELATED TO SILICON-ON-INSULATOR BASED RADIO-FREQUENCY SWITCHES", which claims the benefit of priority under 35 U.S.C. §119(e) of U.S. Provisional Application No. 61/669,055, filed on Jul. 7, 2012, and entitled "Circuits, Devices, Methods and Applications Related to Silicon-on-Insulator Based Radio-Frequency Switches," the disclosures of which are all hereby incorporated by reference in their entireties for all purposes.

BACKGROUND

1. Field

The present disclosure generally relates to the field of electronics, and more particularly, to radio-frequency switches.

2. Description of Related Art

Radio-frequency (RF) switches, such as transistor switches, can be used to switch signals between one or more poles and one or more throws. Transistor switches, or portions thereof, can be controlled through transistor biasing and/or coupling. Design and use of bias and/or coupling circuits in connection with RF switches can affect switching performance.

SUMMARY

Certain embodiments disclosed herein provide a radio-frequency (RF) switch including a plurality of field-effect transistors (FETs) connected in series between first and second nodes, each FET having a gate and a body. The RF switch may further include a compensation network including a gate-coupling circuit that couples the gates of each pair of neighboring FETs, the compensation network further including a body-coupling circuit that couples the bodies of each pair of neighboring FETs. In certain embodiments, at least some of the FETs are silicon-on-insulator (SOI) FETs. The gate-coupling circuit may include a capacitor and possibly a resistor in series with the capacitor.

In certain embodiments, the gate-coupling circuit includes a resistor. The body-coupling circuit may include a capacitor. The body-coupling circuit may further include a resistor in series with the capacitor. In certain embodiments, the body-coupling circuit includes a resistor.

Certain embodiments disclosed herein provide a process for operating a radio-frequency (RF) switch. The process may include controlling a plurality of field-effect transistors (FETs) connected in series between first and second nodes so that the FETs are collectively in an ON state or an OFF state, each FET having a gate and a body. The process may further include coupling the gates of each of neighboring FETs to reduce voltage swings across each of the plurality of FETs, and coupling the bodies of each of neighboring FETs to reduce voltage swings across each of the plurality of FETs.

Certain embodiments disclosed herein provide a semiconductor die including a semiconductor substrate and a plurality of field-effect transistors (FETs) formed on the semiconductor substrate and connected in series, each FET including a gate and a body. The semiconductor die may further include a compensation network formed on the semiconductor substrate, the compensation network including a gate-coupling circuit that couples the gates of each pair of neighboring FETs, the compensation network further including a body-coupling circuit that couples the bodies of each pair of neighboring FETs.

The semiconductor die may further including an insulator layer disposed between the FETs and the semiconductor substrate. In certain embodiments, the die is a silicon-on-insulator (SOI) die.

Certain embodiments provide a process for fabricating a semiconductor die. The process may include providing a semiconductor substrate and forming a plurality of field-effect transistors (FETs) on the semiconductor substrate so as to be connected in series, each FET having a gate and a body. The process may further include forming a gate-coupling circuit on the semiconductor substrate to couple the gates of each pair of neighboring FETs, and forming a body-coupling circuit on the semiconductor substrate to couple the bodies of each pair of neighboring FETs. In certain embodiments, the process further includes forming an insulator layer between the FETs and the semiconductor substrate.

Certain embodiments disclosed herein provide a radio-frequency (RF) switch module including a packaging substrate configured to receive a plurality of components and a semiconductor die mounted on the packaging substrate, the die including a plurality of field-effect transistors (FETs) connected in series, each FET including a gate and a gate. The RF switch module further includes a compensation network including a gate-coupling circuit that couples the gates of each pair of neighboring FETs, the compensation network further including a body-coupling circuit that couples the bodies of each pair of neighboring FETs.

The semiconductor die may be a silicon-on-insulator (SOI) die. In certain embodiments, the compensation network is part of the same semiconductor die as the plurality of FETs. The compensation network may be part of a second die mounted on the packaging substrate. In certain embodiments, the compensation network is disposed at a location outside of the semiconductor die.

Certain embodiments disclosed herein provide a wireless device including a transceiver configured to process RF signals and an antenna in communication with the transceiver configured to facilitate transmission of an amplified RF signal. The wireless device further includes a power amplifier connected to the transceiver and configured to generate the amplified RF signal, and a switch connected to the antenna and the power amplifier and configured to selectively route the amplified RF signal to the antenna, the switch including a plurality of field-effect transistors (FETs) connected in series, each FET including a gate and a gate, the switch further including a compensation network having a gate-coupling circuit that couples the gates of each pair of neighboring FETs and a body-coupling circuit that couples the bodies of each pair of neighboring FETs.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

FIG. 21 shows a seventh example of an RF switch circuit having a body of an FET resistively coupled to a gate in a switchable manner to, for example, provide minimum or reduced insertion loss when the switch circuit is ON, and to provide DC voltages to both of the body and gate of the FET to prevent or reduce parasitic junction diodes being turned on.

DETAILED DESCRIPTION

The headings provided herein, if any, are for convenience only and do not necessarily affect the scope or meaning of the claimed invention.

Figure 1:
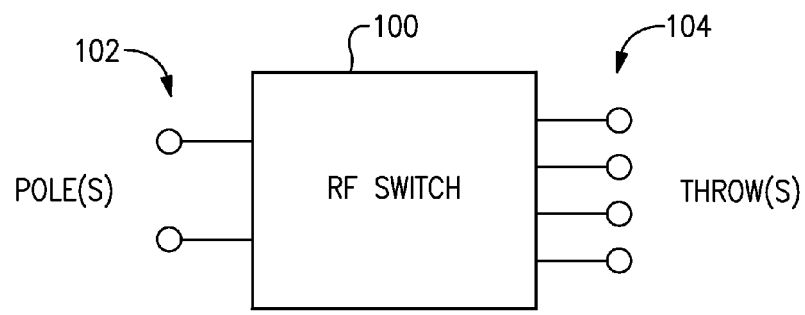
FIG. 1 schematically shows a radio-frequency (RF) switch configured to switch one or more signals between one or more poles and one or more throws.

Example Components of a Switching Device:

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 2:
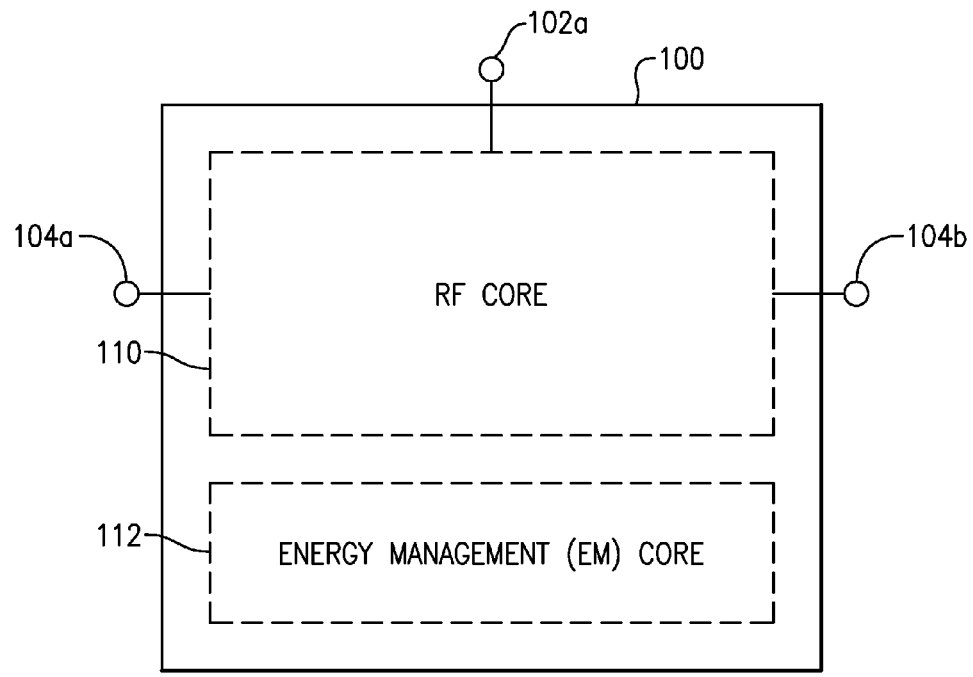
FIG. 2 shows that the RF switch 100 of FIG. 1 can include an RF core and an energy management (EM) core.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
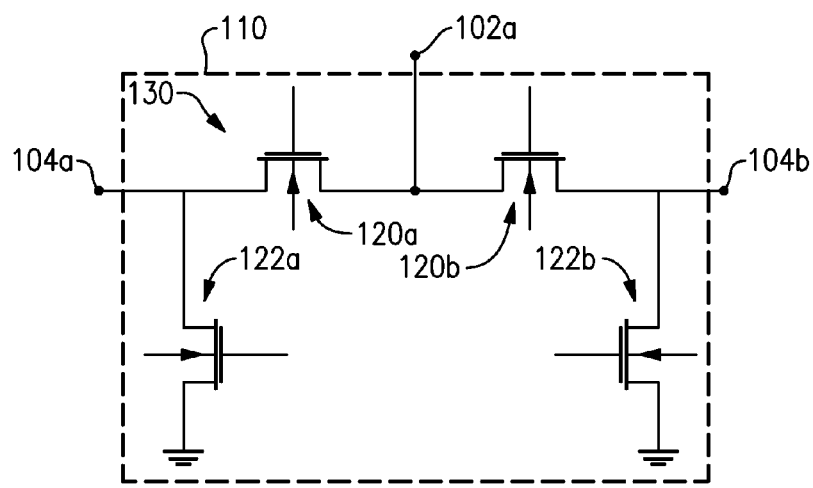
FIG. 3 shows an example of the RF core implemented in an single-pole-double-throw (SPDT) configuration.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 4:
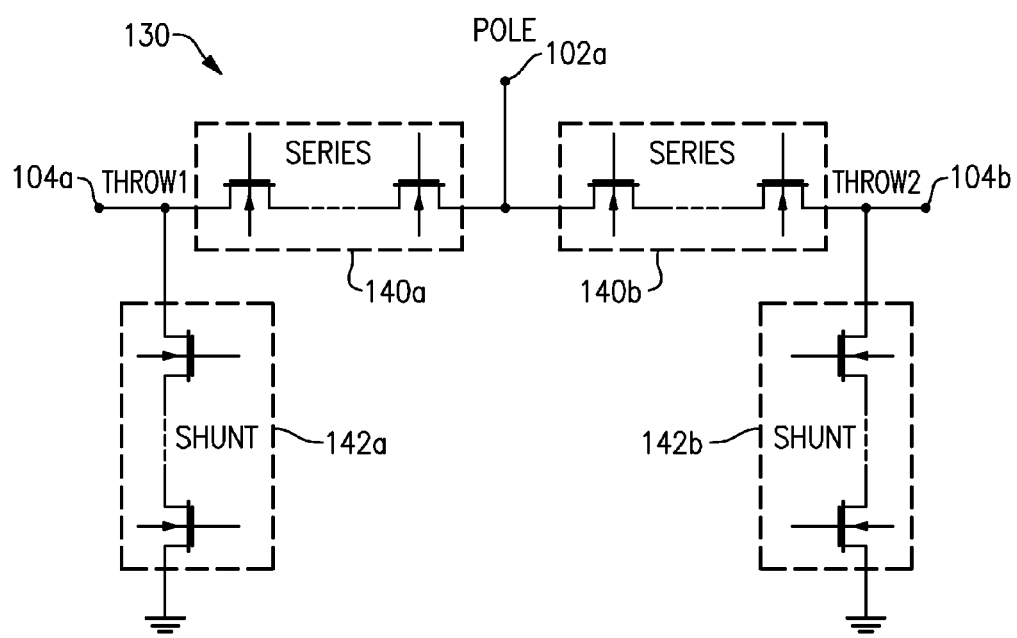
FIG. 4 shows an example of the RF core implemented in an SPDT configuration where each switch arm can include a plurality of field-effect transistors (FETs) connected in series.

An example RF core configuration 130 of an RF core having such switch arm segments is shown in FIG. 4. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate. In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 5:
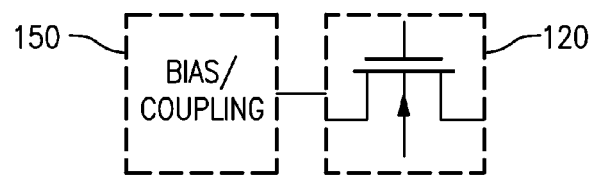
FIG. 5 schematically shows that controlling of one or more FETs in an RF switch can be facilitated by a circuit configured to bias and/or couple one or more portions of the FETs.

At least some of the present disclosure relates to how an FET or a group of FETs can be controlled to provide switching functionalities in desirable manners. FIG. 5 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 6:
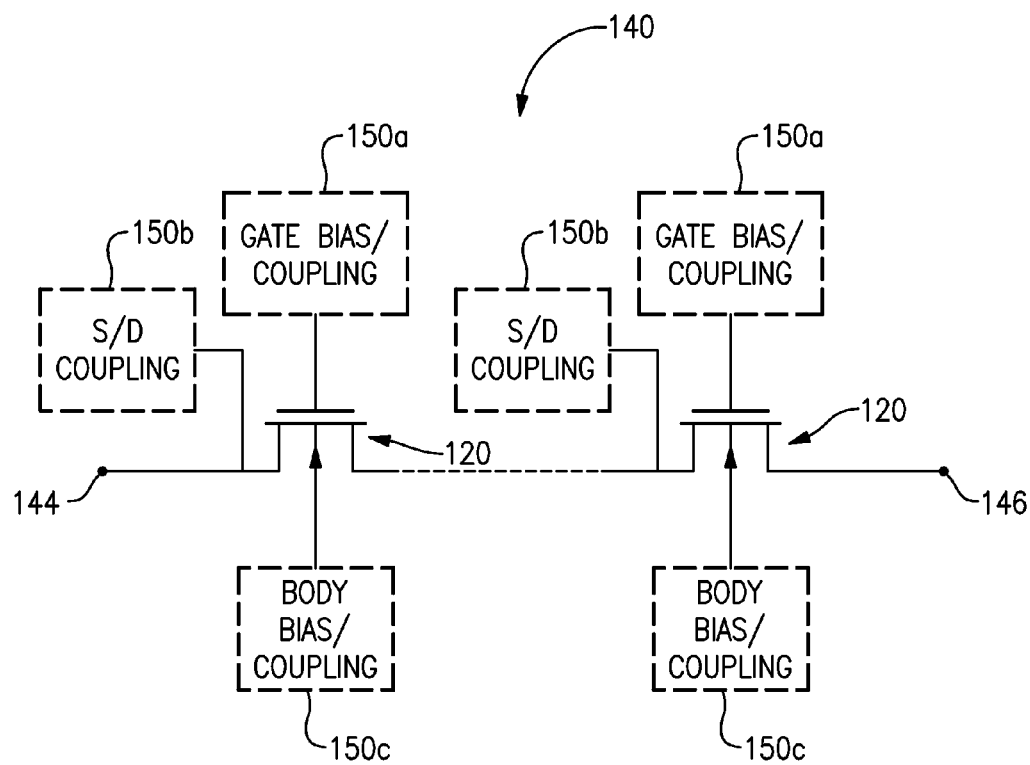
FIG. 6 shows examples of the bias/coupling circuit implemented on different parts of a plurality of FETs in a switch arm.

Schematic examples of how such biasing and/or coupling of different parts of one or more FETs are described in reference to FIG. 6. In FIG. 6, a switch arm segment 140 (that can be, for example, one of the example switch arm segments 140a, 140b, 142a, 142b of the example of FIG. 4) between nodes 144, 146 is shown to include a plurality of FETs 120. Operations of such FETs can be controlled and/or facilitated by a gate bias/coupling circuit 150a, and a body bias/coupling circuit 150c, and/or a source/drain coupling circuit 150b.

Gate Bias/Coupling Circuit

In the example shown in FIG. 6, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability and/or switching device linearity.

Body Bias/Coupling Circuit

As shown in FIG. 6, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability and/or switching device linearity.

Source/Drain Coupling Circuit

As shown in FIG. 6, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability and/or switching device linearity.

Examples of Switching Performance Parameters:

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that intro- duce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1+f_2$, $f_2-f_1$, $2f_1$, and $2f_2$. A third-order IMD (also referred to as IMD3) is typically considered to include $2f_1+f_2$, $2f_1-f_2$, $f_1+2f_2$, $f_1-2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Examples of FET Structures and Fabrication Process Technologies:

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 7A:
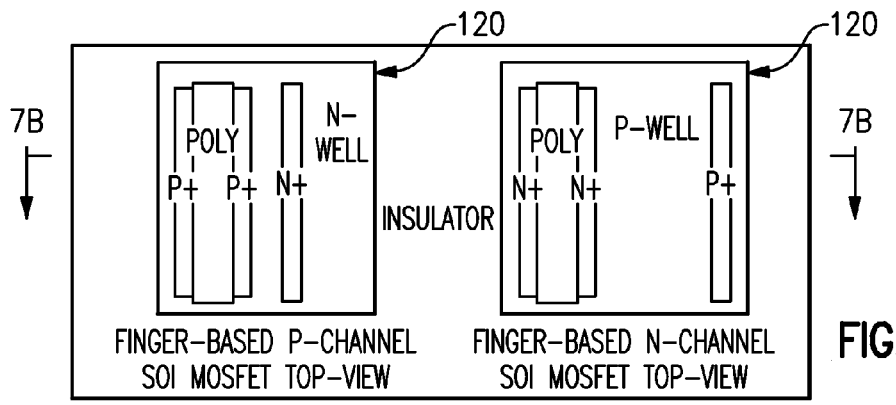
FIGS. 7A and 7B show plan and side sectional views of an example finger-based FET device implemented in a silicon-on-insulator (SOI) configuration.
Figure 7B:
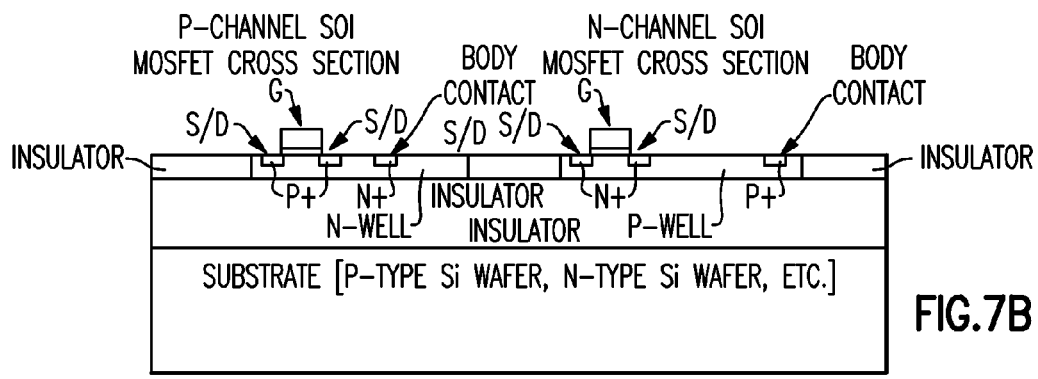

In some SOI FET configurations, each transistor can be configured as a finger-based device where the source and drain are rectangular shaped (in a plan view) and a gate structure extends between the source and drain like a rectangular shaped finger. FIGS. 7A and 7B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 7A and 7B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 7A and 7B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried insulator layer. Such a configuration can provide, for example, reduced source/drain junction capacitance. To form a body contact for such a configuration, an additional gate region can be provided on the side so as to allow, for example, an isolated P+ region to contact the Pwell.

Figure 8A:
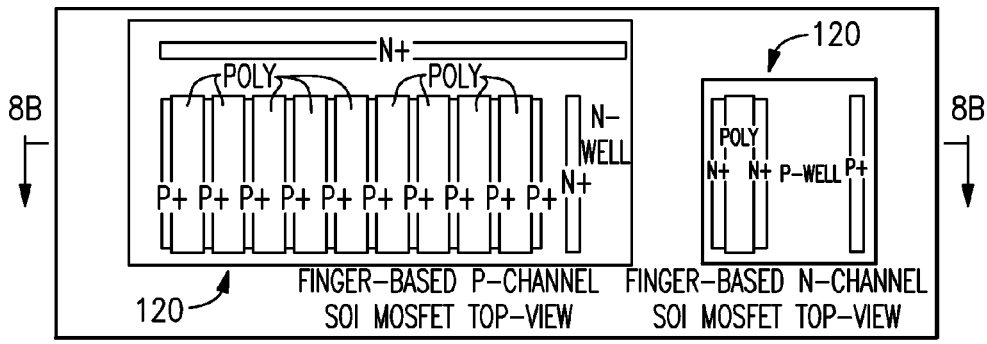
FIGS. 8A and 8B show plan and side sectional views of an example of a multiple-finger FET device implemented in an SOI configuration.
Figure 8B:
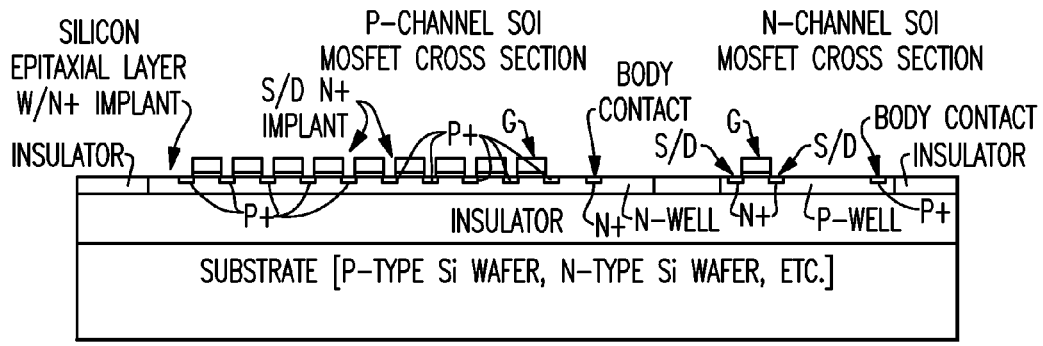

FIGS. 8A and 8B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 7A and 7B.

The example multiple-finger FET device of FIGS. 8A and 8B can be made to operate such that a drain of one FET acts as a source of its neighboring FET. Thus, the multiple-finger FET device as a whole can provide a voltage-dividing functionality. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

In some implementations, a plurality of the foregoing multi-finger FET devices can be connected in series as a switch to, for example, further facilitate the voltage-dividing functionality. A number of such multi-finger FET devices can be selected based on, for example, power handling requirement of the switch.

Examples of Bias and/or Coupling Configurations for Improved Performance:

Described herein are various examples of how FET-based switch circuits can be biased and/or coupled to yield one or more performance improvements. In some embodiments, such biasing/coupling configurations can be implemented in SOI FET-based switch circuits. It will be understood that some of the example biasing/coupling configurations can be combined to yield a combination of desirable features that may not be available to the individual configurations. It will also be understood that, although described in the context of RF switching applications, one or more features described herein can also be applied to other circuits and devices that utilize FETs such as SOI FETs.

Description of Example 1

In some radio-frequency (RF) applications, it is desirable to utilize switches having high linearity, as well as management of intermodulation distortion (IMD) such as IMD3 and IMD2. Such switch-related performance features can contribute significantly to system-level performance of cellular devices. In the context of silicon-on-oxide (SOI) switches, factors such as substrate-coupling (sometimes also referred to as substrate parasitics) and SOI-process can limit the performance achievable.

Such a limitation in performance of SOI switches can be addressed by extensive substrate crosstalk reduction techniques such as capacitive guard rings, and/or trap rich or deep trench isolation techniques. Such techniques typically have associated with them undesirable features such as being expensive, requiring relatively large areas, and requiring additional process steps. Also, such technique can yield a desirable effect that is limited to an isolation feature.

Figure 9:
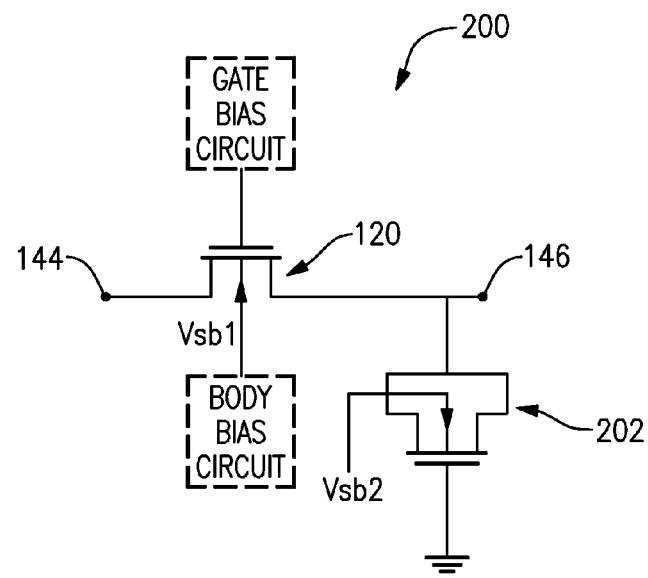
FIG. 9 shows a first example of an RF switch circuit having a non-linear capacitor connected to a source terminal of an FET and configured to, for example, cancel or reduce non-linearity effects generated by the FET.

In some implementations, performance of SOI switches can be improved by overcoming or reducing the foregoing effects associated with substrate parasitics and/or process variables. By way of an example, FIG. 9 shows a switch circuit 200 having an SOI FET 120 configured to provide switching functionality between first and second nodes 144, 146. A gate terminal of the FET 120 is shown to be biased by a bias voltage Vg provided by a gate bias circuit, and a body terminal of the FET 120 is shown to be biased by a bias voltage Vsb1 provided by a body bias circuit. In some embodiments, the body terminal can be connected to a source terminal, so that both terminals are provided with the bias voltage Vsb1.

In some embodiments, the source terminal of the FET 120 can be connected to a non-linear capacitor 202. In embodiments where the FET 120 is a MOSFET device, the capacitor 202 can be a MOSFET capacitor configured to provide one or more desired capacitance values. The MOS capacitor 202 can be configured to generate one or more harmonics to cancel or reduce non-linearity effects generated by the MOSFET 120. The MOS cap 202 is shown to be biased by Vsb2. In some embodiments, either or both of Vsb1 and Vsb2 can be adjusted to yield a desired level of non-linearity cancellation. Although described in the context of the source side of the FET 120, it will be understood that the MOS cap 202 can also be implemented on the drain side of the FET.

Figure 10:
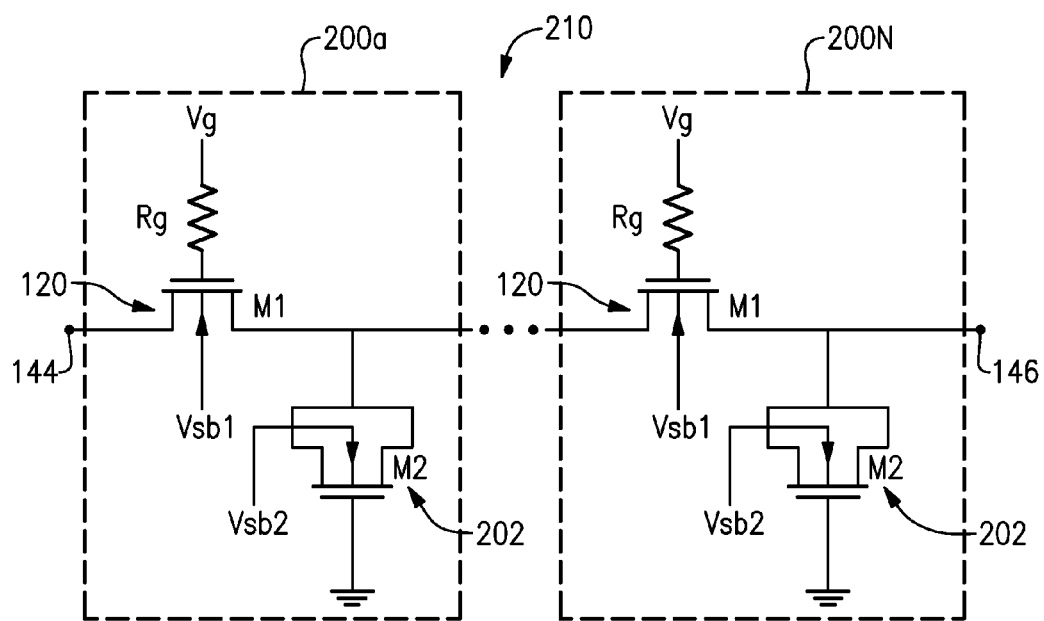
FIG. 10 shows that one or more features of FIG. 9 can be implemented in a switch arm having a plurality of FETs.

FIG. 10 shows a switch arm 210 having a plurality of the switch circuits 200 described in reference to FIG. 9. In the example, N such switch circuits are shown to be connected in series in a stack to provide switching functionality between terminals 144, 146. In some embodiments, the number (N) of FETs in such a stack can be selected based on power being transferred between the terminals 144, 146. For example, N can be larger for situations involving higher power.

In some embodiments, gate bias voltages (Vg) for the plurality of FETs 120 can be substantially the same, and be provided by a common gate bias circuit. Such a common gate bias voltage Vg is shown to be provided to the gates via a gate resistor Rg. Similarly, body bias voltages (Vsb1) for the plurality of FETs 120 can be substantially the same, and be provided by a common body bias circuit. Similarly, body bias voltages (Vsb2) for the plurality of MOS capacitors 202 can be substantially the same, and be provided by a common body bias circuit (not shown). In some implementations, some or all of the bodies of the FETs 120 and/or the MOS capacitors 202 can be biased separately. Such a configuration can be beneficial in some situations, depending on the frequency of operation.

In some implementations, the foregoing example configurations described in reference to FIGS. 9 and 10 can allow significant or substantially complete cancellation of non-linearity effects associated with one or more SOI FET based RF switches. In some embodiments, such configurations can be implemented so that minimal or relatively little additional area is required.

Summary of Example 1

According to some implementations, Example 1 relates to a radio-frequency (RF) switch that includes at least one field-effect transistor (FET) disposed between first and second nodes, with each of the at least one FET having a respective source and drain. The switch further includes a compensation circuit connected to the respective source or the respective drain of each of the at least one FET. The compensation circuit is configured to compensate a non-linearity effect generated by the at least one FET.

In some embodiments, the FET can be a silicon-on-insulator (SOI) FET. In some embodiments, the compensation circuit can include a non-linear capacitor. The non-linear capacitor can include a metal-oxide-semiconductor (MOS) capacitor. The MOS capacitor can be configured to generate one or more harmonics to substantially cancel the non-linearity effect generated by the FET. The MOS capacitor can include an FET structure. The one or more harmonics generated by the MOS capacitor can be controlled at least in part by a body bias signal provided to the FET structure of the MOS capacitor.

In some embodiments, the non-linear capacitor can be connected to the source of the FET.

In some embodiments, the switch can further include a gate bias circuit connected to and configured to provide a bias signal to a gate of the FET.

In some embodiments, the switch can further include a body bias circuit connected to and configured to provide a bias signal to a body of the FET.

In some embodiments, the first node can be configured to receive an RF signal having a power value and the second node is configured to output the RF signal when the FET is in an ON state. The at least one FET can include N FETs connected in series, with the quantity N being selected to allow the switch circuit to handle the power of the RF signal.

In some implementations, Example 1 relates to a method for operating a radio-frequency (RF) switch. The method includes controlling at least one field-effect transistor (FET) disposed between first and second nodes so that each of the at least one FET is in an ON state or an OFF state. The method further includes compensating a non-linear effect of the at least one FET by applying another non-linear signal to a respective source or a respective drain of each of the at least one FET.

In accordance with a number of implementations, Example 1 relates to a semiconductor die that includes a semiconductor substrate and at least one field-effect transistor (FET) formed on the semiconductor substrate. The die further includes a compensation circuit connected to a respective source or a respective drain of each of the at least one FET. The compensation circuit is configured to compensate a non-linearity effect generated by the at least one FET.

In some embodiments, the die can further include an insulator layer disposed between the FET and the semiconductor substrate. The die can be a silicon-on-insulator (SOI) die.

In a number of implementations, Example 1 relates to a method for fabricating a semiconductor die. The method includes providing a semiconductor substrate, and forming at least one field-effect transistor (FET) on the semiconductor substrate, with each of the at least one FET having a respective source and a respective drain. The method further includes forming a compensation circuit on the semiconductor substrate. The method further includes connecting the compensation circuit to the respective source or the respective drain of each of the at least one FET to thereby allow the compensation circuit to compensate a non-linearity effect generated by the at least one FET.

In some embodiments, the method can further include forming an insulator layer between the FET and the semiconductor substrate.

According to some implementations, Example 1 relates to a radio-frequency (RF) switch module that includes a packaging substrate configured to receive a plurality of components. The module further includes a semiconductor die mounted on the packaging substrate, with the die having at least one field-effect transistor (FET). The module further includes a compensation circuit connected to a respective source or a respective drain of each of the at least one FET. The compensation circuit is configured to compensate a non-linearity effect generated by the at least one FET.

In some embodiments, the semiconductor die can be a silicon-on-insulator (SOI) die. In some embodiments, compensation circuit can be part of the same semiconductor die as the at least one FET. In some embodiments, the compensation circuit can be part of a second die mounted on the packaging substrate. In some embodiments, the compensation circuit can be disposed at a location outside of the semiconductor die.

In some implementations, Example 1 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET). The switch further includes a compensation circuit connected to a respective source or a respective drain of each of the at least one FET. The compensation circuit is configured to compensate a non-linearity effect generated by the at least one FET.

Description of Example 2

As described herein, intermodulation distortion (IMD) can be a measure of unwanted signal added to a desired signal due to mixing products from other radio-frequency (RF) signals. Such distortions can be particularly dominant in a multi-mode, multi-band environment.

IMD can result from two or more signals mixing together and yielding frequencies that are not harmonic frequencies. In some implementations, susceptibility to such interference can be reduced by improving linearity of a system, since the system's linearity can govern how much IMD (and in turn interferences) will occur. Through improved linearity of the system's building blocks (such as an RF switch), an overall susceptibility of the system to interference can be decreased.

The desire for lower IMD in RF switches can play an important role in various wireless system designs. There has been a significant amount of effort in the wireless industry to reduce IMDs in switches. For example Long Term Evolution (LTE) systems can benefit significantly from RF switches having reduced IMDs. As a more specific example, system designs for simultaneous voice and data on LTE (SVLTE) can benefit significantly from RF switches having ultra-low levels of IMDs.

In some implementations, a gate terminal and either of source and drain terminals of an FET can be coupled by a circuit for IMD performance improvement. For the purpose of description, it will be assumed that such a circuit couples the gate and source terminals; however, it will be understood that the circuit can couple the gate terminal and the drain terminal.

In some implementations, a body terminal and either of source and drain terminals of an FET can be coupled by a circuit for IMD performance improvement. For the purpose of description, it will be assumed that such a circuit couples the body and source terminals; however, it will be understood that the circuit can couple the body terminal and the drain terminal.

In some implementations, each of gate and body terminal and either of source and drain terminals of an FET can be coupled by circuits for IMD performance improvement. For the purpose of description, it will be assumed that such circuits couple each of the gate and body terminals to the source terminal; however, it will be understood that such couplings can be made to the drain terminal.

Figure 11A:
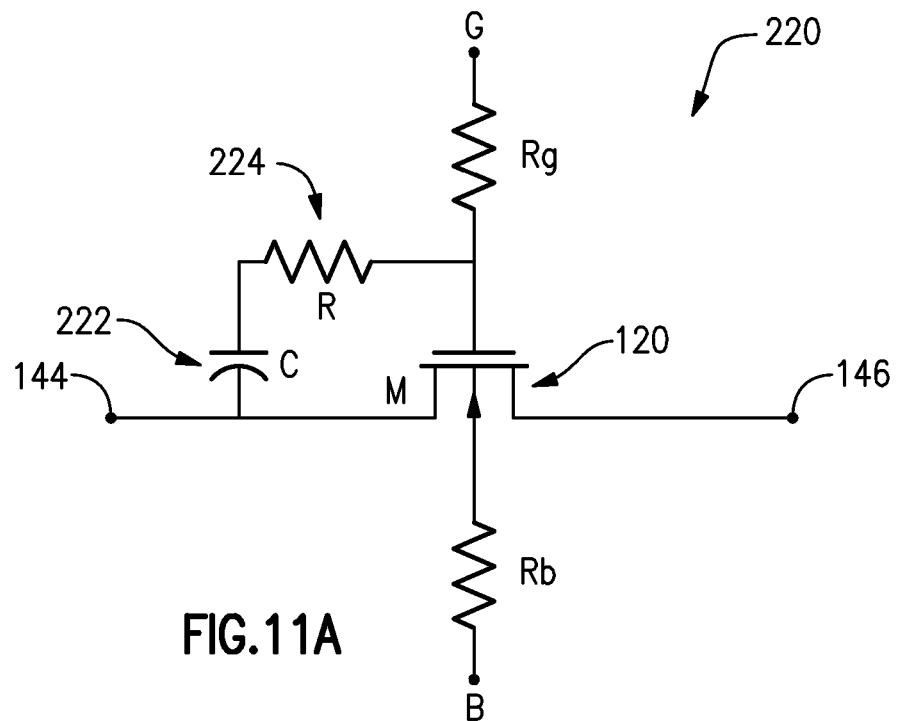
FIGS. 11A-11F show variations of a second example of an RF switch circuit where either or both of gate and body terminals of an FET can be coupled with a source terminal by one or more coupling circuits having a capacitor in series with a resistor to, for example, allow discharge of interface charge from the coupled gate and/or body.
Figure 11B:
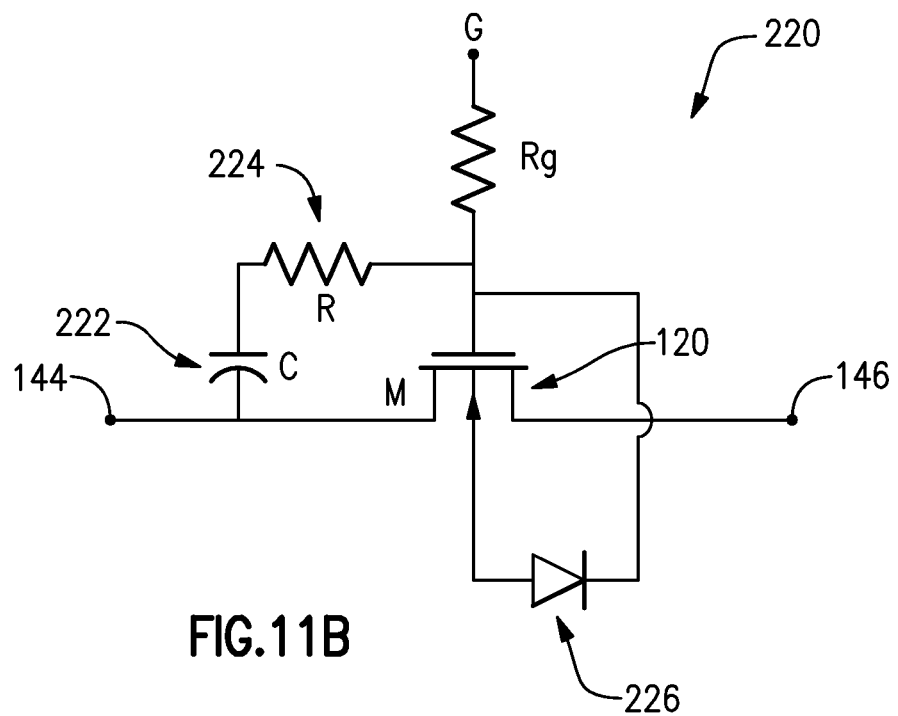
Figure 11C:
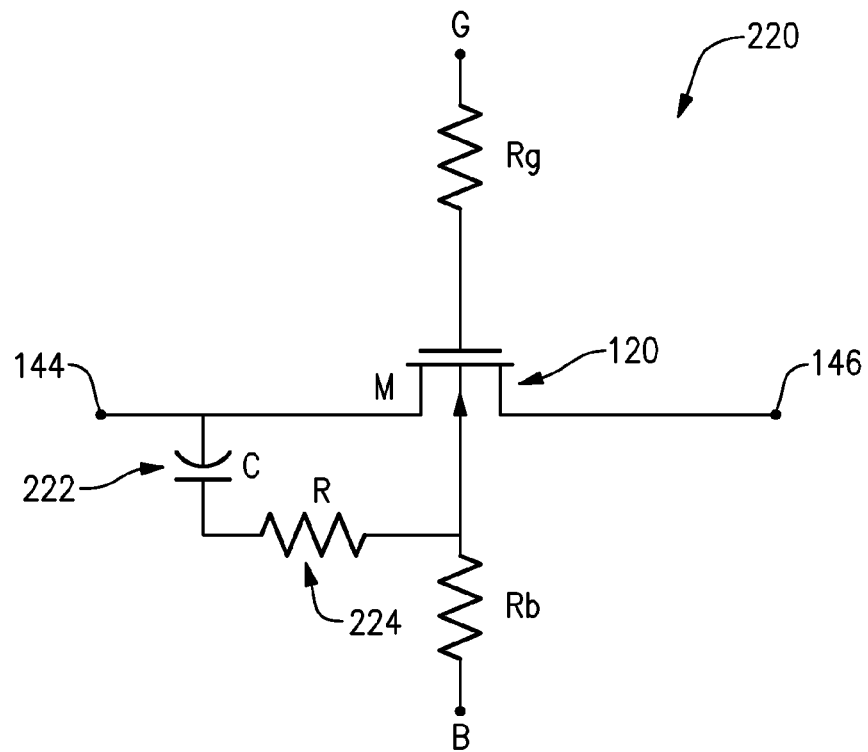
Figure 11D:
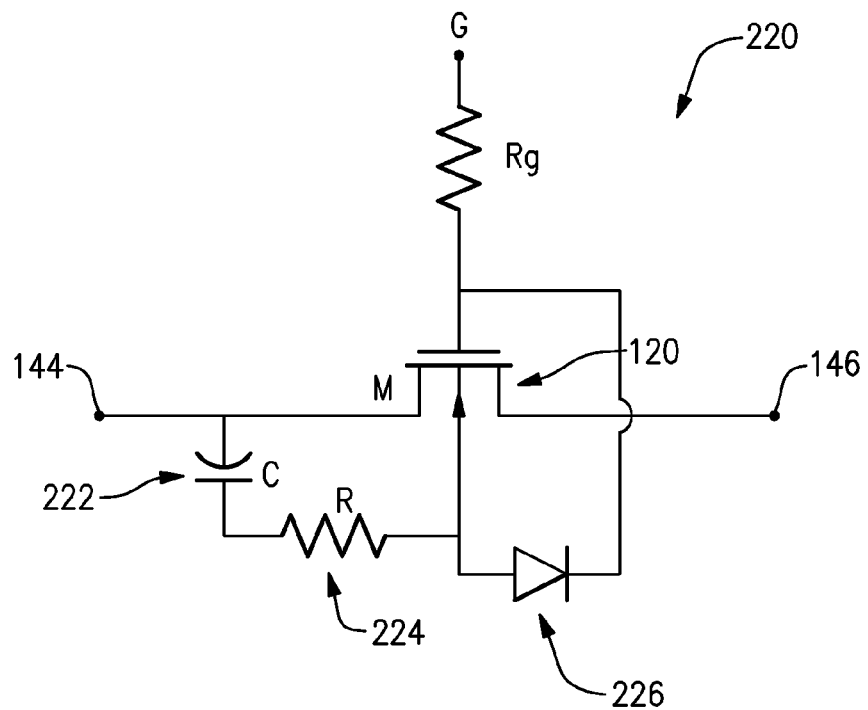
Figure 11E:
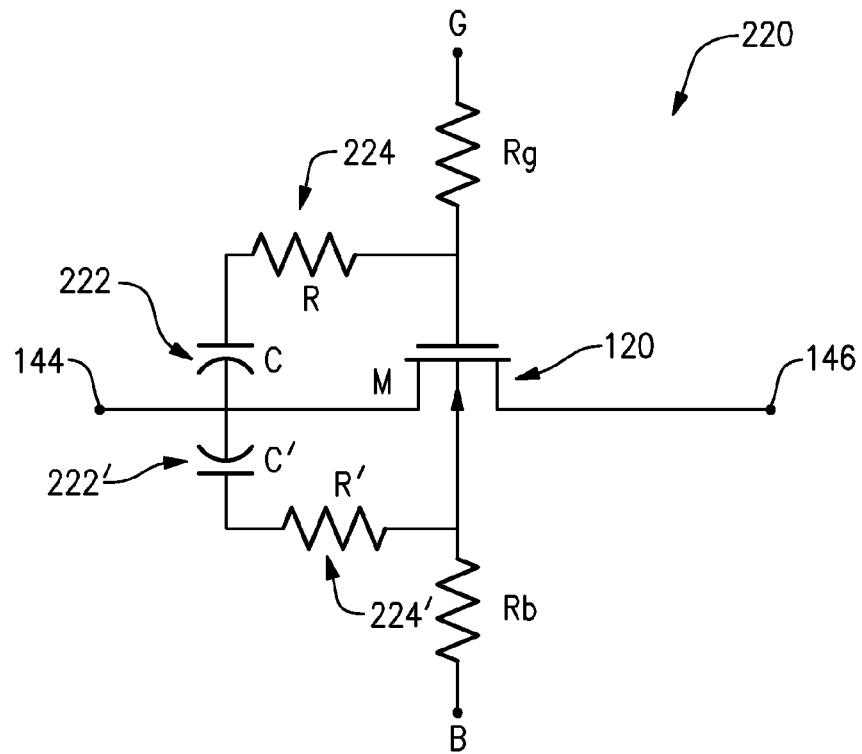
Figure 11F:
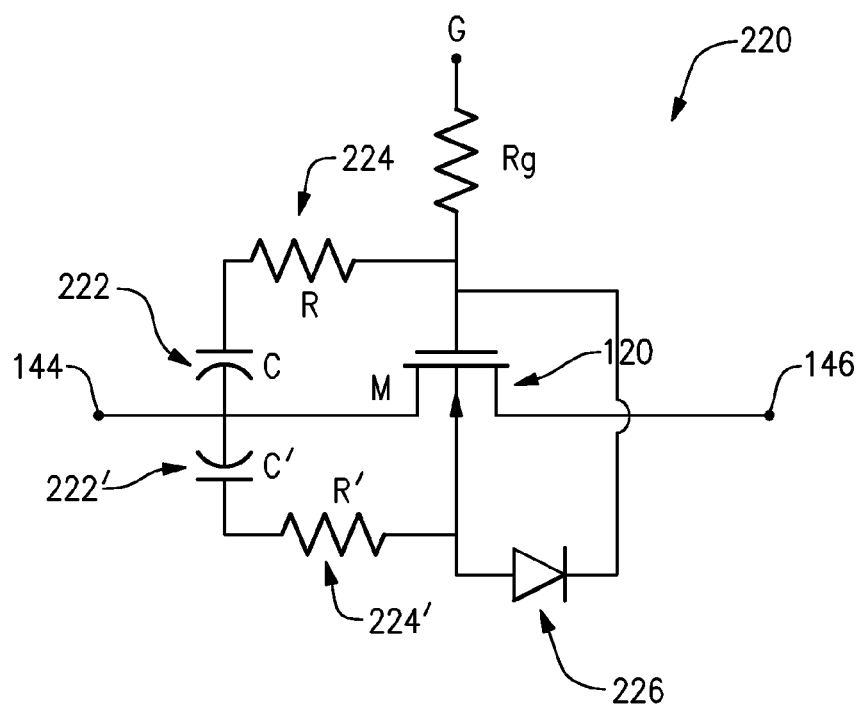
Figure 12A:
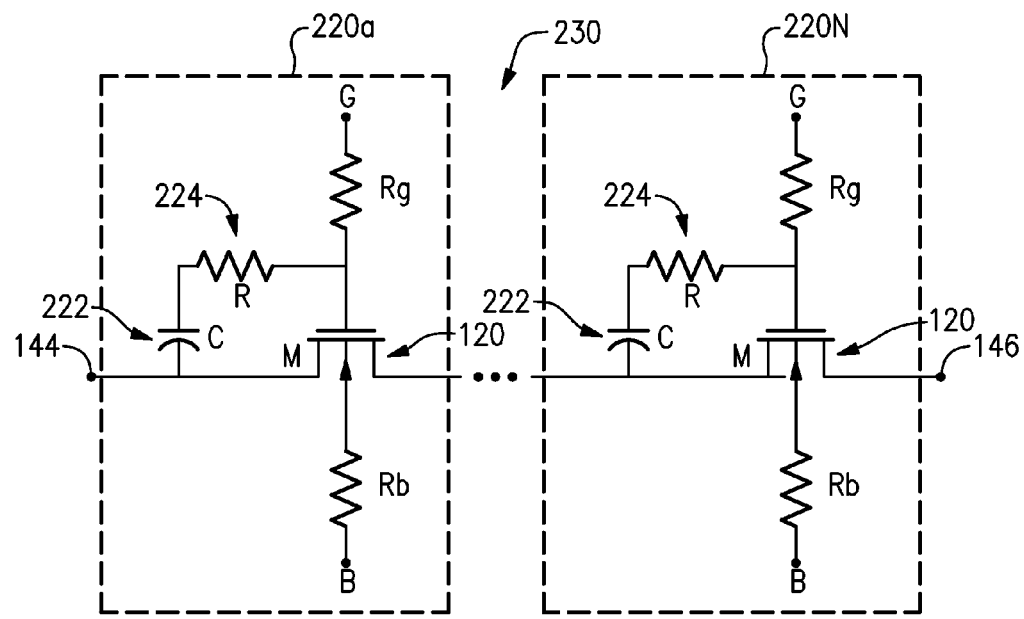
FIGS. 12A-12F show that one or more features of FIGS. 11A-11F can be implemented in switch arms having a plurality of FETs.
Figure 12B:
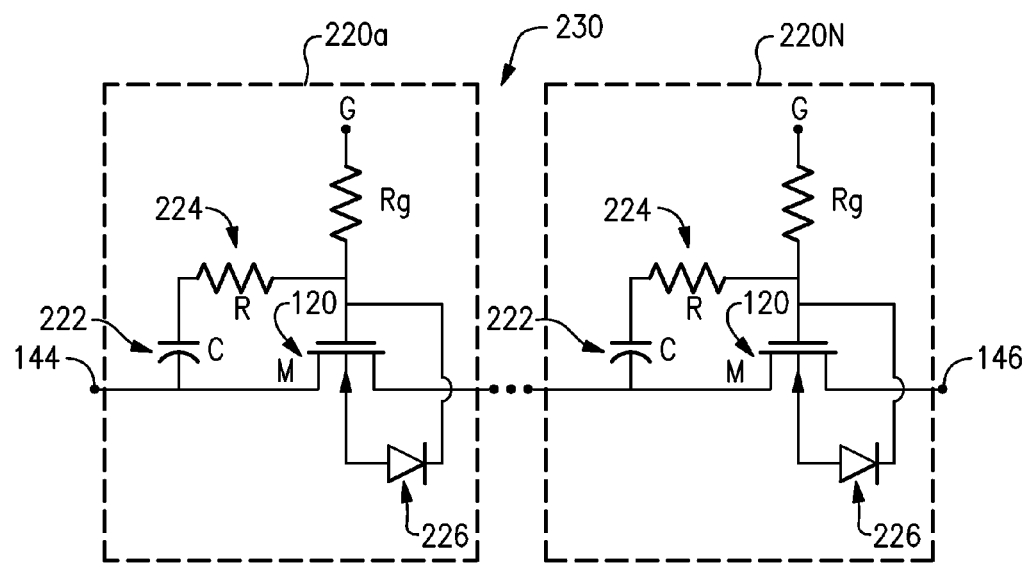
Figure 12C:
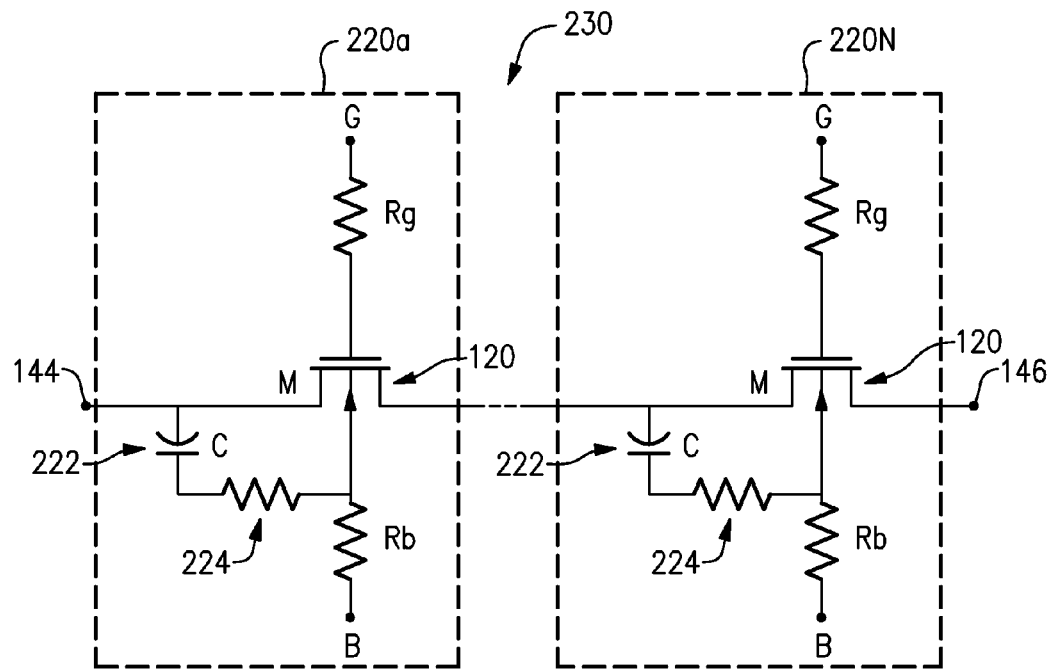
Figure 12D:
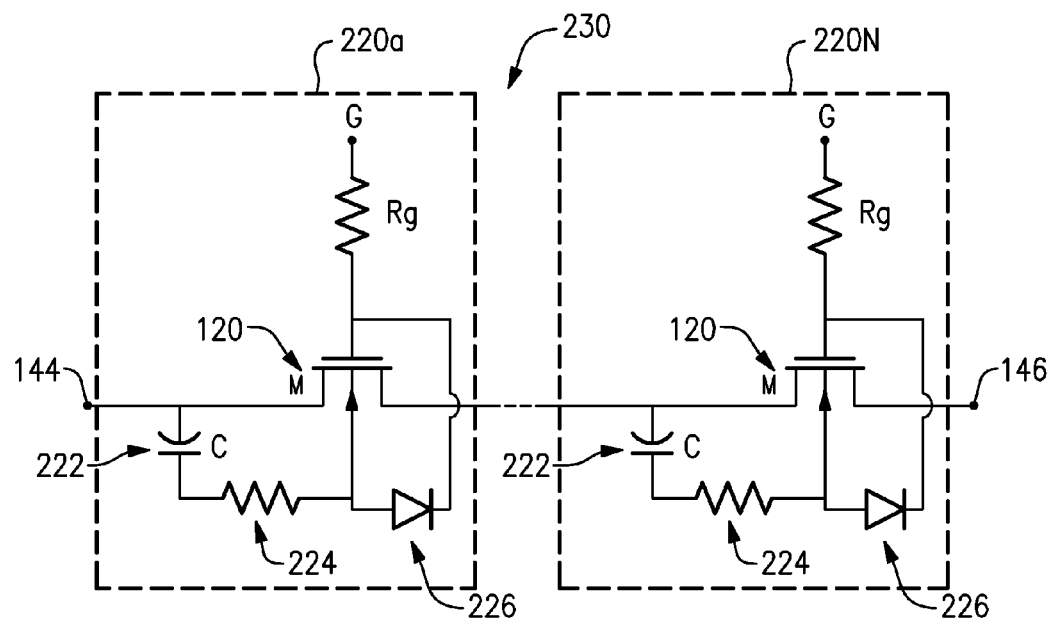
Figure 12E:
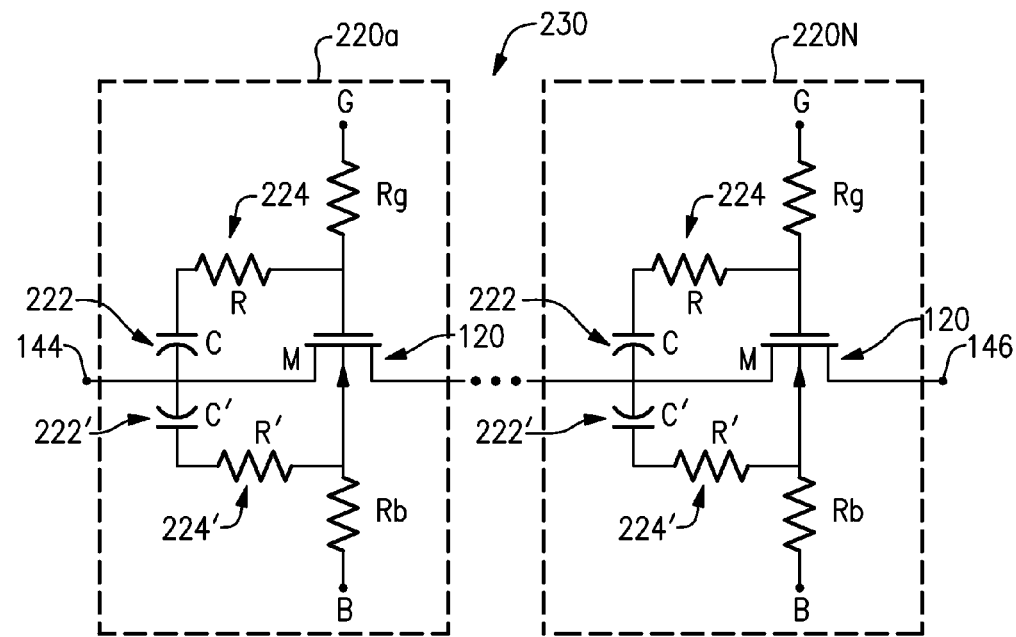
Figure 12F:
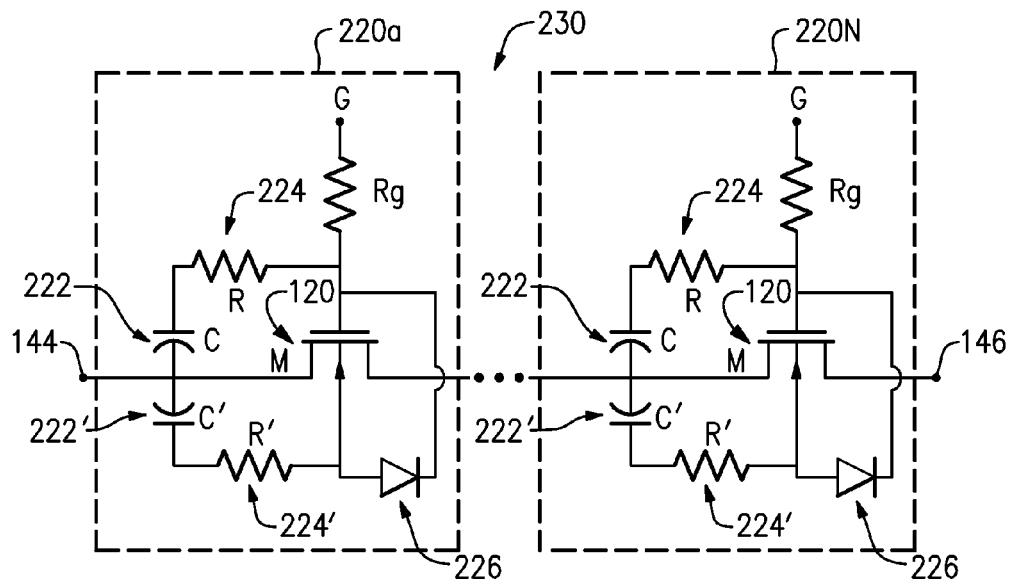

FIGS. 11A-11F show switch circuit examples 220 having an SOI FET 120 configured to provide switching functionality between first and second nodes 144, 146. A gate terminal of the FET 120 is shown to be biased through a gate resistor Rg. The gate resistor Rg can be configured to float the gate. FIGS. 11A, 11C and 11E show configurations with a resistive-body connection (with a body resistor Rb, which can be configured to float the body); and FIGS. 11B, 11D and 11F show configurations with a diode-body connection (with a diode 226).

In each of the examples shown in FIGS. 11A-11F, either or both of gate and body terminals can be coupled with a source terminal by one or more coupling circuits having a capacitor 222 in series with a resistor 224. For the purpose of description of FIGS. 11A-11F, the coupling circuit is referred to as an RC circuit.

Such a coupling can allow discharge of interface charge from the coupled gate and/or body. Such discharge of interface charge can lead to improvement in IMD performance, especially for low-frequency blocker. For configurations where the RC circuit is coupled to the gate, high impedance can be presented to the low-frequency signal by the RC circuit, which prevents it from leaking in to the gate, or reduces its leakage into the gate. Similarly, for configurations where the RC circuit is coupled to the body, high impedance can be presented to the low-frequency signal by the RC circuit, which prevents it from leaking in to the body, or reduces its leakage into the body.

FIG. 11A shows a switch circuit 220 where an RC circuit having a capacitor 222 (capacitance C) in series with a resistor 224 (resistance R) couples a source terminal with a gate terminal of an SOI FET 120. In this example, both of the gate and body are floated by their respective resistors Rg and Rb.

FIG. 11B shows a switch circuit 220 where an RC circuit having a capacitor 222 (capacitance C) in series with a resistor 224 (resistance R) couples a source terminal with a gate terminal of an SOI FET 120. In this example, the gate is floated by a resistor Rg, and a diode-body connection is provided.

FIG. 11C shows a switch circuit 220 where an RC circuit having a capacitor 222 (capacitance C) in series with a resistor 224 (resistance R) couples a source terminal with a body terminal of an SOI FET 120. In this example, both of the gate and body are floated by their respective resistors Rg and Rb.

FIG. 11D shows a switch circuit 220 where an RC circuit having a capacitor 222 (capacitance C) in series with a resistor 224 (resistance R) couples a source terminal with a body terminal of an SOI FET 120. In this example, the gate is floated by a resistor Rg, and a diode-body connection is provided.

FIG. 11E shows a switch circuit 220 where an RC circuit having a capacitor 222 (capacitance C) in series with a resistor 224 (resistance R) couples a source terminal with a body terminal of an SOI FET 120. Another RC circuit having a capacitor 222' (capacitance C') in series with a resistor 224' (resistance R') couples a source terminal with a gate terminal of the FET 120. In this example, both of the gate and body are floated by their respective resistors Rg and Rb.

FIG. 11F shows a switch circuit 220 where an RC circuit having a capacitor 222 (capacitance C) in series with a resistor 224 (resistance R) couples a source terminal with a body terminal of an SOI FET 120. Another RC circuit having a capacitor 222' (capacitance C') in series with a resistor 224' (resistance R') couples a source terminal with a gate terminal of the FET 120. In this example, the gate is floated by a resistor Rg, and a diode-body connection is provided.

FIGS. 12A-12F show switch arms 230 having the switch circuits 220 described in reference to FIGS. 11A-11F. In each of the examples, N such switch circuits are shown to be connected in series to provide switching functionality between terminals 144, 146.

In some embodiments, gate bias voltages (Vg) for the plurality of FETs 120 can be substantially the same, and be provided by a common gate bias circuit. Such a common gate bias voltage Vg is shown to be provided to the gates via a gate resistor Rg. Similarly, body bias voltages (Vb) for the plurality of FETs 120 can be substantially the same, and be provided by a common body bias circuit for the examples having resistive-body connection.

In some embodiments, some or all of the gates of the FETs 120 can be biased separately. In some situations, such as when substantially equal voltage division across the FETs is desired, it can be advantageous to implement such separate biasing of gates. Similarly, in some embodiments, some or all of the bodies of the FETs 120 can be biased separately. In some situations, such as when substantially equal voltage division across the FETs is desired, it can be advantageous to implement such separate biasing of bodies.

In some implementations, and as described herein, the foregoing example configurations described in reference to FIGS. 11 and 12 can yield improvements in IMD performance, especially for low-frequency blocker.

Summary of Example 2

In a number of implementations, Example 2 relates to a radio-frequency (RF) switch that includes at least one field-effect transistor (FET) disposed between first and second nodes, with each of the at least one FET having a respective source, drain, gate, and body. The RF switch further includes a coupling circuit having at least one of first and second paths, with the first path being between the respective source or the drain and the corresponding gate of each FET, and the second path being between the respective source or the drain and the corresponding body of each FET. The coupling circuit is configured to allow discharge of interface charge from either or both of the coupled gate and body.

In some embodiments, the FET can be a silicon-on-insulator (SOI) FET. In some embodiments, the coupling circuit can include the first path but not the second path, with the coupling circuit including an RC circuit having a capacitor in series with a resistor to thereby allow the discharge from the gate. In some embodiments, the coupling circuit can include the second path but not the first path, with the coupling circuit including an RC circuit having a capacitor in series with a resistor to thereby allow the discharge from the body. In some embodiments, the coupling circuit can include both of the first and second paths, with the coupling circuit including first and second RC circuits. The first RC circuit can have a first capacitor in series with a first resistor to thereby allow the discharge from the gate. The second RC circuit can have a second capacitor in series with a second resistor to thereby allow the discharge from the body.

In some embodiments, each of the first and second paths can be connected to the drain. In some embodiments, the RF switch can further include a gate resistor connected to the gate and configured to float the gate. In some embodiments, the RF switch can further include a body resistor connected to the body and configured to float the body. In some embodiments, the RF switch can further include a diode-body connection between the body and the gate.

In some embodiments, the first node can get configured to receive an RF signal having a power value and the second node can be configured to output the RF signal when the FET is in an ON state. The at least one FET can include N FETs connected in series, with the quantity N being selected to allow the switch circuit to handle the power of the RF signal.

According to some implementations, Example 2 relates to a method for operating a radio-frequency (RF) switch. The method includes controlling at least one field-effect transistor (FET) disposed between first and second nodes. The method further includes discharging interface charge from at least one of a gate and a body of each FET by providing at least one of first and second paths, with the first path being between a source or a drain and the gate of each FET, and the second path being between the source or the drain and the body of each FET.

In accordance with a number of implementations, Example 2 relates to a semiconductor die that includes a semiconductor substrate and at least one field-effect transistor (FET) formed on the semiconductor substrate. The die further includes a coupling circuit having at least one of first and second paths, with the first path being between a source or a drain and a gate of each FET, and the second path being between the source or the drain and a body of each FET. The coupling circuit is configured to allow discharge of interface charge from either or both of the coupled gate and body.

In some embodiments, the coupling circuit can include at least one RC circuit having a capacitor in series with a resistor. In some embodiments, the die can further include an insulator layer disposed between the FET and the semiconductor substrate. The die can be a silicon-on-insulator (SOI) die.

In some implementations, Example 2 relates to a method for fabricating a semiconductor die. The method includes providing a semiconductor substrate and forming at least one field-effect transistor (FET) on the semiconductor substrate, with each of the at least one FETs having a respective gate, body, source, and drain. The method further includes forming a coupling circuit on the semiconductor substrate. The method further includes forming at least one of first and second paths with the coupling circuit, with the first path being between the respective source or the drain and the respective gate of each FET, and the second path being between the respective source or the drain and the respective body of each FET. The coupling circuit is configured to allow discharge of interface charge from either or both of the coupled gate and body.

In some embodiments, the method can further include forming an insulator layer between the FET and the semiconductor substrate.

According to a number of implementations, Example 2 relates to a radio-frequency (RF) switch module that includes a packaging substrate configured to receive a plurality of components. The module further includes a semiconductor die mounted on the packaging substrate, with the die having at least one field-effect transistor (FET). The module further includes a coupling circuit having at least one of first and second paths, with the first path being between a source or a drain and a gate of each FET, and the second path being between the source or the drain and a body of each FET. The coupling circuit is configured to allow discharge of interface charge from either or both of the coupled gate and body.

In some embodiments, the semiconductor die can be a silicon-on-insulator (SOI) die. In some embodiments, the coupling circuit can include at least one RC circuit having a capacitor in series with a resistor. In some embodiments, the RC circuit can be part of the same semiconductor die as the at least one FET. In some embodiments, at least some of the RC circuit can be part of a second die mounted on the packaging substrate. In some embodiments, at least some of the RC circuit can be disposed at a location outside of the semiconductor die.

In a number of implementations, Example 2 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to route the amplified RF signal to the antenna. The switch includes at least one field-effect transistor (FET). The switch further includes a coupling circuit having at least one of first and second paths, with the first path being between a source or a drain and a gate of each FET, and the second path being between the source or the drain and a body of each FET. The coupling circuit is configured to allow discharge of interface charge from either or both of the coupled gate and body.

In some embodiments, the coupling circuit can include at least one RC circuit having a capacitor in series with a resistor. In some embodiments, the wireless device can be configured to operate in an LTE communication system.

Description of Example 3

Some wireless systems such as Long Term Evolution (LTE), Worldwide Interoperability for Microwave Access (WiMAx) and Code Division Multiple Access (CDMA) can demand very high linearity radio-frequency (RF) switches. In some embodiments, such RF switches can be implemented based on FETs such as SOI FETs.

A challenge associated with such high linearity FET switches can include providing desired low frequency IMD2 and IMD3 performance specifications. In some situations, an FET for such switches can behave like a MOS capacitor due to fixed charges in a body of the FET; and such a MOS capacitor can be highly nonlinear. Such an effect can be much more pronounced as lower frequencies. In the context of IMDs, low-frequency IMD can be much more difficult to manage due to, for example. process limitations.

Some solutions rely on a low pass filter at an antenna terminal. Other solutions utilize guard rings, trap rich or isolation deep trenches. These solutions can be relatively expensive, and typically require extra spacing and process steps.

In some implementations, one or more of the foregoing challenges can be addressed by connecting a frequency-tuned circuit to a body of an FET. In some embodiments, such a circuit can be switched on or off. Accordingly, such a configuration can provide a dynamic way of controlling the body with a frequency dependent component.

In some embodiments, a frequency-tuned circuit can behave like a short circuit at low frequencies and like an open circuit at an operating frequency. Such a configuration can remove the fixed surface charges in the body at low frequencies, by effectively shorting the low-frequency distortions to an RF ground and at the same time not impacting the switching circuit behavior at the operating frequency. For the purpose of description, operating frequencies can include, for example, frequencies in a range from approximately 700 to 6,000 MHz. Low frequencies corresponding to such operating frequencies can include, for example, frequencies below approximately 200 MHz (e.g., 90 to 180 MHz).

Figure 13:
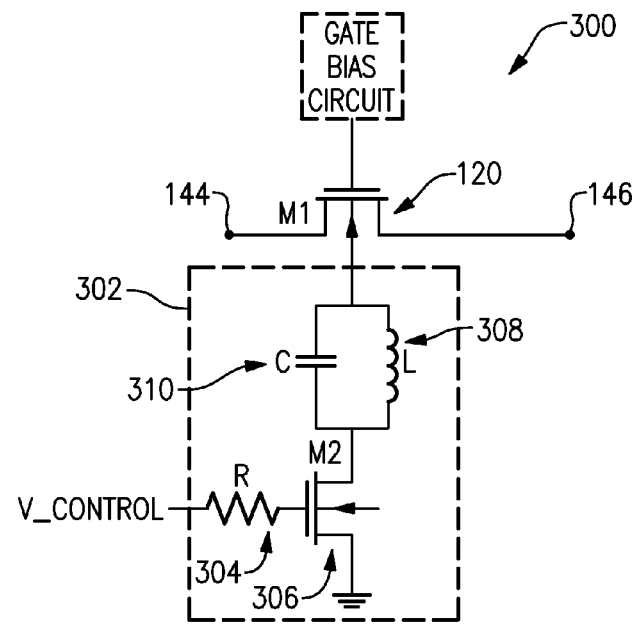
FIG. 13 shows a third example of an RF switch circuit having body biasing circuit that includes an LC circuit that can be configured to, for example, provide reduced or minimum insertion loss when the switch circuit is ON, and provide a DC short or a fixed DC voltage to the body when the switch circuit is OFF.

FIG. 13 shows a switch circuit example 300 having an SOI FET 120 configured to provide switching functionality between first and second nodes 144, 146. A gate terminal of the FET 120 is shown to be biased from a gate bias circuit.

As shown in FIG. 13, a body biasing circuit 302 can include an LC circuit having an inductor 308 (inductance L) and a capacitor 310 (capacitance C). Values of L and C can be selected to yield a desired resonance frequency of the LC circuit. The LC circuit is shown to be connectable to a ground by a switch 306 (e.g, another FET indicated as "M2"). Gate control of the FET M2 is shown to be provided by its gate bias voltage V_control through its gate resistor R.

When the SOI FET 120 (indicated as "M1") is ON, the switch 300 is ON between the nodes 144 and 146, and M2 is turned OFF. This configuration can provide reduced or minimum insertion loss by floating the body of M1. When M1 is OFF, the switch 300 is OFF between the nodes 144 and 146, and M2 is turned ON. This configuration can provide a DC short (as shown in the example of FIG. 13) or a fixed DC voltage to the body substrate. Thus, this configuration can prevent or reduce the likelihood of parasitic junction diodes being turned on, and thereby reduce distortions associated with large voltage swings. At higher frequencies the LC circuit can present high impedance and minimize the loading effect that can increase the insertion loss of the switch 300.

Figure 14:
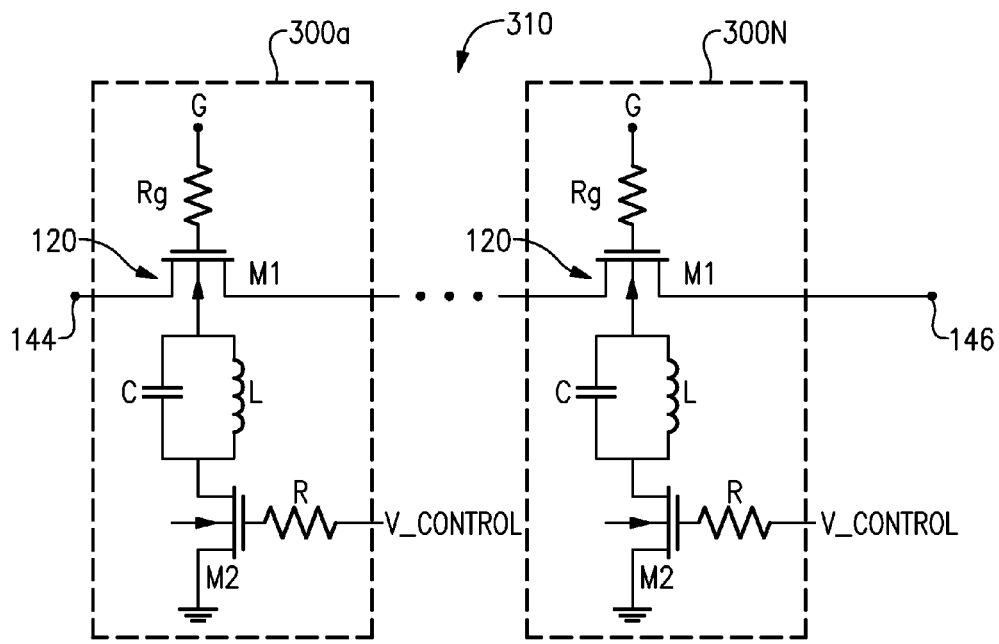
FIG. 14 shows that one or more features of FIG. 13 can be implemented in a switch arm having a plurality of FETs.

FIG. 14 shows a switch arm 310 having a plurality of the switch circuits 300 described in reference to FIG. 14. In the example configuration 310, N such switch circuits are shown to be connected in series to provide switching functionality between terminals 144, 146.

In some embodiments, gate bias voltages (Vg) for the plurality of FETs 120 can be substantially the same, and be provided by a common gate bias circuit. Such a common gate bias voltage Vg is shown to be provided to the gates via a gate resistor Rg. In some embodiments, some or all of the gates of the FETs 120 can be biased separately. In some situations, such as when substantially equal voltage division across the FETs or when additional isolation between the FETs is desired, it can be advantageous to implement such separate biasing of gates.

In the example configuration 310 of FIG. 14, each switching circuit 300 is depicted as including a frequency-tuned body bias circuit. In some embodiments, a common frequency tuned body bias circuit can provide a common bias connection for some or all of the FETs 120. In some embodiments, some or all of the bodies of the FETs 120 can be biased separately. In some situations, such as when substantially equal voltage division across the FETs is desired, it can be advantageous to implement such separate biasing of bodies.

In some implementations, and as described herein, the foregoing example configurations described in reference to FIGS. 13 and 14 can yield improvements at lower frequencies without significantly affecting the operating frequency performance. Another advantage that can be provided includes a feature where the body bias can be switched OFF to float the body when the switch is ON, thereby improving the insertion loss performance.

Summary of Example 3

According to some implementations, Example 3 relates to a radio-frequency (RF) switch that includes at least one field-effect transistor (FET) disposed between first and second nodes, with each of the at least one FET having a respective body. The RF switch further includes a resonance circuit that connects the respective body of each FET to a reference node. The resonance circuit is configured to behave as an approximately closed circuit at low frequencies below a selected value and an approximately open circuit at an operating frequency, with the approximately closed circuit allowing removal of surface charge from the respective body to the reference node.

In some embodiments, the FET can be a silicon-on-insulator (SOI) FET. In some embodiments, the resonance circuit can include an LC circuit having an inductor electrically parallel with a capacitor. The resonance circuit can further include a body switch configured to connect or disconnect the body to or from the reference node. the body switch can include a second FET. The second FET can be configured to be OFF when the first FET is ON to thereby float the body of the first FET. The second FET can be further configured to be ON when the first FET is OFF to facilitate the removal of surface charge from the body to the reference node.

In some embodiments, the reference node can include a ground node. In some embodiments, the RF switch can further include a gate bias circuit connected to and configured to provide a bias signal to a gate of the FET.

In some embodiments, the first node can be configured to receive an RF signal having a power value and the second node can be configured to output the RF signal when the FET is in an ON state. The at least one FET can include N FETs connected in series, with the quantity N being selected to allow the switch circuit to handle the power of the RF signal.

In a number of implementations, Example 3 relates to a method for operating a radio-frequency (RF) switch. The method includes controlling at least one field-effect transistor (FET) disposed between first and second nodes so that each of the at least one FET is in an ON state or an OFF state. The method further includes selectively removing surface charge from a respective body of each of the at least one FET at lower frequencies below a selected value. The selective removal is facilitated by a resonance circuit that behaves as an approximately closed circuit at the low frequencies.

In some embodiments, the resonance circuit can further behave as an approximately open circuit at an operating frequency. In some embodiments, the resonance circuit can include an LC circuit.

In some implementations, Example 3 relates to a semiconductor die that includes a semiconductor substrate and at least one field-effect transistor (FET) formed on the semiconductor substrate. The die further includes a resonance circuit that connects a respective body of each of the at least one FET to a reference node. The resonance circuit is configured to behave as an approximately closed circuit at low frequencies below a selected value and as an approximately open circuit at an operating frequency. The approximately closed circuit allows removal of surface charge from the respective body to the reference node.

In some embodiments, the die can further include an insulator layer disposed between the FET and the semiconductor substrate. The die can be a silicon-on-insulator (SOI) die.

In accordance with a number of implementations, Example 3 relates to a method for fabricating a semiconductor die. The method includes providing a semiconductor substrate and forming at least one field-effect transistor (FET) on the semiconductor substrate, with each of the at least one FET having a body. The method further includes forming a resonance circuit on the semiconductor substrate. The resonance circuit is configured to behave as an approximately closed circuit at low frequencies below a selected value and as an approximately open circuit at an operating frequency. The method further includes connecting the resonance circuit between the respective body of the at least one FET and a reference node to allow removal of surface charge from the respective body to the reference node when the resonance circuit is approximately closed.

In some embodiments, the method can further include forming an insulator layer between the FET and the semiconductor substrate.

According to some implementations, Example 3 relates to a radio-frequency (RF) switch module that includes a packaging substrate configured to receive a plurality of components. The module further includes a semiconductor die mounted on the packaging substrate, with the die having at least one field-effect transistor (FET). The module further includes a resonance circuit that connects a respective body of each of the at least one FET to a reference node. The resonance circuit is configured to behave as an approximately closed circuit at low frequencies below a selected value and as an approximately open circuit at an operating frequency. The approximately closed circuit allows removal of surface charge from the respective body to the reference node.

In some embodiments, the semiconductor die can be a silicon-on-insulator (SOI) die. In some embodiments, the resonance circuit can be part of the same semiconductor die as the at least one FET. In some embodiments, the resonance circuit can be part of a second die mounted on the packaging substrate. In some embodiments, the resonance circuit can be disposed at a location outside of the semiconductor die.

In some implementations, Example 3 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET). The switch further includes a resonance circuit that connects a respective body of each of the at least one FET to a reference node. The resonance circuit is configured to behave as an approximately closed circuit at low frequencies below a selected value and as an approximately open circuit at an operating frequency. The approximately closed circuit allows removal of surface charge from the respective body to the reference node.

Description of Example 4

In many radio-frequency (RF) transmit applications, switch designs typically require high-power operation capability, especially under mismatch. For example, switches used for antenna tuning are expected to withstand mismatch as high as 20:1 under +35 dBm input power. Also, some switches utilized in wireless systems such as GSM are expected to withstand 5:1 mismatch under +35 dBm input power. Higher field-effect transistor (FET) stack height is generally used to withstand high power and improve the compression point.

Another important metric for linearity is intermodulation distortion (IMD). IMD measures an unwanted signal added to a desired signal due to mixing products from other RF signals. Such an effect can be particularly dominant in a multi-mode, multi-band environment. IMD can result from two or more signals mixing together to yield frequencies that are not harmonic frequencies.

System designers typically strive to reduce interference susceptibility through, for example, improved linearity. A given system's linearity can govern how much IMD will occur within it, which in turn can create interferences. Through improved linearity of the system building blocks, such as an RF switch, the overall susceptibility of a system to interference can be decreased.

Figure 15:
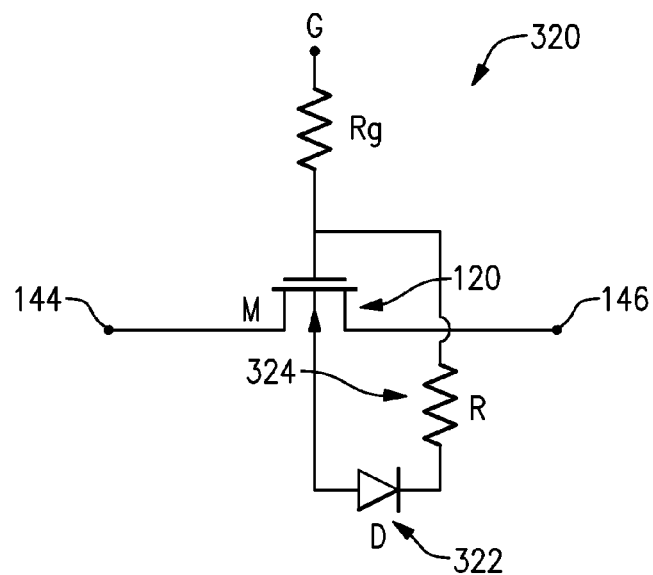
FIG. 15 shows a fourth example of an RF switch circuit having a coupling circuit that couples a body and a gate of an FET through a diode in series with a resistor to, for example, facilitate improved distribution of excess charge from the body.

FIG. 15 shows a switch circuit example 320 having an SOI FET 120 configured to provide switching functionality between first and second nodes 144, 146. A gate terminal of the FET 120 can be biased through a gate resistor Rg.

In some embodiments, the switch circuit 320 can be implemented so that a body terminal of the FET 120 is utilized for power handling and IMD improvement. By way of an example, a circuit having a diode 322 in series with a resistor 324 (resistance R) can couple the body and gate of the FET 120. In the example, the anode of the diode 322 can be connected to the body of the FET 120, and the cathode can be connected to one of the resistor terminals. The other terminal of the resistor 324 is connected to the gate of the FET 120. Such a configuration can facilitate better distribution of excess charge from the body, which in turn can yield, for example, improvement in compression roll-off characteristics (e.g., higher P1 dB) and IMD performance.

The size of the diode 322 and the value of the resistor 324 can be selected to optimize or yield desirable performance associated with P1 dB and IMD.

Figure 16:
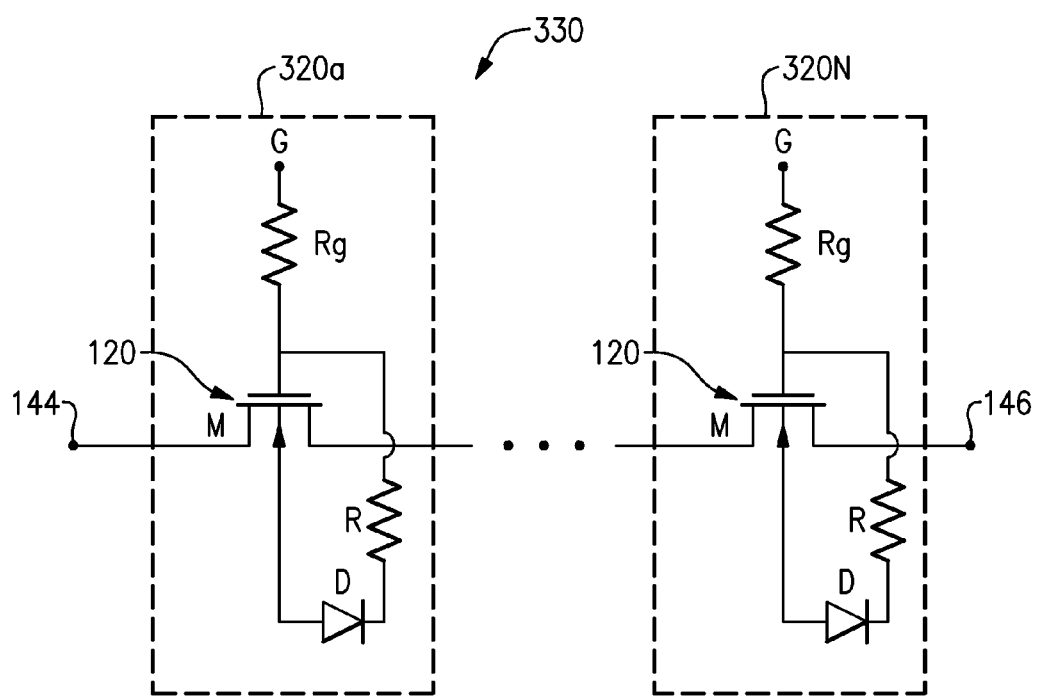
FIG. 16 shows that one or more features of FIG. 15 can be implemented in a switch arm having a plurality of FETs.

FIG. 16 shows a switch arm 330 having a plurality of the switch circuits 320 described in reference to FIG. 15. In the example configuration 330, N such switch circuits are shown to be connected in series to provide switching functionality between terminals 144, 146. The number N can be selected based on power handling requirement. For example, N can be increased to handle higher power.

In some embodiments, gate bias voltages (Vg) for the plurality of FETs 120 can be substantially the same, and be provided by a common gate bias circuit. Such a common gate bias voltage Vg is shown to be provided to the gates via a gate resistor Rg. In some embodiments, some or all of the gates of the FETs 120 can be biased separately. In some situations, such as when substantially equal voltage division across the FETs is desired, it can be advantageous to implement such separate biasing of gates.

In the example configuration 330 of FIG. 16, a circuit having diode and resistor as described in reference to FIG. 15 can be provided for each of the N individual switch circuits 320, can provide a common coupling between the N bodies and gates of the FETs, or any combination thereof.

In some embodiments, the diode(s) and resistor(s) described in reference to FIGS. 15 and 16 can be implemented on the same die as the switch circuit(s) 320, off of the die, or any combination thereof.

In some implementations, and as described herein, the foregoing example configurations described in reference to FIGS. 15 and 16 can be relatively simpler and easier to implement, and can yield a number of improvements. For example, this technique can improve compression roll-off characteristics of an RF switch (e.g., smooth roll-off). In another example, this technique can improve IMD performance of the RF switch. In yet another example, this technique can allow RF switch designs to eliminate resistive body contact topology which can require additional area overhead associated with, for example, body resistor, control lines and level shifters.

Summary of Example 4

According to a number of implementations, Example 4 relates to a radio-frequency (RF) switch that includes at least one field-effect transistor (FET) disposed between first and second nodes, with each of the at least one FET having a respective body and gate. The RF switch further includes a coupling circuit that couples the respective body and gate of each FET. The coupling circuit includes a diode in series with a resistor and configured to facilitate removal of excess charge from the respective body.

In some embodiments, the FET can be a silicon-on-insulator (SOI) FET. In some embodiments, an anode of the diode can be connected to the body, and a cathode of the diode can be connected to one end of the resistor with the other end of the resistor being connected to the gate. The diode and the resistor can be configured to yield improved P1 dB and IMD performance of the switch.

In some embodiments, the RF switch can further include a gate resistor connected to the gate to facilitate floating of the gate. In some embodiments, the first node can be configured to receive an RF signal having a power value and the second node can be configured to output the RF signal when the FET is in an ON state. The at least one FET can include N FETs connected in series, with the quantity N being selected to allow the switch circuit to handle the power of the RF signal.

In a number of implementations, Example 4 relates to a method for operating a radio-frequency (RF) switch. The method includes controlling at least one field-effect transistor (FET) disposed between first and second nodes so that each FET is in an ON state or an OFF state. The method further includes removing excess charge from a body of each FET through a coupling circuit couples the body to a gate of the FET. The coupling circuit includes a diode in series with a resistor.

According to some implementations, Example 4 relates to a semiconductor die that includes a semiconductor substrate and at least one field-effect transistor (FET) formed on the semiconductor substrate. The die further includes a coupling circuit that couples a body and a gate of each FET. The coupling circuit includes a diode in series with a resistor and configured to facilitate removal of excess charge from the body of each FET.

In some embodiments, the die can further include an insulator layer disposed between the FET and the semiconductor substrate. The die can be a silicon-on-insulator (SOI) die.

In a number of implementations, Example 4 relates to a method for fabricating a semiconductor die. The method includes providing a semiconductor substrate and forming at least one field-effect transistor (FET) on the semiconductor substrate, with each of the FET having a respective gate and body. The method further includes forming a coupling circuit on the semiconductor substrate. The coupling circuit includes a diode in series with a resistor. The method further includes connecting the coupling circuit between the body and the gate of each FET to facilitate removal of excess charge from the body.

In some embodiments, the method can further include forming an insulator layer between the FET and the semiconductor substrate.

In accordance with a number of implementations, Example 4 relates to a radio-frequency (RF) switch module that includes a packaging substrate configured to receive a plurality of components. The module further includes a semiconductor die mounted on the packaging substrate, with the die having at least one field-effect transistor (FET). The module further includes a coupling circuit that couples a body and a gate of each FET. The coupling circuit includes a diode in series with a resistor and configured to facilitate removal of excess charge from the body of each FET.

In some embodiments, the semiconductor die can be a silicon-on-insulator (SOI) die. In some embodiments, the coupling circuit can be part of the same semiconductor die as the at least one FET. In some embodiments, the coupling circuit can be part of a second die mounted on the packaging substrate. In some embodiments, the coupling circuit can be disposed at a location outside of the semiconductor die.

In some implementations, Example 4 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET). The switch further includes a coupling circuit that couples a body and a gate of each FET. The coupling circuit includes a diode in series with a resistor and configured to facilitate removal of excess charge from the body of each FET.

Description of Example 5

Intermodulation distortion (IMD) measures an unwanted signal added to a desired signal due to mixing products from other RF signals. Such an effect can be particularly dominant in a multi-mode, multi-band environment. IMD can the result from two or more signals mixing together to yield frequencies that are not harmonic frequencies.

System designers typically strive to reduce interference susceptibility through, for example, improved linearity. A given system's linearity can govern how much IMD will occur within it, which in turn can create interferences. Through improved linearity of the system building blocks, such as an RF switch, the overall susceptibility of a system to interference can be decreased.

Performance features such as a lower IMD in RF switches can be an important factor in wireless-device designs. For example Long Term Evolution (LTE) systems can benefit significantly from RF switches having reduced IMDs. As a more specific example, system designs for simultaneous voice and data on LTE (SVLTE) can benefit significantly from RF switches having ultra-low levels of IMDs.

Figure 17A:
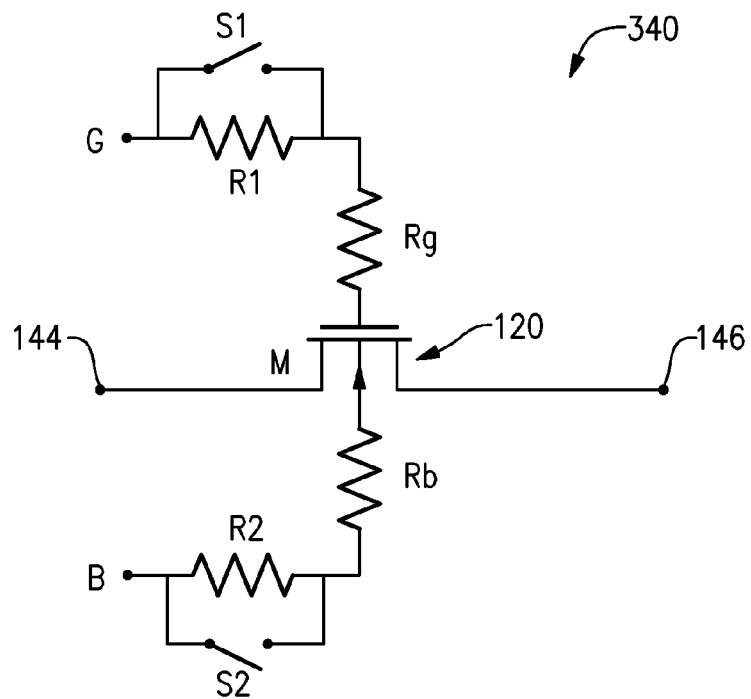
FIGS. 17A and 17B show variations of a fifth example of an RF switch circuit where extra resistance can be provided in a switchable manner for either or both of a gate and a body of an FET to, for example, provide improved intermodulation distortion (IMD) performance.

FIG. 17A shows a switch circuit example 340 having an SOI FET 120 configured to provide switching functionality between first and second nodes 144, 146. A gate of the FET 120 can be provided with a gate bias signal through a gate resistor (resistance Rg). A body of the FET 120 can be provided with a body bias signal through a body resistor (resistance Rb).

In some implementations, extra gate and/or body resistance(s) can be provided for the FET 120. In the example configuration 340, an extra gate resistor (resistance R1) is shown to be connected in series with the gate resistor Rg. In some embodiments, such an extra gate resistance can be introduced in a selected manner by, for example, a switch S1 (e.g., another FET). For example, opening of the switch S1 results in the extra resistor R1 being in series with Rg; and closing of S1 results in the extra resistor R1 being bypassed when the extra resistance is not required or desired (e.g., for improved switching time).

In the example configuration 340, an extra body resistor (resistance R2) is shown to be connected in series with the body resistor Rb. In some embodiments, such an extra body resistance can be introduced in a selected manner by, for example, a switch S2 (e.g., another FET). For example, opening of the switch S2 results in the extra resistor R2 being in series with Rb; and closing of S2 results in the extra resistor R2 being bypassed when the extra resistance is not required or desired (e.g., for improved switching time).

In some implementations, the extra resistances for the gate and the body can be turned ON or OFF together, or independently from each other. In some embodiments, only one of the extra resistances can be provided to the gate or the body. For example, FIG. 17B shows an example configuration 340 where an extra gate resistance is provided as described in reference to FIG. 17A, but the body is configured with a diode (D) body contact.

Figure 17B:
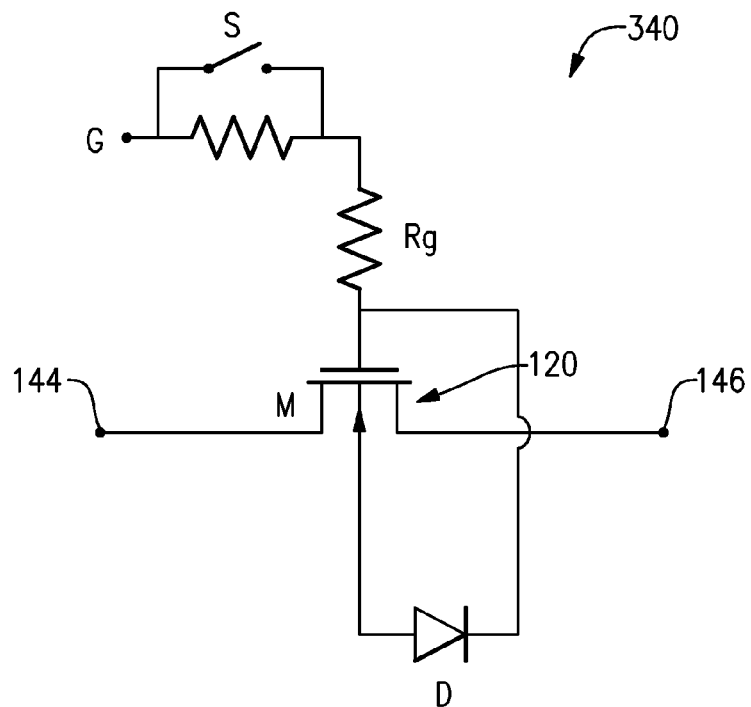
Figure 18A:
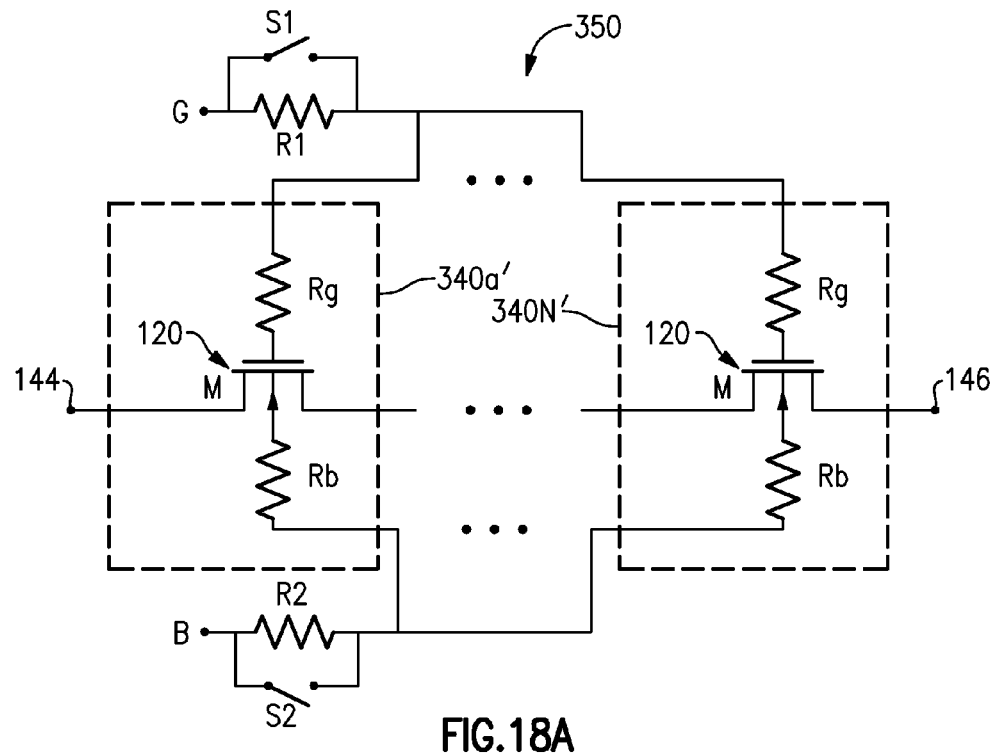
FIGS. 18A and 18B show that one or more features of FIGS. 17A and 17B can be implemented in switch arms having a plurality of FETs.
Figure 18B:
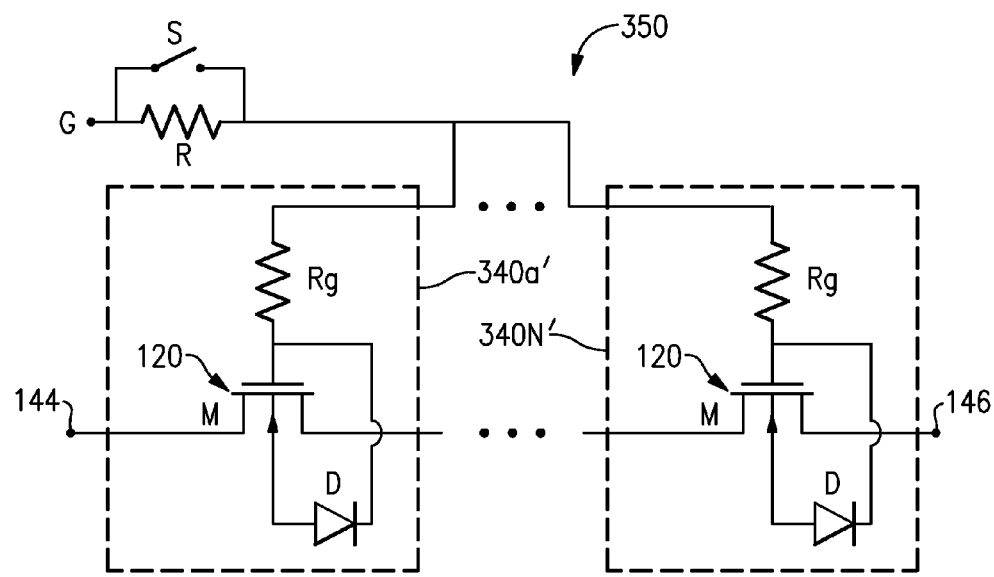

FIGS. 18A and 18B show switch arms 350 having the switch circuits described in reference to FIGS. 17A and 17B. In the example configuration 350 of FIG. 18A, N switch circuits having gate resistance Rg and body resistance Rb are connected in series to provide switching functionality between terminals 144, 146. A common extra resistance R1 is shown to be provided to the gates of the FETs 120; and such an extra resistance R1 can be switched ON and OFF by a common switch S1. A common extra resistance R2 is shown to be provided to the bodies of the FETs 120; and such an extra resistance R2 can be switched ON and OFF by a common switch S2. In some embodiments, such a switchable extra resistance can be provided separately to individual or some of the gates and/or bodies of the FETs in the switch arm 350.

In the example configuration 350 of FIG. 18B, N switch circuits having gate resistance Rg and diode body contact are connected in series to provide switching functionality between terminals 144, 146. A common extra resistance R1 is shown to be provided to the gates of the FETs 120; and such an extra resistance R1 can be switched ON and OFF by a common switch S1. In some embodiments, such a switchable extra resistance can be provided separately to individual or some of the gates and/or bodies of the FETs in the switch arm 350.

The number (N) of switch circuits in the switch arm 350 can be selected based on power handling requirement. For example, N can be increased to handle higher power.

In some embodiments, the extra resistor(s) (R1 and/or R2) and their respective switch(es) described in reference to FIGS. 17 and 18 can be implemented on the same die as the switch circuit(s) 340, off of the die, or any combination thereof.

In some embodiments, values of the extra resistance(s) (R1 and/or R2) can be selected to optimize or improve IMD performance with minimal or reduced impact on switching time of the switch circuits 340. Such a configuration can yield improved IMD performance, including improvement for low-frequency blockers. For example, the extra resistances (R1 and R2) can be selected to yield high impedances to low-frequency signals at the gate and body, thereby preventing or reducing such low-frequency signals from leaking into the gate and body.

In some implementations, and as described herein, the foregoing example configurations described in reference to FIGS. 17 and 18 can be relatively simpler and easier to implement, and can yield a number of improvements. For example, this technique can improve IMD performance of the RF switch, including IMD performance at low frequencies.

Summary of Example 5

According to a number of implementations, Example 5 relates to a radio-frequency (RF) switch that includes at least one field-effect transistor (FET) disposed between first and second nodes, with each of the at least one FET having a respective gate and body. The RF switch further includes an adjustable-resistance circuit connected to at least one of the respective gate and body of each FET.

In some embodiments, the FET can be a silicon-on-insulator (SOI) FET. In some embodiments, the adjustable-resistance circuit can include a first resistor in series with a parallel combination of a second resistor and a bypass switch. The bypass switch being closed can result in the second resistor being bypassed to yield a first resistance for the adjustable-resistance, and the bypass switch being open can result in a second resistance that is greater than the first resistance by approximately the value of the second resistor. The first resistor can include a bias resistor. The second resistance can be selected to improve intermodulation distortion (IMD) performance, and the first resistance can be selected to yield a reduced impact on switching time of the FET.

In some embodiments, the adjustable-resistance circuit can be connected to the gate. In some embodiments, the RF switch can further include a second adjustable-resistance circuit connected to the body. In some embodiments, the RF switch can further include a diode body contact connected to the body.

In some embodiments, the adjustable-resistance circuit can be connected to the body but not the gate. In some embodiments, the first node can be configured to receive an RF signal having a power value and the second node is configured to output the RF signal when the FET is in an ON state. The at least one FET can include N FETs connected in series, with the quantity N being selected to allow the switch circuit to handle the power of the RF signal.

In some implementations, Example 5 relates to a method for operating a radio-frequency (RF) switch. The method includes controlling at least one field-effect transistor (FET) disposed between first and second nodes so that each FET is in an ON state or an OFF state. The method further includes adjusting a resistance of a circuit connected to at least one of gate and body of each FET.

In some embodiments, the adjusting can include bypassing one of first and second resistors that are connected in series.

In accordance with a number of implementations, Example 5 relates to a semiconductor die that includes a semiconductor substrate and at least one field-effect transistor (FET) formed on the semiconductor substrate. The die further includes an adjustable-resistance circuit connected to at least one of gate and body of each FET.

In some embodiments, the die can further include an insulator layer disposed between the FET and the semiconductor substrate. The die can be a silicon-on-insulator (SOI) die.

In a number of implementations, Example 5 relates to a method for fabricating a semiconductor die. The method includes providing a semiconductor substrate and forming at least one field-effect transistor (FET) on the semiconductor substrate, with each of the at least one FET having a respective gate and body. The method further includes forming an adjustable-resistance circuit on the semiconductor substrate. The method further includes connecting the adjustable-resistance circuit to at least one of the gate and the body of each FET.

In some embodiments, the method can further include forming an insulator layer between the FET and the semiconductor substrate.

According to some implementations, Example 5 relates to a radio-frequency (RF) switch module that includes a packaging substrate configured to receive a plurality of components. The module further includes a semiconductor die mounted on the packaging substrate, with the die having at least one field-effect transistor (FET). The module further includes an adjustable-resistance circuit connected to at least one of gate and body of each FET.

In some embodiments, the semiconductor die can be a silicon-on-insulator (SOI) die. In some embodiments, the adjustable-resistance circuit can be part of the same semiconductor die as the at least one FET. In some embodiments, the adjustable-resistance circuit can be part of a second die mounted on the packaging substrate. In some embodiments, the adjustable-resistance circuit can be disposed at a location outside of the semiconductor die.

In some implementations, Example 5 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET). The switch further includes an adjustable-resistance circuit connected to at least one of gate and body of each FET.

Description of Example 6

Intermodulation distortion (IMD) measures an unwanted signal added to a desired signal due to mixing products from other RF signals. Such an effect can be particularly dominant in a multi-mode, multi-band environment. IMD can be the result from two or more signals mixing together to yield frequencies that are not harmonic frequencies.

System designers typically strive to reduce interference susceptibility through, for example, improved linearity. A given system's linearity can govern how much IMD will occur within it, which in turn can create interferences. Through improved linearity of the system building blocks, such as an RF switch, the overall susceptibility of a system to interference can be decreased.

Performance features such as a lower IMD in RF switches can be an important factor in wireless-device designs. For example Long Term Evolution (LTE) systems can benefit significantly from RF switches having reduced IMDs. As a more specific example, system designs for simultaneous voice and data on LTE (SVLTE) can benefit significantly from RF switches having ultra-low levels of IMDs.

Figure 19:
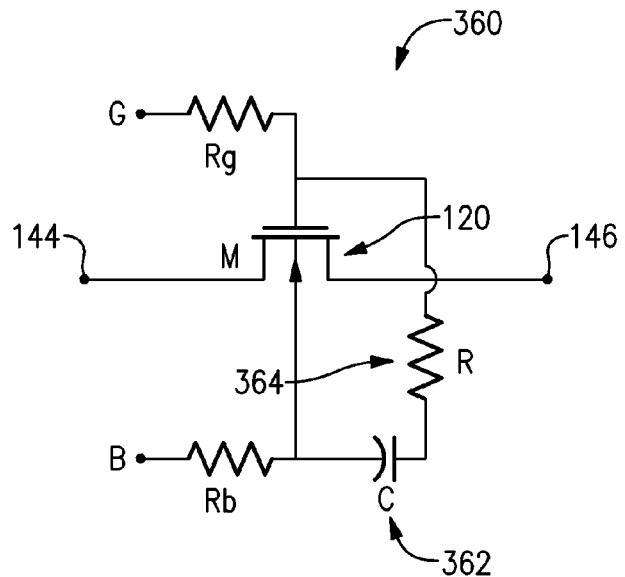
FIG. 19 shows a sixth example of an RF switch circuit having a coupling circuit that couples a body and a gate of an FET through a capacitor in series with a resistor to, for example, provide improved intermodulation distortion (IMD) performance.

FIG. 19 shows a switch circuit example 360 having an SOI FET 120 configured to provide switching functionality between first and second nodes 144, 146. A gate terminal of the FET 120 can be biased through a gate resistor Rg to, for example, float the gate. A body terminal of the FET 120 can be biased through a body resistor Rb to, for example, float the body.

In some embodiments, the switch circuit 360 can be implemented to utilize a body terminal of the FET 120 to yield an improvement in IMD performance. In the switch circuit 360, an RC circuit that includes a capacitor 362 (capacitance C) in series with a resistor 364 (resistance R) can couple the body and gate of the FET 120. Such a coupling can allow discharge of interface charge from the body. In some embodiments, values for capacitance C and resistance R can be selected to optimize or improve IMD performance of the switch circuit 360.

Figure 20:
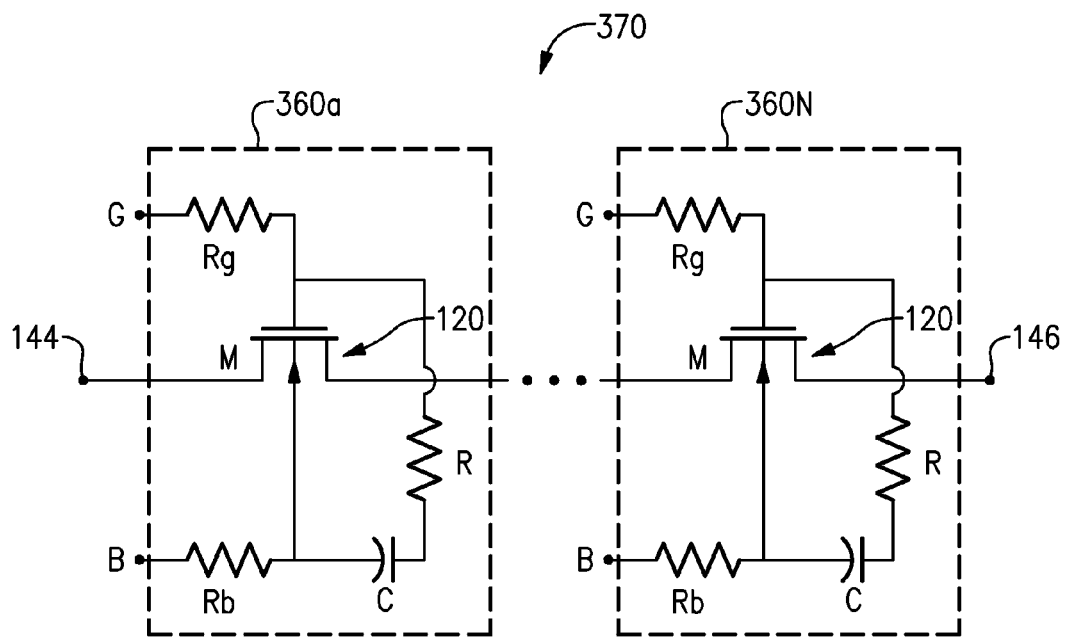
FIG. 20 shows that one or more features of FIG. 19 can be implemented in a switch arm having a plurality of FETs.

FIG. 20 shows a switch arm 370 having a plurality of the switch circuits 360 described in reference to FIG. 19. In the example configuration 370, N such switch circuits are shown to be connected in series to provide switching functionality between terminals 144, 146. The number N can be selected based on power handling requirement. For example, N can be increased to handle higher power.

In some embodiments, gate bias voltages (Vg) for the plurality of FETs 120 can be substantially the same, and be provided by a common gate bias circuit. Such a common gate bias voltage Vg is shown to be provided to the gates via a gate resistor Rg. In some embodiments, some or all of the gates of the FETs 120 can be biased separately. In some situations, such as when substantially equal voltage division across the FETs is desired, it can be advantageous to implement such separate biasing of gates.

In the example configuration 370 of FIG. 20, a circuit having capacitor (capacitance C) and resistor (resistance R) as described in reference to FIG. 19 can be provided for each of the N individual switch circuits 360, can provide a common coupling between the N bodies and gates of the FETs, or any combination thereof.

In some embodiments, the capacitor(s) and resistor(s) described in reference to FIGS. 19 and 20 can be implemented on the same die as the switch circuit(s) 360, off of the die, or any combination thereof.

In some implementations, and as described herein, the foregoing example configurations described in reference to FIGS. 19 and 20 can be relatively simpler and easier to implement, and can yield a number of improvements. For example, this technique can improve IMD performance of the RF switch. In another example, this technique can provide improved roll-off characteristics for P1 dB.

Summary of Example 6

In accordance with a number of implementations, Example 6 relates to a radio-frequency (RF) switch that includes at least one field-effect transistor (FET) disposed between first and second nodes, with each of the at least one FET having a respective body gate. The RF switch further includes a coupling circuit disposed between the respective body and gate of each FET. The coupling circuit is configured to allow discharge of interface charge from the respective body.

In some embodiments, the FET can be a silicon-on-insulator (SOI) FET. In some embodiments, the coupling circuit can include a capacitor in series with a resistor. The capacitor and the resistor can be selected to yield an improved intermodulation distortion (IMD) performance of the switch.

In some embodiments, the RF switch can further include a gate bias resistor connected to the gate. In some embodiments, the RF switch can further include a body bias resistor connected to the body.

In some embodiments, the first node can be configured to receive an RF signal having a power value and the second node can be configured to output the RF signal when the FET is in an ON state. The at least one FET can include N FETs connected in series, with the quantity N being selected to allow the switch circuit to handle the power of the RF signal.

According to some implementations, Example 6 relates to a method for operating a radio-frequency (RF) switch. The method includes controlling at least one field-effect transistor (FET) disposed between first and second nodes so that the FET is in an ON state or an OFF state. The method further includes discharging interface charge from a respective body of each FET through a coupling circuit disposed between the respective body and a corresponding gate of the FET.

In a number of implementations, Example 6 relates to a semiconductor die that includes a semiconductor substrate and at least one field-effect transistor (FET) formed on the semiconductor substrate. The die further includes a coupling circuit disposed between a body and a gate of each FET. The coupling circuit is configured to allow discharge of interface charge from the body.

In some embodiments, the die can further include an insulator layer disposed between the FET and the semiconductor substrate. The die can be a silicon-on-insulator (SOI) die.

In some implementations, Example 6 relates to a method for fabricating a semiconductor die. The method includes providing a semiconductor substrate and forming at least one field-effect transistor (FET) on the semiconductor substrate, with each of the at least one FET having a gate and body. The method further includes forming a coupling circuit on the semiconductor substrate that is connected to the respective body and gate of each FET to allow discharge of interface charge from the respective body.

In some embodiments, the method can further include forming an insulator layer between the FET and the semiconductor substrate. In some embodiments, the coupling circuit can include a capacitor in series with a resistor.

According to some implementations, Example 6 relates to a radio-frequency (RF) switch module that includes a packaging substrate configured to receive a plurality of components. The module further includes a semiconductor die mounted on the packaging substrate, with the die having at least one field-effect transistor (FET). The module further includes a coupling circuit disposed between a body and a gate of each FET. The coupling circuit is configured to allow discharge of interface charge from the body.

In some embodiments, the semiconductor die can be a silicon-on-insulator (SOI) die. In some embodiments, the coupling circuit can include a capacitor in series with a resistor.

In some embodiments, the coupling circuit can be part of the same semiconductor die as the at least one FET. In some embodiments, the coupling circuit can be part of a second die mounted on the packaging substrate. In some embodiments, the coupling circuit can be disposed at a location outside of the semiconductor die.

In accordance with a number of implementations, Example 6 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET). The switch further includes a coupling circuit disposed between a body and a gate of each FET. The coupling circuit is configured to allow discharge of interface charge from the body.

Description of Example 7

In many radio-frequency (RF) applications, it is desirable to utilize switches having low insertion loss and high isolation values. High linearity of such switches is also desirable. As described herein, such advantageous performance features can be achieved without significantly degrading reliability of RF switches.

Figure 21:
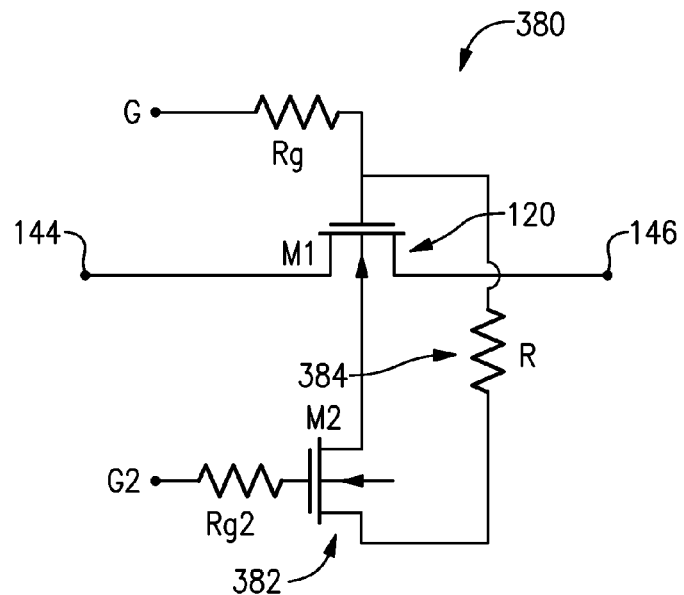

FIG. 21 shows a switch circuit example 380 having an SOI FET 120 configured to provide switching functionality between first and second nodes 144, 146. A gate of the FET 120 can be biased through a gate resistor Rg to, for example, float the gate. A body of the FET 120 is shown to be resistively coupled to the gate by a resistor 384 (resistance R), and such a coupling can be turned ON or OFF by a second FET 382 (indicated as M2). Operation of M2 can be controlled by a gate bias voltage provided to M2 through a gate resistor Rg2.

When the FET 120 (indicated as M1) is ON, the switch circuit 380 is ON, and M2 can be turned OFF. Such a configuration can provide minimum or reduced insertion loss of the switch circuit 380 by floating the body of M1. When M1 is OFF, the switch circuit 380 is OFF, and M2 can be turned ON. Such a configuration can provide DC voltages to both body gate of M1 from the same node (e.g. the gate node "G"). Such a configuration can prevent or reduce parasitic junction diodes being turned on, and can reduce distortions associated with large voltage swings. In some embodiments, such a configuration can also eliminate extra bias/control supply to the body of M1.

Figure 22:
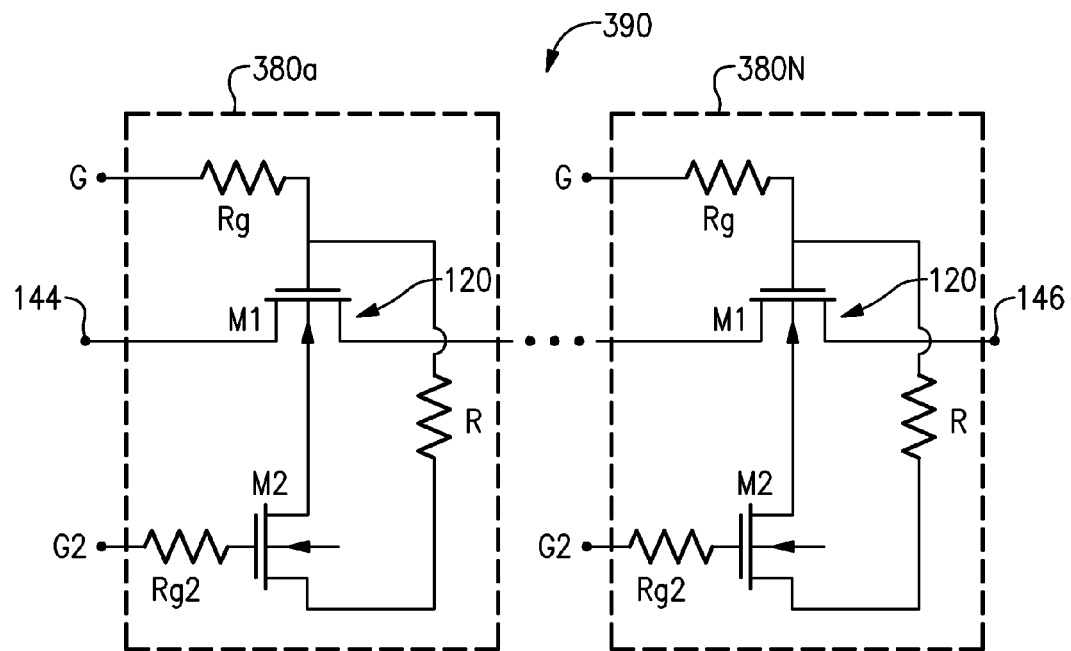
FIG. 22 shows that one or more features of FIG. 21 can be implemented in a switch arm having a plurality of FETs.

FIG. 22 shows a switch arm 390 having a plurality of the switch circuits 380 described in reference to FIG. 21. In the example configuration 390, N such switch circuits are shown to be connected in series to provide switching functionality between terminals 144, 146. The number N can be selected based on power handling requirement. For example, N can be increased to handle higher power.

In some embodiments, gate bias voltages (Vg) for the plurality of FETs 120 can be substantially the same, and be provided by a common gate bias circuit. Such a common gate bias voltage Vg is shown to be provided to the gates via a gate resistor Rg. In some embodiments, some or all of the gates of the FETs 120 can be biased separately. In some situations, such as when substantially equal voltage division across the FETs is desired, it can be advantageous to implement such separate biasing of gates.

In the example configuration 390 of FIG. 22, a switchable (by M2) resistive coupling circuit between the body and gate of each FET 120 as described in reference to FIG. 21 can be provided for each of the N individual switch circuits 380, can provide a common coupling between the N bodies and gates of the FETs, or any combination thereof. In some embodiments, some or all of the bodies of the FETs 120 can be biased separately. In some situations, such as when substantially equal voltage division across the FETs is desired, it can be advantageous to implement such separate biasing of bodies.

In some embodiments, the second FET(s) and the resistor(s) described in reference to FIGS. 21 and 22 can be implemented on the same die as the switch circuit(s) 380, off of the die, or any combination thereof.

In some implementations, and as described herein, the foregoing example configurations described in reference to FIGS. 21 and 22 can be relatively simpler and easier to implement, and can yield a number of improvements. For example, this technique can provide minimum or reduced insertion loss of the switch circuit 380 or arm 390. In another example, this technique can prevent or reduce parasitic junction diodes being turned on, and can reduce distortions associated with large voltage swings.

Summary of Example 7

In some implementations, Example 7 relates to a radio-frequency (RF) switch that includes at least one first field-effect transistor (FET) disposed between first and second nodes, with each of the at least one first FETs having a respective body and gate. The RF switch further includes and a coupling circuit that couples the respective body and gate of each of the at least one first FET. The coupling circuit is configured to be switchable between a resistive-coupling mode and a body-floating mode.

In some embodiments, the first FET can be a silicon-on-insulator (SOI) FET. In some embodiments, the coupling circuit can includes a resistance in series with a coupling switch. The coupling switch can include a second FET. The second FET can be OFF when the first FET is ON to yield the body-floating mode. The second FET can be ON when the first FET is OFF to yield the resistive-coupling mode.

In some embodiments, the RF switch can further include a gate bias resistor connected to the gate. In some embodiments, the first node can be configured to receive an RF signal having a power value and the second node is configured to output the RF signal when the first FET is in an ON state. The at least one first FET can include N FETs connected in series, with the quantity N being selected to allow the switch circuit to handle the power of the RF signal.

In accordance with a number of implementations, Example 7 relates to a method for operating a radio-frequency (RF) switch. The method includes controlling at least one field-effect transistor (FET) disposed between first and second nodes so that each of the at least one FET is in an ON state or an OFF state. The method further includes switching between a body-floating mode when each FET is ON and a resistive-coupling mode when each FET is OFF.

In a number of implementations, Example 7 relates to a semiconductor die that includes a semiconductor substrate and at least one field-effect transistor (FET) formed on the semiconductor substrate. The die further includes a coupling circuit that couples a respective body and gate of each of the at least one FET. The coupling circuit is configured to be switchable between a resistive-coupling mode and a body-floating mode.

In some embodiments, the die can further include an insulator layer disposed between the FET and the semiconductor substrate. In some embodiments, the die can be a silicon-on-insulator (SOI) die.

According to some implementations, Example 7 relates to a method for fabricating a semiconductor die. The method includes providing a semiconductor substrate, and forming at least one field-effect transistor (FET) on the semiconductor substrate, with each of the at least one FET having a respective gate and body. The method further includes forming a coupling circuit on the semiconductor substrate. The method further includes connecting the coupling circuit with the respective body and gate of the at least one FET. The coupling circuit is configured to be switchable between a resistive-coupling mode and a body-floating mode.

In some embodiments, the method can further include forming an insulator layer between the FET and the semiconductor substrate.

In some implementations, Example 7 relates to a radio-frequency (RF) switch module that includes a packaging substrate configured to receive a plurality of components, and a semiconductor die mounted on the packaging substrate, with the die having at least one field-effect transistor (FET). The switch module further includes a coupling circuit that couples a respective body and gate of each of the at least one FET. The coupling circuit is configured to be switchable between a resistive-coupling mode and a body-floating mode.

In some embodiments, the semiconductor die can be a silicon-on-insulator (SOI) die. In some embodiments, the coupling circuit can be part of the same semiconductor die as the at least one FET. In some embodiments, the coupling circuit can be part of a second die mounted on the packaging substrate. In some embodiments, the coupling circuit can be disposed at a location outside of the semiconductor die.

According to some implementations, Example 7 relates to a wireless device that includes a transceiver configured to process RF signals, and an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET), and a coupling circuit that couples a respective body and gate of each of the at least one FET. The coupling circuit is configured to be switchable between a resistive-coupling mode and a body-floating mode.

Description of Example 8

Some high-frequency switches using CMOS/SOI (complementary metal-oxide-semiconductor/silicon-on-insulator) or pHEMT (pseudomorphic high electron mobility transistor) transistors can generate nonlinear distortions that cause negative effects such as failures to meet FCC specifications. Various techniques have been utilized to reduce such distortions, but they generally do not necessarily address some of the fundamental issues associated with harmonics (e.g., 3rd order intermodulation distortion (IMD3) and 2nd order intermodulation distortion (IMD2). For example, improvement in one (of IMD3 and IMD2) can result in the other becoming worse.

Figure 23A:
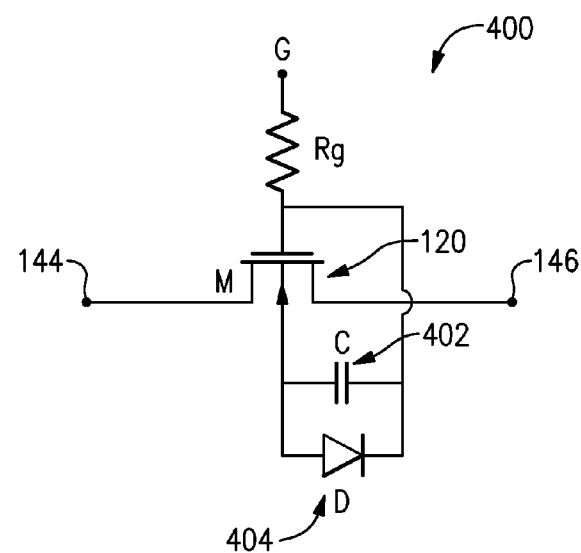
FIGS. 23A and 23B show variations of an eighth example of an RF switch circuit having an FET whose body and gate can be coupled by a capacitor or a parallel-combination of capacitor and diode to, for example, facilitate improvement of harmonic management, including IMD3 and IMD2.

FIG. 23A shows a switch circuit example 400 having an SOI FET 120 configured to provide switching functionality between first and second nodes 144, 146. A gate of the FET 120 can be biased through a gate resistor Rg to, for example, float the gate. A body of the FET 120 is shown to be coupled to the gate by a circuit having a capacitor 402 (capacitance C) arranged electrically parallel to a diode 404. In the example, the anode of the diode 404 is connected to the body of the FET 120, and the cathode of the diode 404 is connected to the gate of the FET 120. In some embodiments, the diode 404 can be a PMOS diode, and the resulting parallel combination of the capacitor 402 and the PMOS diode can facilitate improvement of harmonic management, including IMD3 and IMD2.

Figure 23B:
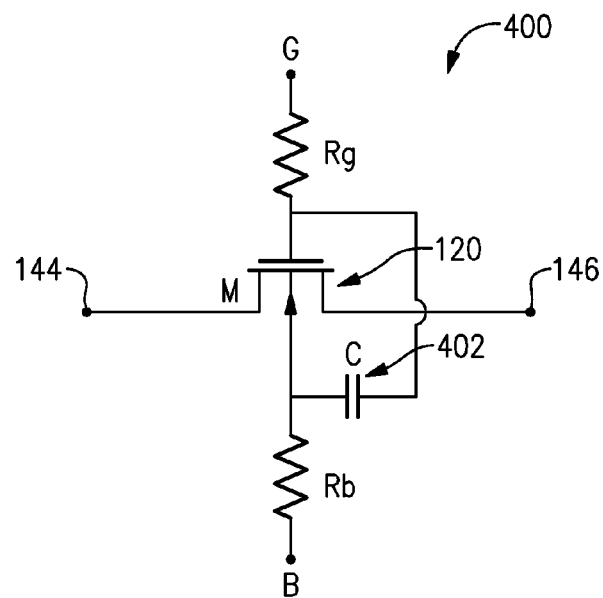

FIG. 23B shows another example of a switch circuit 400 having an SOI FET 120 configured to provide switching functionality between first and second nodes 144, 146. A gate of the FET 120 can be biased through a gate resistor Rg to, for example, float the gate. A body of the FET 120 is shown to be coupled to the gate by a circuit having a capacitor 402 (capacitance C). In the example, the capacitor 402 can be utilized to couple the body and gate, but a separate body bias can be provided through a body resistor Rb. In some embodiments, such a body resistor can float the body.

Figure 24A:
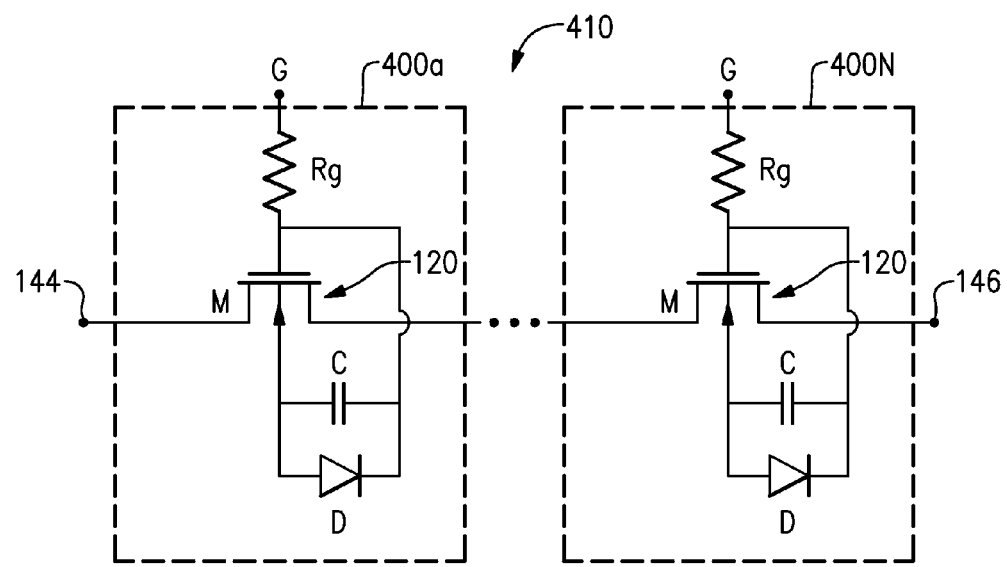
FIGS. 24A and 24B show that one or more features of FIGS. 23A and 23B can be implemented in switch arms having a plurality of FETs.
Figure 24B:
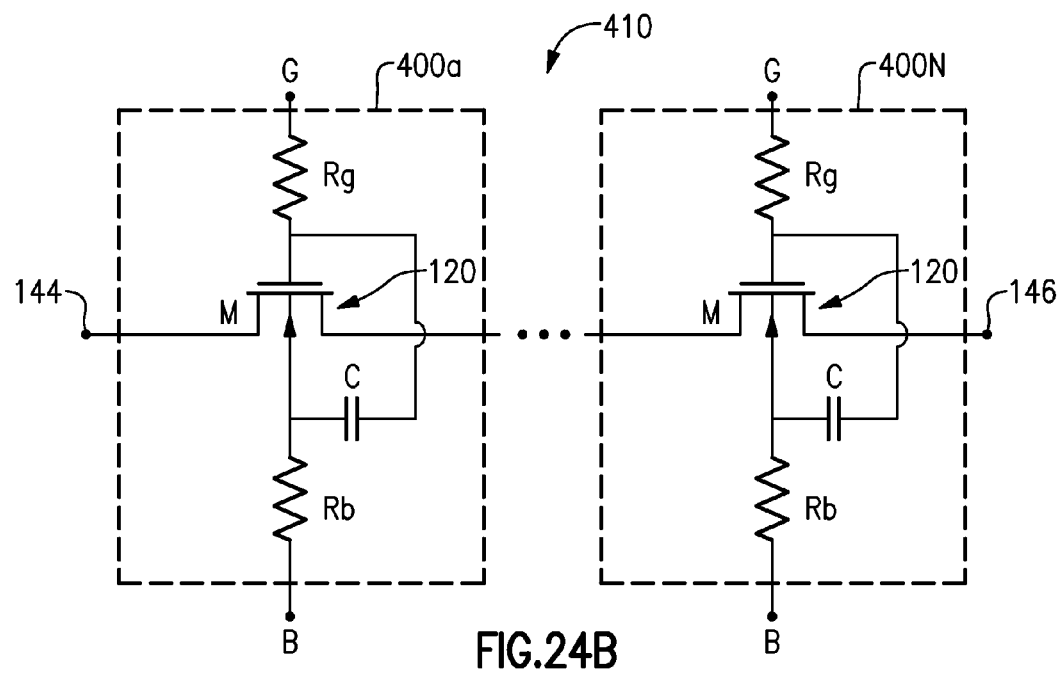

FIG. 24A shows a switch arm 410 having a plurality of the switch circuits 400 described in reference to FIG. 23A. Similarly, FIG. 24B shows a switch arm 410 having a plurality of the switch circuits 400 described in reference to FIG. 23B. In each of the example configurations 410, N such switch circuits are shown to be connected in series to provide switching functionality between terminals 144, 146. The number N can be selected based on power handling requirement. For example, N can be increased to handle higher power.

In some embodiments, gate bias voltages (Vg) for the plurality of FETs 120 can be substantially the same, and be provided by a common gate bias circuit. Such a common gate bias voltage Vg is shown to be provided to the gates via a gate resistor Rg. In some embodiments, some or all of the gates of the FETs 120 can be biased separately. In some situations, such as when substantially equal voltage division across the FETs is desired, it can be advantageous to implement such separate biasing of gates.

In the example configurations 410 of FIGS. 24A and 24B, a coupling circuit between the body and gate of each FET 120 as described in reference to FIGS. 23A and 23B can be provided for each of the N individual switch circuits 400. In some embodiments, a common coupling between at least some of the N bodies and gates of the FETs can also be implemented.

In some embodiments, the capacitor and the diode described in reference to FIGS. 23 and 24 can be implemented on the same die as the switch circuit(s) 400, off of the die, or any combination thereof.

In some implementations, and as described herein, the foregoing example configurations described in reference to FIGS. 23 and 24 can be relatively simpler and easier to implement, and can yield a number of improvements. For example, the configurations of FIGS. 23A and 24A can be implemented without an extra external bias network. In another example, this technique can improve the IMD2 performance while also substantially maintaining the IMD3 performance. In some implementations, a resistance (e.g., a resistor) can be provided between the source and drain of each FET. Such a configuration can help stabilize the voltage division across the FETs that are arranged in a stack.

Figure 25A:
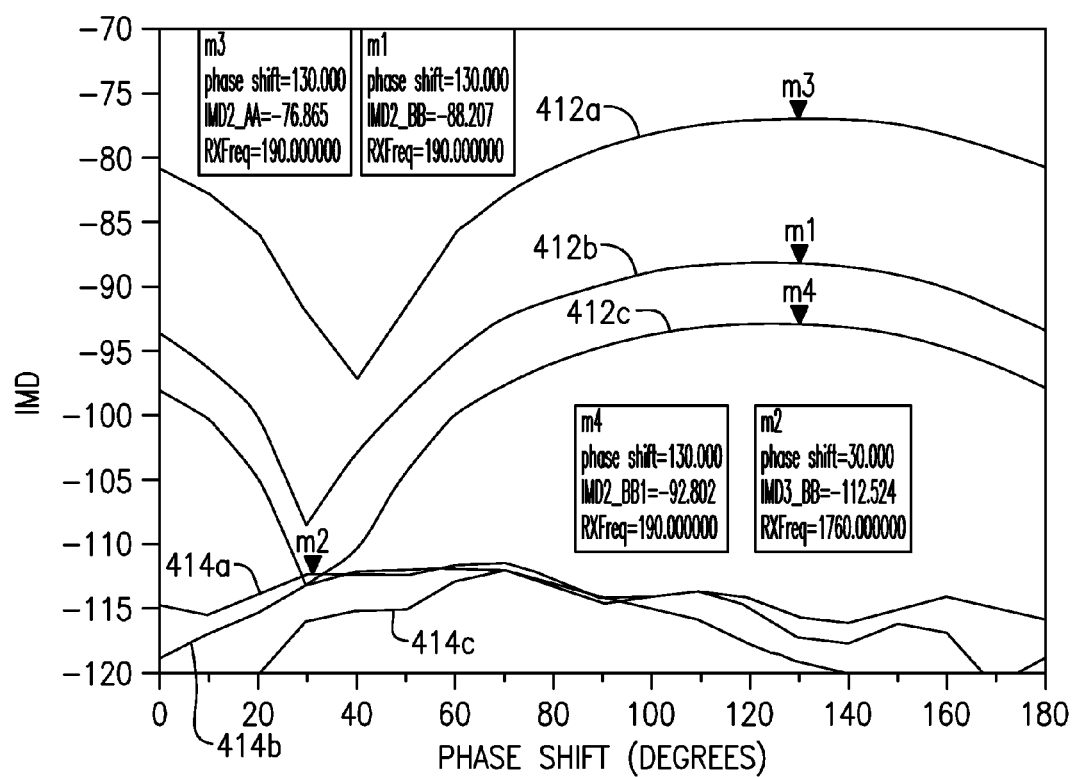
FIGS. 25A-25D show examples of improved performance that can be provided by the configurations of FIGS. 23 and 24.

FIGS. 25A-25D show examples of simulation results demonstrating some of the advantageous features that can be provided by the RF switch configurations described in reference to FIGS. 23 and 24. FIG. 25A shows plots of simulated IMD2s versus phase shift for three example switch configurations. Plot 412a is for IMD2 of a standard switch without a capacitor. Plot 412b is for IMD2 of a standard switch with a capacitor (402 in FIG. 23A). Plot 412c is for IMD2 of a "TR" ("Trap Rich" configuration) switch with a capacitor (402 in FIG. 23A). The two switch configurations (412b, 412c) with capacitors are shown to have IMD2 values that are significantly improved of those of the no-capacitor configuration (412a) throughout the phase shift range.

FIG. 25A further shows plots of simulated IMD3s versus phase shift for the foregoing three example switch configurations. Plot 414a is for IMD3 of the standard switch without a capacitor. Plot 412b is for IMD3 of the standard switch with a capacitor (402 in FIG. 23A). Plot 412c is for IMD3 of the "TR" ("Trap Rich" configuration) switch with a capacitor (402 in FIG. 23A). One can see that IMD3 performance is generally maintained for each of the three examples. Thus, degradation in IMD3 resulting from addition of the capacitor 402 is relatively little for the significant improvement in IMD2.

Figure 25B:
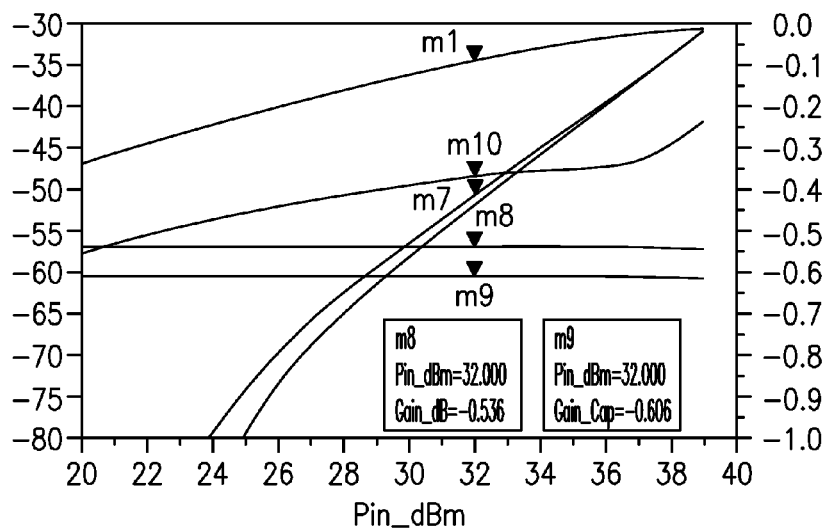
Figure 25C:
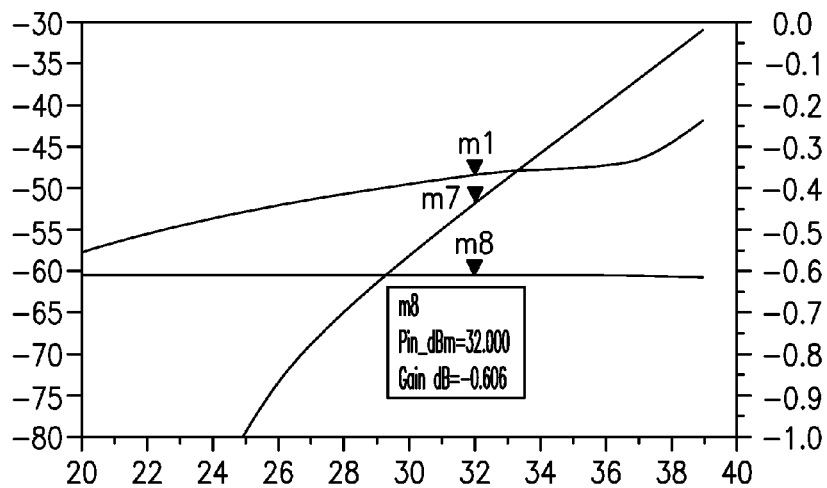
Figure 25D:
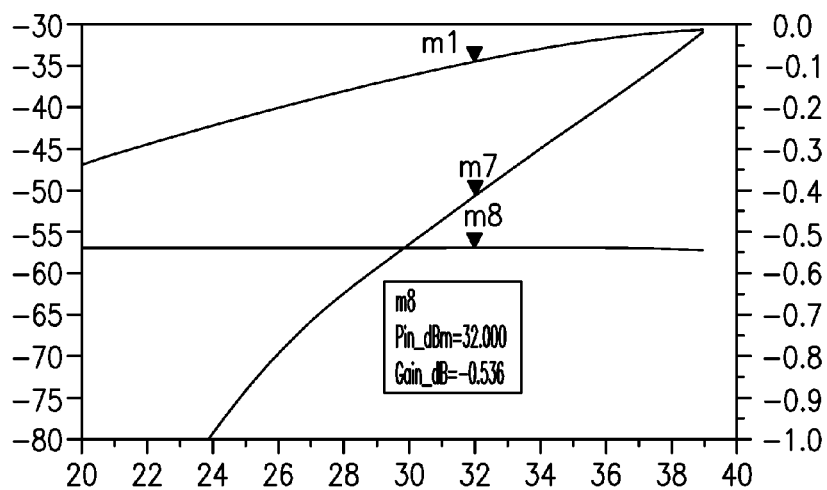

FIGS. 25B-25D show plots of simulated harmonic distortions versus input power (P_in) in dBm. FIG. 25B is a composite of second and third harmonics and gain for an example SP8T switch with a standard diode body bias ("w/o cap"), and with a diode-and-parallel-capacitor configuration ("w/cap"). FIG. 25C shows plots for the foregoing diode-and-parallel-capacitor configuration, and FIG. 25D shows plots for the foregoing diode-only configuration. Looking at the various graph markers at 32 dBm P_in, one can see that the second harmonic has values of approximately −34.5 dBm for the "w/o cap" case and approximately −48.4 dBm for the "w/cap" case. For the third harmonic, the "w/o cap" case has a value of approximately −50.7 dBm, and the "w/cap" case has a value of approximately −51.8 dBm. For a comparison in gain, it is also noted that the "w/o cap" case has a value of approximately 0.536 dB, and the "w/cap" case has a value of approximately 0.606 dB. Based on the foregoing examples, one can see that the addition of the capacitor improves the second harmonic performance by about 14 dB with relatively little impact on the third harmonic and an expected impact (about 0.07 dB) on high-band insertion loss.

Summary of Example 8

In some implementations, Example 8 relates to a radio-frequency (RF) switch that includes at least one field-effect transistor (FET) disposed between first and second nodes, with each of the at least one FET having a respective body and gate. The RF switch further includes a coupling circuit that couples the respective body and gate of each FET. The coupling circuit includes a capacitor electrically parallel with a diode.

In some embodiments, the FET can be a silicon-on-insulator (SOI) FET. In some embodiments, the coupling circuit can be configured to improve second-order intermodulation distortion (IMD2) performance without significantly degrading third-order intermodulation distortion (IMD3) performance. In some embodiments, the diode can include a PMOS diode. An anode of the diode can be connected to the body and a cathode of the diode can be connected to the gate.

In some embodiments, the RF switch can further include a gate bias resistor connected to the gate. In some embodiments, the first node can be configured to receive an RF signal having a power value and the second node can be configured to output the RF signal when the FET is in an ON state. The at least one FET can include N FETs connected in series, with the quantity N being selected to allow the switch circuit to handle the power of the RF signal.

According to some implementations, Example 8 relates to a method for operating a radio-frequency (RF) switch. The method includes controlling at least one field-effect transistor (FET) disposed between first and second nodes so that each of the at least one FET is in an ON state or an OFF state. The method further includes coupling a respective body and gate of each of the at least one FET through parallel combination of a capacitor and a diode.

In accordance with a number of implementations, Example 8 relates to a semiconductor die that includes a semiconductor substrate and at least one field-effect transistor (FET) formed on the semiconductor substrate. The die further includes a coupling circuit that couples a respective body and gate of each of the at least one FET. The coupling circuit includes a capacitor electrically parallel with a diode.

In some embodiments, the die further includes an insulator layer disposed between the FET and the semiconductor substrate. The die can be a silicon-on-insulator (SOI) die.

In a number of implementations, Example 8 relates to a method for fabricating a semiconductor die. The method includes providing a semiconductor substrate and forming at least one field-effect transistor (FET) on the semiconductor substrate, with each of the at least one FET having a respective gate and body. The method further includes forming a coupling circuit on the semiconductor substrate that is between the respective body and gate of each FET. The coupling circuit includes a capacitor electrically parallel with a diode.

In some embodiments, the method can further include forming an insulator layer between the FET and the semiconductor substrate.

In some implementations, Example 8 relates to a radio-frequency (RF) switch module that includes a packaging substrate configured to receive a plurality of components. The module further includes a semiconductor die mounted on the packaging substrate, with the die having at least one field-effect transistor (FET). The module further includes a coupling circuit that couples a respective body and gate of each of the at least one FET. The coupling circuit includes a capacitor electrically parallel with a diode.

In some embodiments, the semiconductor die can be a silicon-on-insulator (SOI) die. In some embodiments, the coupling circuit can be part of the same semiconductor die as the at least one FET. In some embodiments, the coupling circuit can be part of a second die mounted on the packaging substrate. In some embodiments, the coupling circuit can be disposed at a location outside of the semiconductor die.

According to some implementations, Example 8 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET). The switch further includes a coupling circuit that couples a respective body and gate of each of the at least one FET. The coupling circuit includes a capacitor electrically parallel with a diode.

In some implementations, Example 8 relates to a radio-frequency (RF) switch that includes at least one field-effect transistor (FET) disposed between first and second nodes, with each of the at least one FET having a respective body and gate. The RF switch further includes a coupling circuit that couples the respective body and gate of each FET. The coupling circuit includes a capacitor.

In some embodiments, the FET can be a silicon-on-insulator (SOI) FET. In some embodiments, the coupling circuit can be configured to improve second-order intermodulation distortion (IMD2) performance without significantly degrading third-order intermodulation distortion (IMD3) performance.

In some embodiments, the RF switch can further include a gate bias resistor connected to the gate. In some embodiments, the first node can be configured to receive an RF signal having a power value and the second node can be configured to output the RF signal when the FET is in an ON state. The at least one FET can include N FETs connected in series, with the quantity N being selected to allow the switch circuit to handle the power of the RF signal.

Description of Example 9

It is highly desirable for a radio-frequency (RF) switch to have low insertion loss, high isolation, and very high linearity. These performance parameters can usually conflict with each other. In some situations, these conflicting parameters can be dynamically adjusted by adjusting a gate bias resistor and a bias voltage for a body of a FET.

In some situations, the foregoing challenge can be addressed with a high value gate resistor. However, such a high value gate resistance being fixed can be problematic when the FET is in an OFF state, and when a signal needs to be shorted to a ground. Also, in some situations, a body bias can be applied to float the body when the FET is in an ON state, and grounded in an OFF state, to improve insertion loss, isolation, and linearity.

Figure 26:
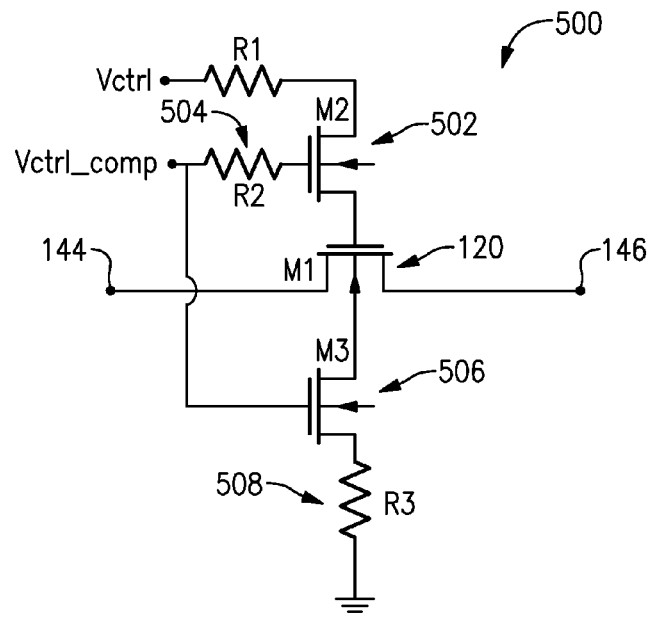
FIG. 26 shows a ninth example of an RF switch circuit having a switchable coupling between a body and a gate of an FET to, for example, provide minimum or reduced insertion loss when the switch is ON, and to provide reduce distortions associated with large voltage swings.

FIG. 26 shows a switch circuit example 500 having an SOI FET 120 (also indicated as M1) configured to provide switching functionality between first and second nodes 144, 146. A gate of the FET 120 can be biased with Vctrl through a resistor R1 in a switchable manner by a second FET 502 (also indicated as M2) as described below. A body of the FET 120 is shown to be resistively coupled to a ground in a switchable manner by a third FET 506 (also indicated as M3) as also described below. Operation of M2 can be controlled by its gate bias voltage V_ctrl_comp provided to M2 through its gate resistor R2. Operation of M3 can be controlled by the same gate bias voltage Vctrl_comp provided to M3 without a gate resistor.

When the switch circuit 500 is ON, M1 is ON, and each of M2 and M3 can be turned OFF. Such a configuration can yield minimum or reduced insertion loss by floating the body and providing high impedance to the gate of M1 (e.g., by M2 behaving like a high value resistor when it is OFF).

When the switch circuit 500 is OFF, M1 is OFF, and each of M2 and M3 can be turned ON. Such a configuration can yield a ground bias to the body of M1 and an RF ground to the gate of M1, to thereby prevent or reduce the parasitic junction diode effects being turned on, and also reduce distortions associated with large voltage swings. The RF-shorting of M1's gate can also improve the isolation performance when M1 is OFF.

Figure 27:
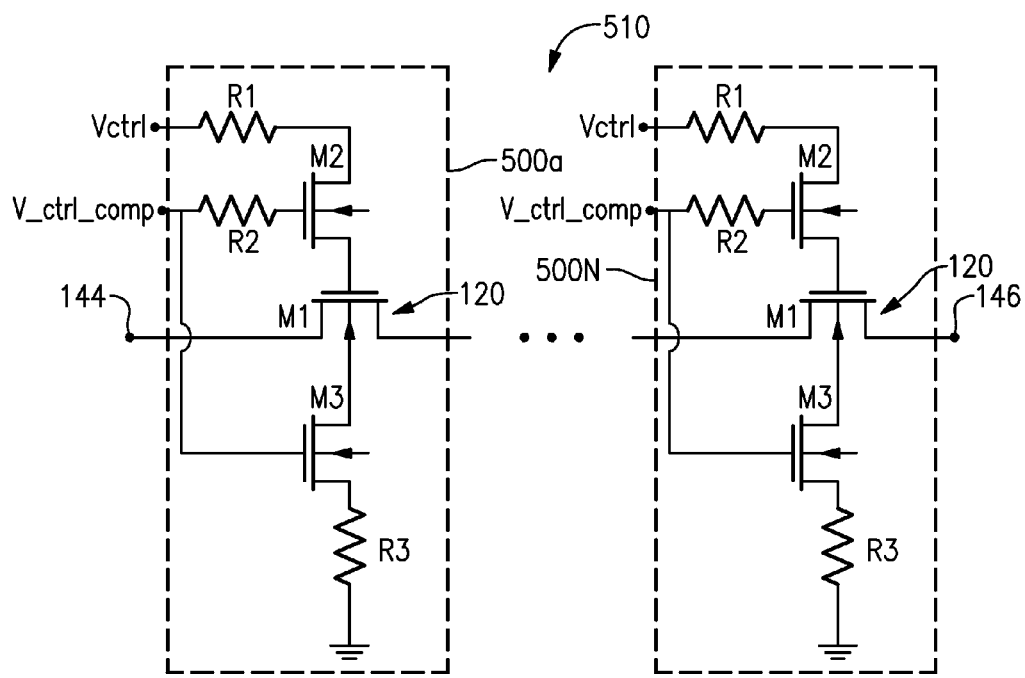
FIG. 27 shows that one or more features of FIG. 26 can be implemented in a switch arm having a plurality of FETs.

FIG. 27 shows a switch arm 510 having a plurality of the switch circuits 500 described in reference to FIG. 26. In the example configuration 510, N such switch circuits are shown to be connected in series to provide switching functionality between terminals 144, 146. The number N can be selected based on power handling requirement. For example, N can be increased to handle higher power.

In some embodiments, a circuit that includes some or all of R1, R2, R3, M2 and M3 as described in reference to FIG. 26 can be provided for each of the N individual switch circuits 500, can provided to all of the N switch circuits 500 as a common circuit, or any combination thereof.

In some embodiments, R1, R2, R3, M2 and M3 as described in reference to FIGS. 26 and 27 can be implemented on the same die as the switch circuit(s) 500, off of the die, or any combination thereof.

In some implementations, and as described herein, the foregoing example configurations described in reference to FIGS. 26 and 27 can be relatively simpler and easier to implement, and can yield a number of improvements. For example, this technique can provide minimum or reduced insertion loss when the switch circuit 500 or arm 510 is ON, and provide desirable features such as reduced parasitic junction diode effects, reduced distortions associated with large voltage swings, and improved isolation performance, when the switch circuit 500 or arm 510 is OFF.

Summary of Example 9

In accordance with a number of implementations, Example 9 relates to a radio-frequency (RF) switch that includes at least one field-effect transistor (FET) disposed between first and second nodes, with each of the at least one FET having a respective gate and body. The RF switch further includes a switchable resistive coupling circuit connected to the respective gate, and a switchable resistive grounding circuit connected to the corresponding body of the at least one FET.

In some embodiments, the FET can be a silicon-on-insulator (SOI) FET. In some embodiments, the switchable resistive coupling circuit can include a bias resistor in series with a first coupling switch. The switchable resistive grounding circuit can include a body resistor in series with a second coupling switch. Each of the first and second coupling switches can be OFF when the FET is ON to yield a reduced insertion loss by floating the body and the gate. Each of the first and second coupling switches can be ON when the FET is OFF to yield a ground bias to the body and an RF ground to the gate, to thereby improve isolation performance of the RF switch.

In some embodiments, the first node can be configured to receive an RF signal having a power value and the second node can be configured to output the RF signal when the FET is in an ON state. The at least one FET can include N FETs connected in series, with the quantity N being selected to allow the switch circuit to handle the power of the RF signal.

In some implementations, Example 9 relates to a method for operating a radio-frequency (RF) switch. The method includes controlling at least one field-effect transistor (FET) disposed between first and second nodes so that each of the at least one FET is in an ON state or an OFF state. The method further includes floating a respective gate and body of each of the at least one FET when each FET is in the ON state. The method further includes providing a ground bias to the respective body and an RF ground to the respective gate when each FET is in the OFF state.

In a number of implementations, Example 9 relates to a semiconductor die that includes a semiconductor substrate and at least one field-effect transistor (FET) formed on the semiconductor substrate. The die further includes a coupling circuit having a switchable resistive circuit connected to a respective gate of each of the at least one FET. The coupling circuit further includes a switchable resistive grounding circuit connected to a respective body of each of the at least one FET.

In some embodiments, the die can further include an insulator layer disposed between the FET and the semiconductor substrate. The die can be a silicon-on-insulator (SOI) die.

According to some implementations, Example 9 relates to a method for fabricating a semiconductor die. The method includes providing a semiconductor substrate. The method further includes forming at least one field-effect transistor (FET) on the semiconductor substrate, with each of the at least one FET having a respective gate and body. The method further includes forming a switchable resistive coupling circuit on the semiconductor substrate that is connected to the respective gate of the at least one FET. The method further includes forming a switchable resistive grounding circuit on the semiconductor substrate that is connected to the respective body of the at least one FET.

In some embodiments, the method can further include forming an insulator layer between the FET and the semiconductor substrate.

In some implementations, Example 9 relates to a radio-frequency (RF) switch module that includes a packaging substrate configured to receive a plurality of components. The module further includes a semiconductor die mounted on the packaging substrate, with the die having at least one field-effect transistor (FET). The module further includes a coupling circuit having a switchable resistive circuit connected to a respective gate of each of the at least one FET. The coupling circuit further includes a switchable resistive grounding circuit connected to a respective body of each of the at least one FET.

In some embodiments, the semiconductor die can be a silicon-on-insulator (SOI) die. In some embodiments, the coupling circuit can be part of the same semiconductor die as the at least one FET. In some embodiments, the coupling circuit can be part of a second die mounted on the packaging substrate. In some embodiments, the coupling circuit can be disposed at a location outside of the semiconductor die.

In a number of implementations, Example 9 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET). The switch further includes a coupling circuit having a switchable resistive circuit connected to a respective gate of each of the at least one FET and a switchable resistive grounding circuit connected to a respective body of each of the at least one FET.

Description of Example 10

In many radio-frequency (RF) transmit applications, switch designs typically require high-power operation capability, especially under mismatch. For example, switches used for antenna tuning are expected to withstand mismatch as high as 20:1 under +35 dBm input power. Also, some switches utilized in wireless systems such as GSM are expected to withstand 5:1 mismatch under +35 dBm input power. Higher field-effect transistor (FET) stack height is generally used to withstand high power under mismatch. However, uneven voltage distribution across the FET stack can lead to harmonic peaking, degradation in compression point, and/or intermodulation distortion (IMD) of SOI-based switches.

Figure 28:
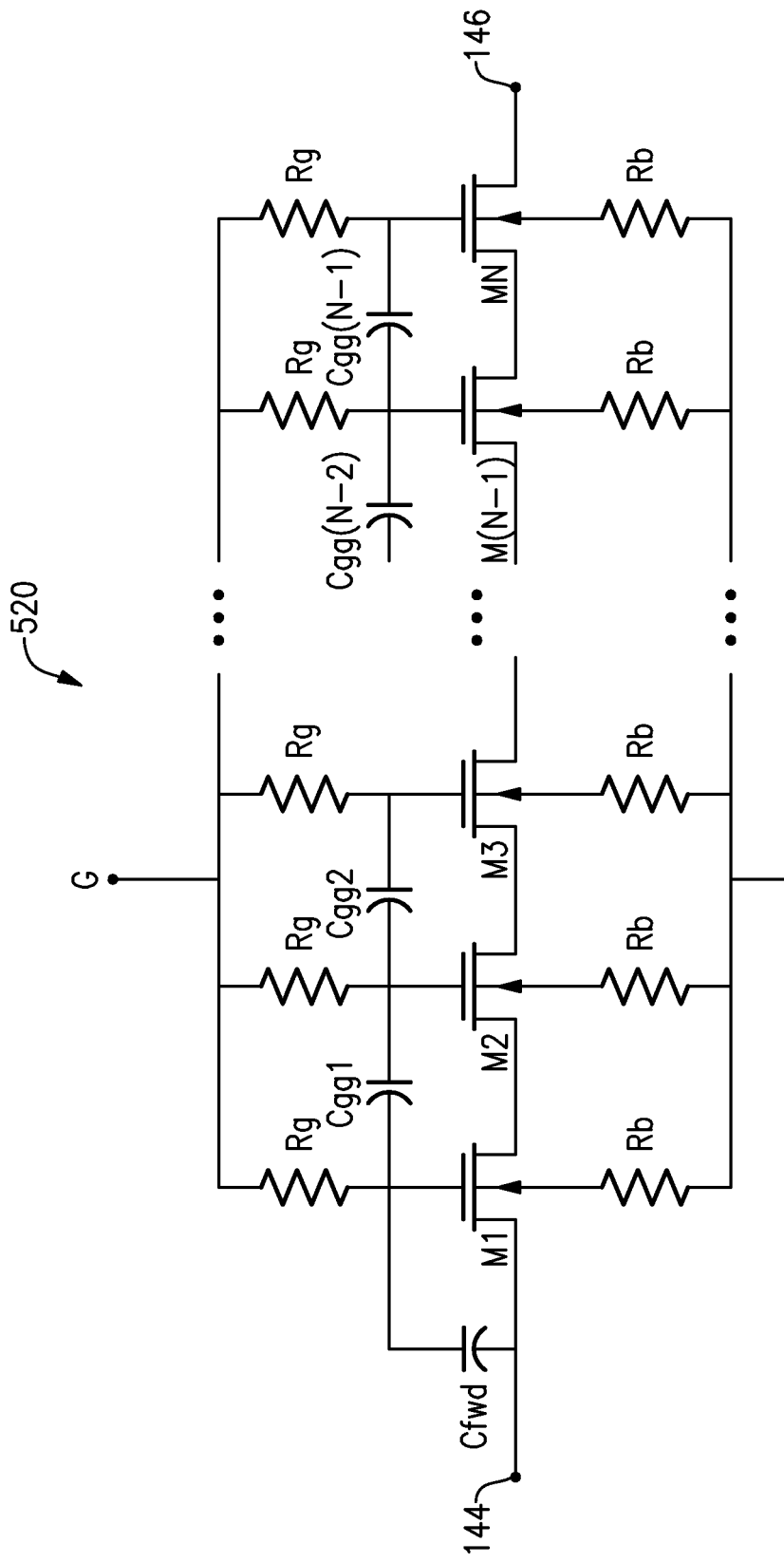
FIGS. 28-30 show variations of a tenth example of an RF switch circuit having FETs whose gates can be voltage-compensated to, for example, yield an improved voltage distribution across each FET.

FIG. 28 shows an example configuration of an FET stack 520 configured to provide switching of RF signals between first and second nodes 144, 146. The first and second nodes 144, 146 can be, for example, RF input and RF output, respectively.

In some implementations, the stack 520 can include N SOI FETs (indicated as M1, M2, . . . , MN) connected in series between the nodes 144, 146. The number N can be selected based on power handling requirement. For example, N can be increased to handle higher power.

In the example stack configuration 520, each gate of the FET is shown to be biased through a gate resistor Rg. N such gate resistors corresponding to the N FETs are shown to be connected to a common gate bias voltage source "G."

In the example stack configuration 520, each body of the FET is shown to be biased through a body resistor Rb. N such body resistors corresponding to the N FETs are shown to be connected to a common body bias voltage source "B."

In some implementations, some or all of the gates of the FETs can be voltage-compensated to yield an improved voltage distribution across each FET in the stack 520. Such an improved voltage distribution can result in improvement in compression point, harmonics, and or IMD performance.

In the example shown in FIG. 28, the foregoing voltage-compensation of the gates can be achieved by coupling the gates of the FETs with capacitive elements Cgg (e.g., capacitors). For example, Cgg1 couples the gates of M1 and M2, Cgg2 couples the gates of M2 and M3, and so on, with Cgg(N−2) coupling the gates of M(N−2) and M(N−1), and Cgg(N−1) coupling the gates of M(N−1) and MN.

In some embodiments, the coupling capacitive elements Cgg can have substantially the same value. In some embodiments, the capacitive elements Cgg can be scaled and/or optimized within the stack 520 with different values for Cgg1, Cgg2, Cgg3, etc. An example of such scaling of Cgg values to obtain a desired result is described in greater detail in reference to FIG. 31.

In some embodiments, a feed-forward capacitor, Cfwd can be provided to couple source/drain and gate of an end FET (e.g., M1). In some embodiments, the feed-forward capacitor Cfwd can couple source/drain and gate of a non-end FET within the FET stack. The feed-forward capacitor, Cfwd can ensure that the RF signal path between the nodes 144, 146 is coupled to at least one of the gates of the FETs.

Figure 29:
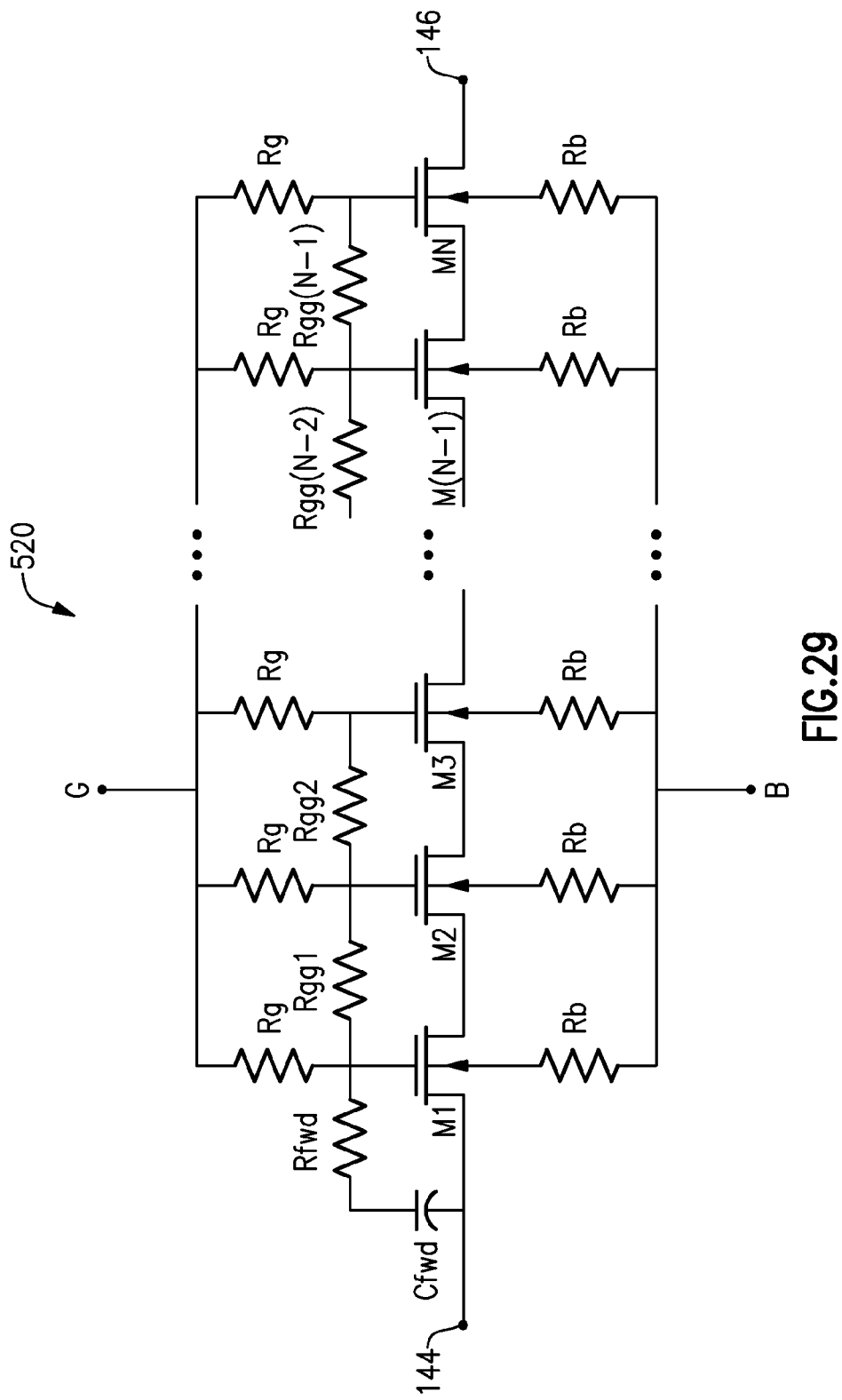

FIG. 29 shows that in some implementations, voltage-compensation of the gates can be achieved by coupling the gates of the FETs with resistive elements Rgg (e.g., resistors). For example, Rgg1 couples the gates of M1 and M2, Rgg2 couples the gates of M2 and M3, and so on, with Rgg(N−2) coupling the gates of M(N−2) and M(N−1), and Rgg(N−1) coupling the gates of M(N−1) and MN. In the example of FIG. 29, a feed-forward coupling between source/drain and gate of an FET (e.g., M1) is shown to include a capacitor Cfwd in series with a resistor Rfwd.

In some embodiments, the coupling resistive elements Rgg can have substantially the same value. In some embodiments, the resistive elements Rgg can have different values that are selected to achieve a desired result.

Figure 30:
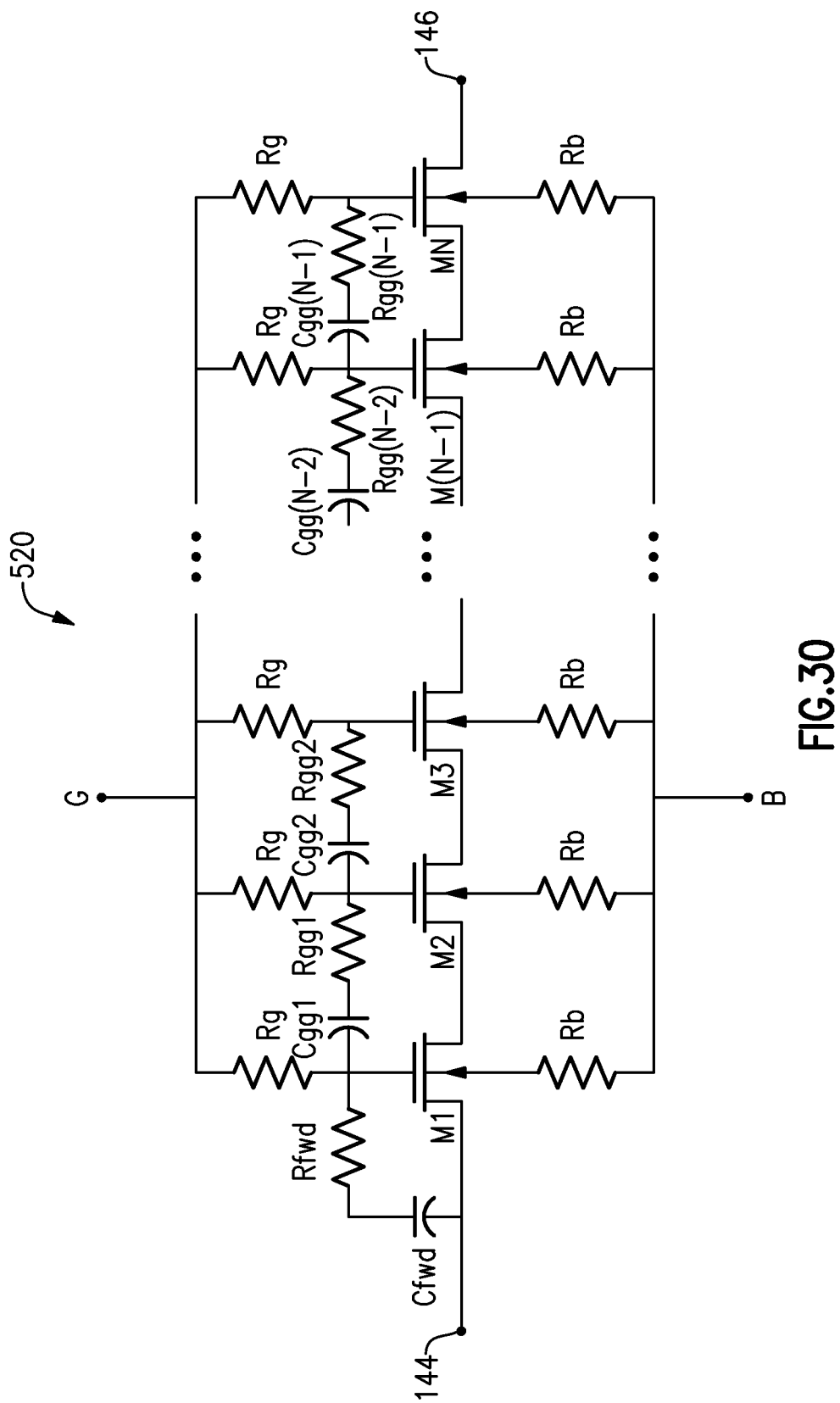

FIG. 30 shows that in some implementations, voltage-compensation of the gates can be achieved by coupling the gates of the FETs with capacitive elements Cgg (e.g., capacitors) and resistive elements Rgg (e.g., resistors). For example, Cgg1 and Rgg1 in series couples the gates of M1 and M2, Cgg2 and Rgg2 in series couples the gates of M2 and M3, and so on, with Cgg(N−2) and Rgg(N−2) in series coupling the gates of M(N−2) and M(N−1), and Cgg(N−1) and Rgg(N−1) in series coupling the gates of M(N−1) and MN. In the example of FIG. 30, a feed-forward coupling between source/drain and gate of an FET (e.g., M1) is shown to include a capacitor Cfwd in series with a resistor Rfwd.

In some embodiments, the coupling capacitive elements Cgg can have substantially the same value. In some embodiments, the capacitive elements Cgg can have different values that are selected to achieve a desired result. Similarly, the coupling resistive elements Rgg can have substantially the same value, or have different values selected to achieve a desired result.

Figure 31:
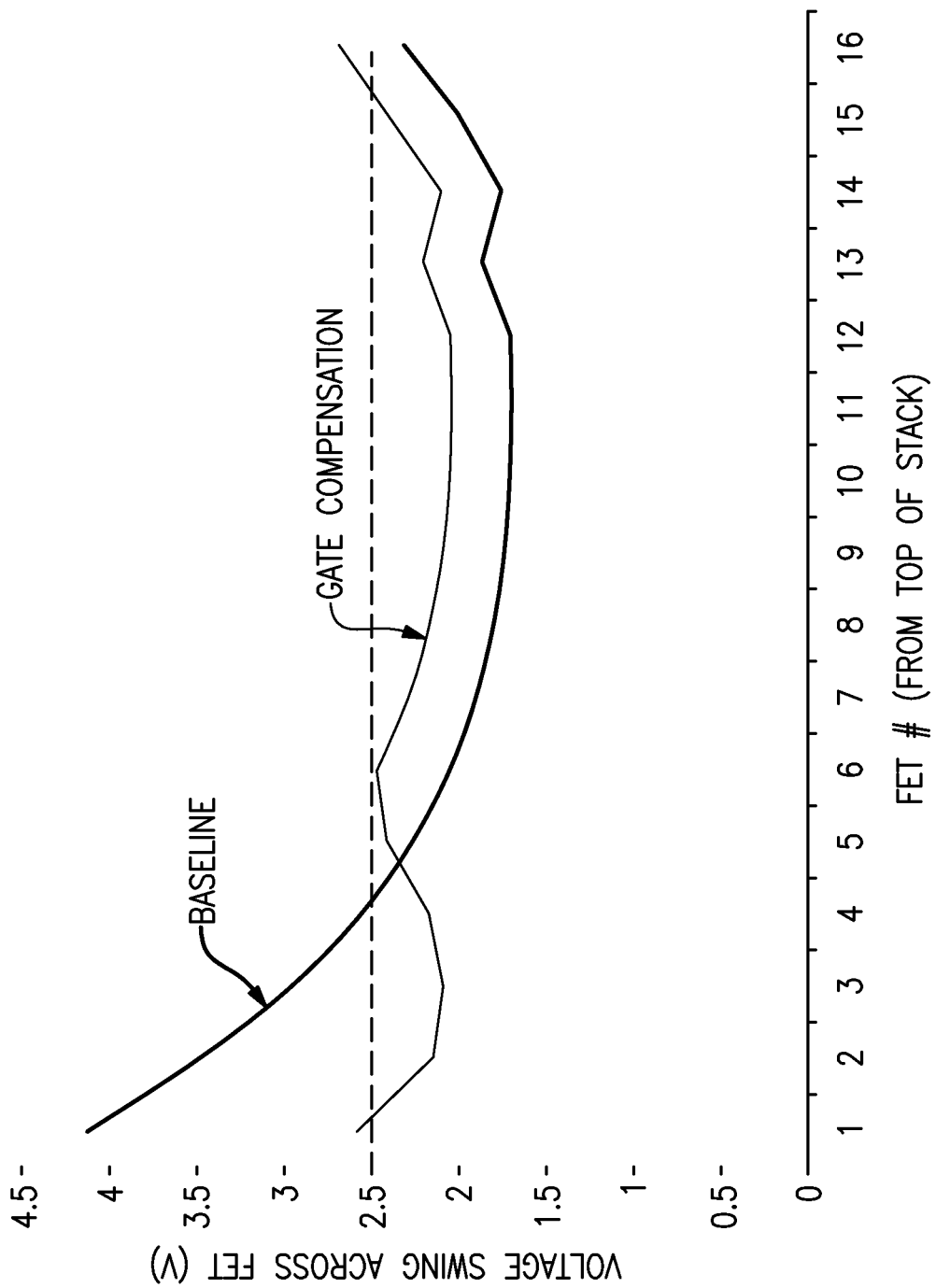
FIG. 31 shows an example of performance improvement that can be achieved with the gate-compensation feature of FIGS. 28-30.

FIG. 31 shows plots of voltage swings across each of the FETs in an example stack having 16 FETs. The "baseline" configuration corresponds to a stack where the gates are not voltage-compensated. The "gate compensation" configuration corresponds to a stack where the gates are voltage-compensated as described in reference to FIG. 28. For the plot shown in FIG. 31, the values of Cgg are selected as Cgg1>Cgg2>Cgg3> . . . >CggN. Voltage swings associated with such a configuration are shown to be significantly less than the baseline case.

In some embodiments, the capacitive elements Cgg described in reference to FIGS. 28 and 30 can be implemented on the same die as the FETs (M1, M2, etc.), off of the die, or any combination thereof. Such on-die and/or off-die implementations of the capacitive elements Cgg can include, for example, MIM capacitors and/or capacitive metal traces.

In some embodiments, the resistive elements Rgg described in reference to FIGS. 29 and 30 can be implemented on the same die as the FETs (M1, M2, etc.), off of the die, or any combination thereof.

In some implementations, and as described herein, the foregoing example configurations described in reference to FIGS. 28-31 can be relatively simpler and easier to implement, and can yield a number of improvements. For example, this technique can provide less fluctuations in voltage swings across each FET in a switch stack. Such a feature can yield other desirable features such as improved compression point, as well as improved harmonics and IMD performance.

In some implementations, various example configurations related to gate-to-gate compensation can be combined with one or more features that can improve performance of one or more of the FETs in a given stack.

Summary of Example 10

In some implementations, Example 10 relates to a radio-frequency (RF) switch that includes a plurality of field-effect transistors (FETs) connected in series between first and second nodes, with each FET having a gate. The RF switch further includes a compensation network having a coupling circuit that couples the gates of each pair of neighboring FETs.

In some embodiments, at least some of the FETs can be silicon-on-insulator (SOI) FETs. In some embodiments, the compensation network can be configured to reduce voltage swings across each of the plurality of FETs. In some embodiments, The switch can further include a feed-forward circuit that couples a source of an end FET to the gate of the end FET. The feed-forward circuit can include a capacitor. The feed-forward circuit can further include a resistor in series with the capacitor.

In some embodiments, the coupling circuit can include a capacitor. The capacitors can have successively smaller capacitance values as the FETs are traversed from the first node to the second node. The coupling circuit can further include a resistor in series with the capacitor.

In some embodiments, the coupling circuit can include a resistor. In some embodiments, the switch can further include a gate bias network connected to and configured to provide bias signals to the gates of the FETs. The gate bias network can be configured so that all of the gates receive a common bias signal.

In some embodiments, the switch can further include a body bias network connected to and configured to provide bias signals to the bodies of the FETs. The body bias network can be configured so that all of the bodies receive a common bias signal.

In some embodiments, the first node can be configured to receive an RF signal having a power value and the second node can be configured to output the RF signal when the FET is in an ON state. The at least one FET can include N FETs connected in series, with the quantity N being selected to allow the switch circuit to handle the power of the RF signal.

According to a number of implementations, Example 10 relates to a method for operating a radio-frequency (RF) switch. The method includes controlling a plurality of field-effect transistors (FETs) connected in series between first and second nodes so that the FETs are collectively in an ON state or an OFF state, with each FET having a gate. The method further includes coupling the gates of each of neighboring FETs to reduce voltage swings across each of the plurality of FETs.

In accordance with a number of implementations, Example 10 relates to a semiconductor die that includes a semiconductor substrate and a plurality of field-effect transistors (FETs) formed on the semiconductor substrate and connected in series, with each FET having a gate. The die further includes a compensation network formed on the semiconductor substrate, the compensation network including a coupling circuit that couples the gates of each pair of neighboring FETs.

In some embodiments, the die can further include an insulator layer disposed between the FETs and the semiconductor substrate. The die can be a silicon-on-insulator (SOI) die.

In a number of implementations, Example 10 relates to a method for fabricating a semiconductor die. The method includes providing a semiconductor substrate and forming a plurality of field-effect transistors (FETs) on the semiconductor substrate so as to be connected in series, with each FET having a gate. The method further includes forming a coupling circuit on the semiconductor substrate so as to couple the gates of each pair of neighboring FETs.

In some embodiments, the method can further include forming an insulator layer between the FETs and the semiconductor substrate.

In a number of implementations, Example 10 relates to a radio-frequency (RF) switch module that includes a packaging substrate configured to receive a plurality of components. The module further includes a semiconductor die mounted on the packaging substrate. The die includes a plurality of field-effect transistors (FETs) connected in series, with each FET having a gate. The module further includes a compensation network having a coupling circuit that couples the gates of each pair of neighboring FETs.

In some embodiments, the semiconductor die can be a silicon-on-insulator (SOI) die. In some embodiments, the compensation network can be part of the same semiconductor die as the at least one FET. In some embodiments, the compensation network can be part of a second die mounted on the packaging substrate. In some embodiments, the compensation network can be disposed at a location outside of the semiconductor die.

According to some implementations, Example 10 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes a plurality of field-effect transistors (FETs) connected in series, with each FET having a gate. The switch further includes a compensation network having a coupling circuit that couples the gates of each pair of neighboring FETs.

Description of Example 11

Intermodulation distortion (IMD) measures an unwanted signal added to a desired signal due to mixing products from other RF signals. Such an effect can be particularly dominant in a multi-mode, multi-band environment. IMD can the result from two or more signals mixing together to yield frequencies that are not harmonic frequencies.

System designers typically strive to reduce interference susceptibility through, for example, improved linearity. A given system's linearity can govern how much IMD will occur within it, which in turn can create interferences. Through improved linearity of the system building blocks, such as an RF switch, the overall susceptibility of a system to interference can be decreased.

Performance features such as a lower IMD in RF switches can be an important factor in wireless-device designs. For example Long Term Evolution (LTE) systems can benefit significantly from RF switches having reduced IMDs. As a more specific example, system designs for simultaneous voice and data on LTE (SVLTE) can benefit significantly from RF switches having ultra-low levels of IMDs.

Figure 32:
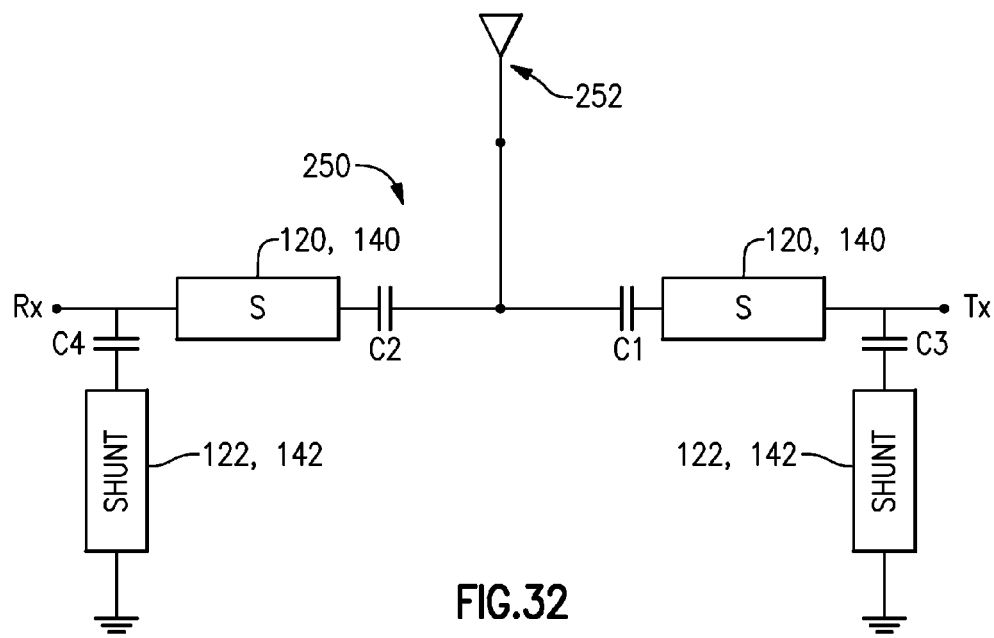
FIG. 32 shows an eleventh example where an RF switching configuration can include one or more capacitors to, for example, inhibit a low-frequency blocker from mixing with a fundamental frequency.

FIG. 32 shows a switching configuration 250 in an example context of a single-pole-dual-throw (SPDT) application. The single pole is shown to be connected to an antenna 252. One of the two throws is shown to be coupled to a receive (Rx) port via a switch circuit S. The Rx port can be coupled to a ground via a shunt switch circuit.

Similarly, the other throw is shown to be coupled to a transmit (Tx) port via a switch circuit S. The Tx port can be coupled to the ground via a shunt switch circuit.

In some embodiments, each of the switch circuits ("S" and "Shunt") can include one or more FETs such as SOI FETs. A single FET is sometimes referred to herein with a reference numeral 120 or 122, and a stack of such FETs is sometimes referred to herein with a reference numeral 140 or 142. In some embodiments, the "S" and "Shunt" switches can include one or more features described herein to provide various advantageous functionalities.

The switching configuration of FIG. 32 is shown to include capacitors to inhibit a low-frequency blocker from mixing with a fundamental frequency. For example, a capacitor C1 is provided between the antenna node and the switch arm S of the Tx throw. Similarly, a capacitor C2 is provided between the antenna node and the switch arm S of the Rx throw. For the shunt arms, a capacitor C3 is provided between the Tx node and its shunt switch arm. Similarly, a capacitor C4 is provided between the Rx node and its shunt switch arm. In some embodiments, a shunt arm may or may not be provided for the Rx node. With the foregoing capacitors, a low-frequency jammer signal can be blocked or reduced from mixing with any ON or OFF paths. This can lead to improvement in IMD performance, especially for low-frequency blocker signals.

Figure 33:
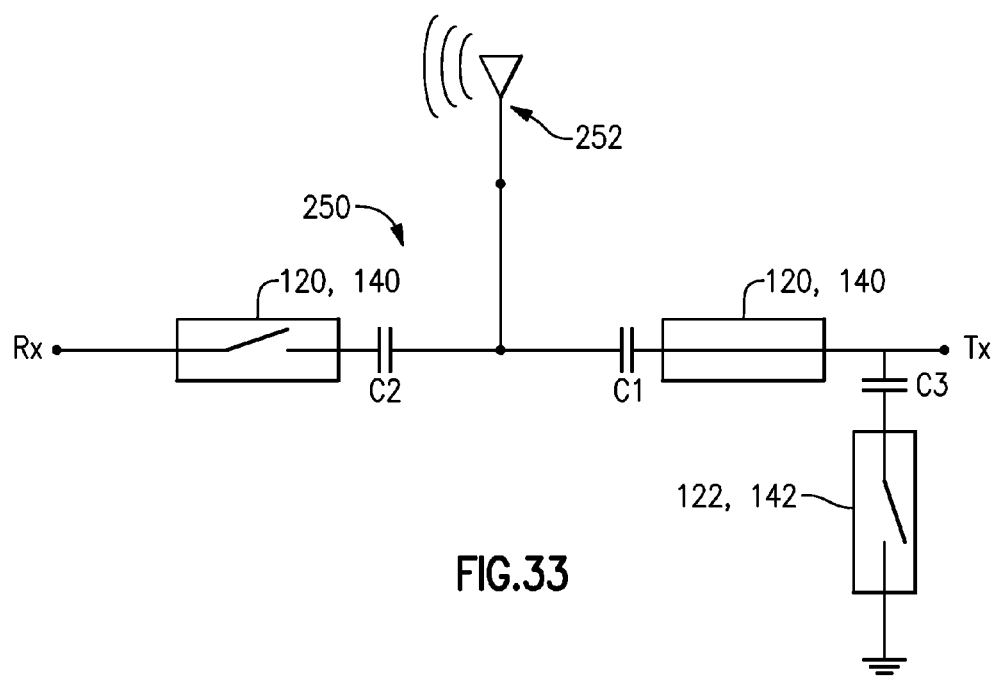
FIG. 33 shows an example where the switching configuration of FIG. 32 is in a transmit mode.

FIG. 33 shows an example operating configuration where some of the foregoing capacitors can provide desirable switching functionalities. In the example, the switching configuration is in a transmit mode. Accordingly, the transmit switch arm is ON (closed), and the receive switch arm is OFF (open). The shunt arm for the Tx node is OFF (open).

In some embodiments, capacitors C1-C4 described in reference to FIGS. 32 and 33 can be implemented on the same die as their respective switch circuits, off of the die, or any combination thereof.

In some implementations, and as described herein, the foregoing example configurations described in reference to FIGS. 32 and 33 can be relatively simpler and easier to implement, and can yield a number of improvements. For example, this technique can provide improved IMD performance by preventing a low-frequency blocker signal from mixing with a fundamental frequency signal.

Summary of Example 11

In some implementations, Example 11 relates to a radio-frequency (RF) switch system that includes a switch having a stack of field-effect transistors (FETs) connected in series between first and second nodes. The system further includes a capacitor connected in series with the switch and configured to inhibit a low-frequency blocker signal from mixing with a fundamental-frequency signal in the switch.

In some embodiments, the FETs can be silicon-on-insulator (SOI) FETs. In some embodiments, the first node can be an antenna node. The capacitor can be disposed between the switch and the antenna node. The switch can be part of a transmit path such that the second node of the switch is an input node for an amplified RF signal. The switch can be part of a receive path such that the second node of the switch is an output node for an RF signal received from the antenna.

According to some implementations, Example 11 relates to a semiconductor die having a semiconductor substrate and a switch formed on the semiconductor substrate and having a stack of field-effect transistors (FETs) connected in series. The die further includes a capacitor formed on the semiconductor substrate and connected in series with the switch. The capacitor is configured to inhibit a low-frequency blocker signal from mixing with a fundamental-frequency signal in the switch.

In some embodiments, the die can further include an insulator layer disposed between the FETs and the semiconductor substrate. The die can be a silicon-on-insulator (SOI) die.

In a number of implementations, Example 11 relates to a method for fabricating a semiconductor die. The method includes providing a semiconductor substrate and forming a stack of field-effect transistors (FETs) on the semiconductor substrate so as to be connected in series. The method further includes forming a capacitor on the semiconductor substrate so as to be connected in series with an end of the stack. The capacitor is configured to inhibit a low-frequency blocker signal from mixing with a fundamental-frequency signal in the stack.

In some embodiments, the method can further include forming an insulator layer between the FETs and the semiconductor substrate.

In accordance with some implementations, Example 11 relates to a radio-frequency (RF) switch module that includes a packaging substrate configured to receive a plurality of components. The module further includes a semiconductor die mounted on the packaging substrate. The die includes a switch having a stack of field-effect transistors (FETs) connected in series. The module further includes a capacitor connected in series with the switch. The capacitor is configured to inhibit a low-frequency blocker signal from mixing with a fundamental-frequency signal in the switch.

In some embodiments, the semiconductor die can be a silicon-on-insulator (SOI) die. In some embodiments, the capacitor can be part of the same semiconductor die as the FETs. In some embodiments, the capacitor can be part of a second die mounted on the packaging substrate. In some embodiments, the capacitor circuit can be disposed at a location outside of the semiconductor die.

In an number of implementations, Example 11 relates to a wireless device that includes a transceiver configured to process RF signals. The wireless device further includes an antenna in communication with the transceiver. The wireless device further includes a switch module interconnected to the antenna and the transceiver and configured to selectively route RF signals to and from the antenna. The switch module includes a switch having a stack of field-effect transistors (FETs) connected in series. The switch module further includes a capacitor connected in series with the switch. The capacitor is configured to inhibit a low-frequency blocker signal from mixing with a fundamental-frequency signal in the switch.

Description of Example 12

In some implementations, body-to-body compensation techniques can be applied to a stack of FETs such as SOI FETs. Such techniques can provide, for example, less fluctuations in voltage swings across each FET in a switch stack. Such a feature can yield other desirable features such as improved compression point, as well as improved harmonics and IMD performance.

In some radiofrequency (RF) applications, it may be desirable to operate transmit switches under high power, including applications that operate under high mismatch. For example, GSM switches may operate under 35 dBm with 5:1 mismatch and switches used in antenna tuning may operate under 35 dBm with mismatch as high as 20:1.

In some RF applications, transmit switches operating under high power may experience uneven voltage distribution across the switch. Non-uniform voltage swing across a switch may produce adverse effects in device performance, including harmonic peaking, degradation in compression point and intermodulation distortion (IMD) performance of the switch.

Described herein are circuits, devices and methodologies for providing more uniform voltage swing across a transmit switch for improved device performance. In some implementations, increased uniformity in voltage swing across a transmit switch may result in improved compression point, harmonics and intermodulation distortion performance.

A switching device may be capable of being in a first state or a second state, such that the switching device may permit the transmission of RF signals between a first port and a second port while in one of the states. For example, when in a first state, such as an ON state, the RF switching device may enable transmission of RF signals from one port, such as an input port, to a second port, such as an output port. When in a second state, such as an OFF state, the RF switching device may prevent transmission of RF signals from an input port to an output port, thereby electrically isolating the input port from the output port.

Figure 34:
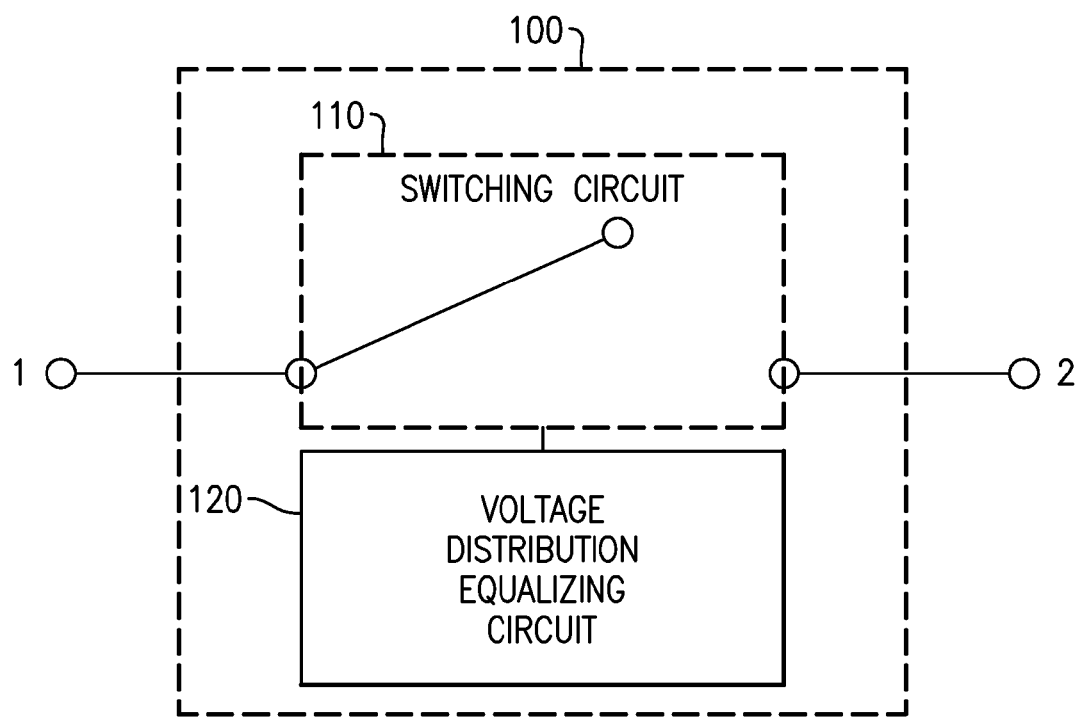
FIG. 34 schematically depicts a switching device including a switching circuit having a voltage distribution equalizing circuit, where the switching device is configured to allow passage of signals such as radio-frequency (RF) signals between first and second ports when in a first state.

Referring to FIG. 34, a switching device 10 having a first port and a second port may include a switching circuit 11. In some embodiments, the switching circuit 11 may further include a voltage distribution equalizing circuit 12. A voltage distribution equalizing circuit 12 may enable more uniform voltage distribution across a switching circuit 11 when the switching circuit is in an ON state, where an RF signal can be transmitted between an input port and an output port. In some embodiments, a voltage distribution equalizing circuit 12 may improve voltage distribution across a switching circuit 11 operating under high power. Increased uniformity in voltage swing across a switching circuit 11 may enable improved switching device 10 performance, including improvement in compression point, harmonics and intermodulation distortion performance.

Figure 35:
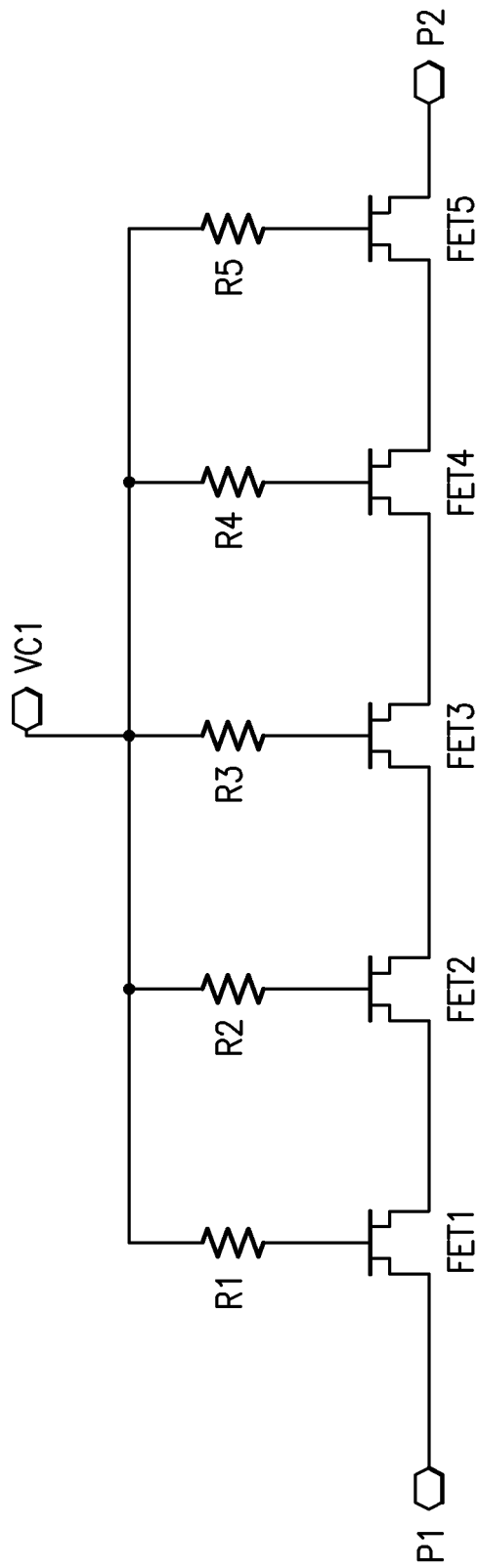
FIG. 35 shows a switching circuit including five FETs connected in series defining an RF signal path between an input end and an output end.

A switching device 10 may be implemented on a semiconductor substrate. In the semiconductor substrate context, a switching device 10 may include a switching circuit 11 having an FET stack. In some embodiments, an FET stack may include one or more FETs, where an FET has a source, a drain, a body node or a gate node. Additional FETs may be connected in series so as to define an RF signal path between an input end and an output end. In some embodiments, the FET stack is capable of being in a first or second state, such that when in a first state, for example an ON state, an RF signal can be transmitted from the input end to the output end, allowing the switching device 10 to transmit an RF signal from an input port to an output port. Meanwhile, when the FETs are in a second state, for example an OFF state, the FETs may prevent transmission of RF signals between the input end and the output end, thereby electrically isolating the input port from the output port of a switching device 10. FIG. 35 shows an example switching circuit having an FET stack that includes five FETs, FET1, FET2, FET3, FET4, and FET5, connected in series and defining an input end and an output end.

Increasing the FET stack height, or the number of FETs, of a switching circuit may improve switching device performance, including performance while operating under high power. However, a switching device may exhibit non-uniform voltage distribution across the switching device FET stack when the switching device is in an ON state and encountered by an RF signal at its input port. In some embodiments, a switching device may exhibit non-uniform voltage distribution across the switching device FET stack while operating under high power. Non-uniform voltage swing across an FET stack may adversely affect device performance, including harmonic peaking, intermodulation distortion (IMD), or compression point degradation.

A voltage distribution equalizing circuit may be coupled to a switching circuit to improve voltage swing uniformity across the switching circuit. A switching circuit having an FET stack may include a voltage distribution equalizing circuit that utilizes the body nodes of body contacted FETs for voltage compensation, thereby improving voltage distribution uniformity, or reducing voltage distribution variation, across the FET stack. In some embodiments, the voltage distribution equalizing circuit may include a body node voltage compensation technique. For example, a voltage distribution equalizing circuit of a switching circuit may include a capacitive element coupled to a body node of an FET in the FET stack. In some embodiments, a capacitive element is coupled to the body node of each FET in an FET stack. A voltage distribution equalizing circuit may also optionally include a resistive element coupled to a body node of an FET in the FET stack. In some embodiments, a resistive element is coupled to the body node of each FET in an FET stack. Further, the main RF signal may be coupled to the body node of an FET in an FET stack. In some embodiments, the RF signal is coupled to the body node of an FET in the FET stack through a feed-forward capacitive element Cfwd or a feed-forward resistive element Rfwd.

Figure 36:
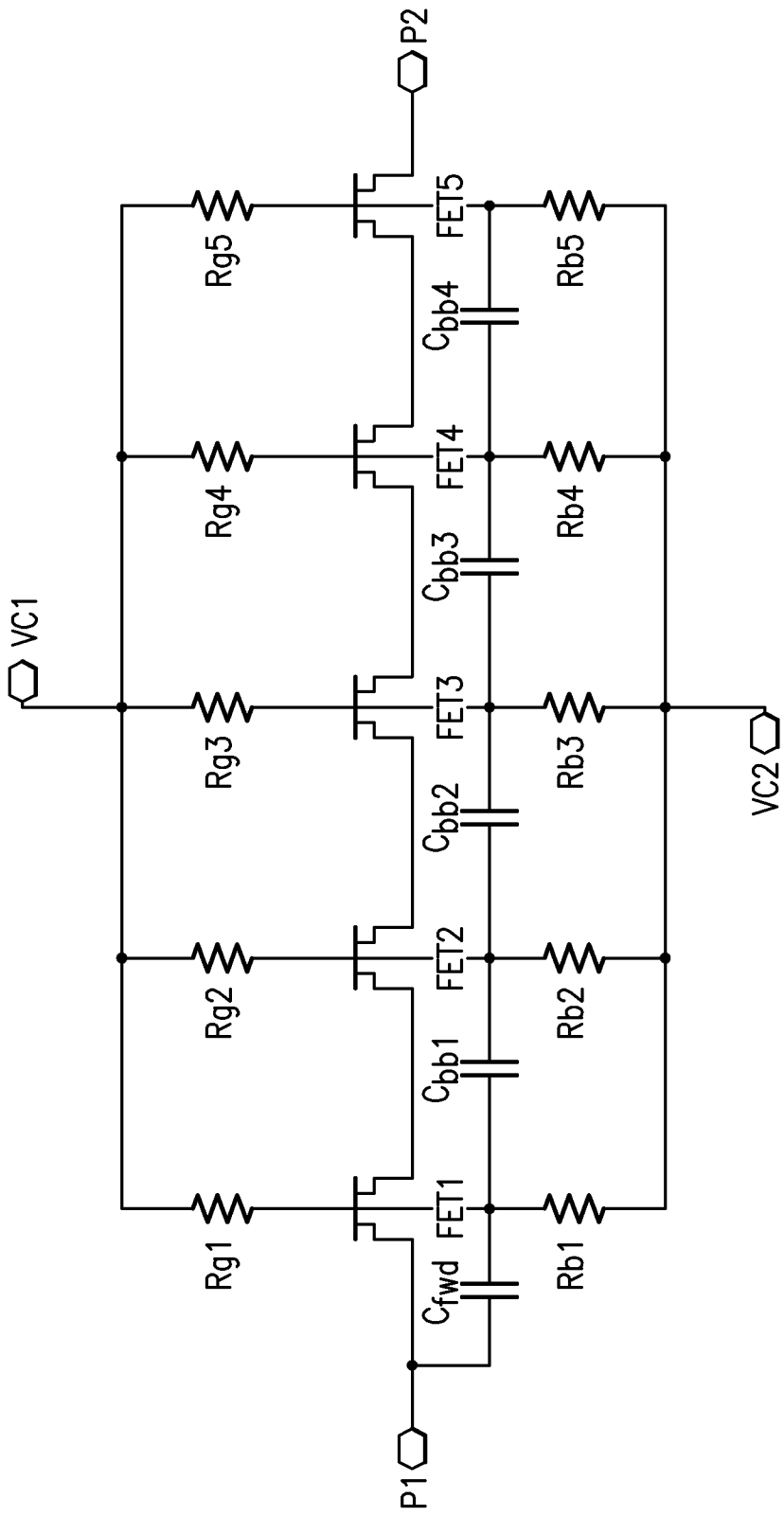
FIG. 36 shows a switching circuit including five FETs connected in series defining an input end and an output end, and including an implementation of the body node voltage compensation technique.

Referring to FIG. 36, the voltage distribution equalizing circuit of a switching circuit having an FET stack may optionally couple capacitive elements, Cbb, with the body nodes of FETs in an FET stack. In the example switching circuit of FIG. 36 including five FETs, FET1, FET2, FET3, FET4 and FET5, body nodes of FET1, FET2, FET3, FET4 and FET5 are coupled to capacitive elements Cbb1, Cbb2, Cbb3, and Cbb4. Capacitance values of capacitive elements Cbb may be scaled for improved switching device performance. The capacitance values of Cbb can be selected for increased voltage swing uniformity across the FET stack. In some embodiments, capacitance of the capacitive elements Cbb may also optionally have distinct values. Additionally, in some embodiments, capacitive elements Cbb can be implemented such that the capacitance of Cbb elements are in decreasing order, starting from a Cbb coupled to a first FET in an FET stack. Referring to the embodiment shown in FIG. 36, capacitance values of Cbb1, Cbb2, Cbb3, and Cbb4 may be distinct from one another. Capacitance values of Cbb1, Cbb2, Cbb3 or Cbb4 may each be selected to increase voltage distribution uniformity across FET1, FET2, FET3, FET4 and FET5. Further, elements Cbb may each have distinct capacitance values such that the capacitance value of Cbb1 is greater than that of Cbb2, the capacitance value of Cbb2 is greater than that of Cbb3, and the capacitance value of Cbb3 is greater than that of Cbb4.

In some embodiments, implementation of the body node voltage compensation technique in a switching circuit having an FET stack also includes a feed-forward capacitive element, Cfwd, that couples the main RF signal path to the body node. The RF signal path may be coupled to the body node through an FET in the FET stack. In an example embodiment, as shown in FIG. 36, a feed-forward capacitive element, Cfwd, can couple the RF signal path to the body node of a first FET in an FET stack. In such embodiments, the RF signal path is coupled through the source or drain of the first FET to the body node of the first FET. In the alternative, the RF signal path can be optionally coupled through the source or drain of another FET within the FET stack.

Furthermore, as shown in FIG. 36, the body node voltage compensation technique may also include resistive elements Rb, such as resistive elements Rb1, Rb2, Rb3, Rb4 and Rb5 in FIG. 36, implemented to float the body node of each FET in the FET stack. Meanwhile, resistive elements Rg, such as resistive elements Rg1, Rg2, Rg3, Rg4, Rg5 in FIG. 36, can be implemented to float the gate node of each FET in the FET stack.

Figure 37:
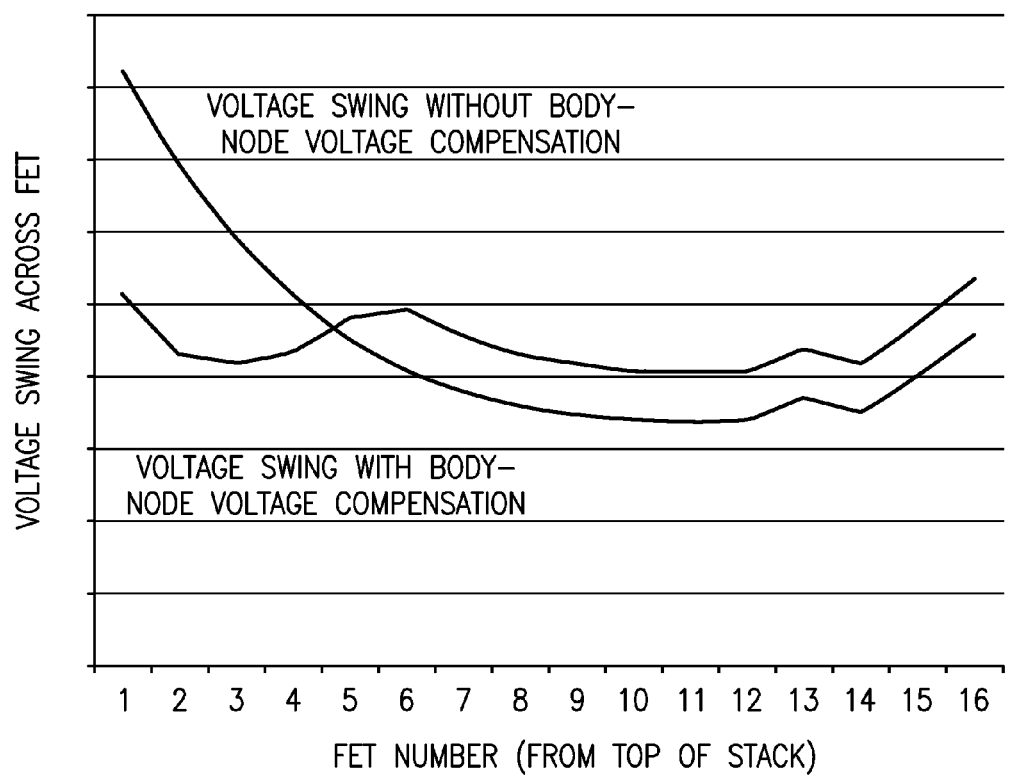
FIG. 37 graphs a comparison of voltage swing performance across the FETs of a switching circuit including an embodiment of the body node voltage compensation technique to that of a switching circuit that does not include the technique.

Improved voltage swing performance across an FET stack of a switching circuit implementing an embodiment of a voltage distribution equalizing circuit is shown in FIG. 37. FIG. 37 compares voltage swing performance across the FET stack of two example switching devices operating under 35 dBm and 20:1 mismatch. For the graphed comparison, the voltage swing performance across a switching device including an embodiment of the body node voltage compensation technique is compared to that of a switching device that does not include an embodiment of the body node voltage compensation technique. The switching device coupled to an embodiment of the body node voltage compensation technique has Cbb elements of distinct capacitance values, such that the capacitance of Cbb1 is larger than that of Cbb2, the capacitance of Cbb2 is larger than that of Cbb3, and so forth. Referring to FIG. 37, voltage swing across each FET of the example switching device including an embodiment of the body node voltage compensation technique remains within a significantly narrower range than that of the switching device which does not include a body node voltage compensation technique. Hence, the example switching device implementing an embodiment of the body node voltage compensation technique demonstrates increased voltage swing uniformity across the constituent FETs as compared to an example FET stack which does not implement a voltage distribution equalizing circuit.

Figure 38:
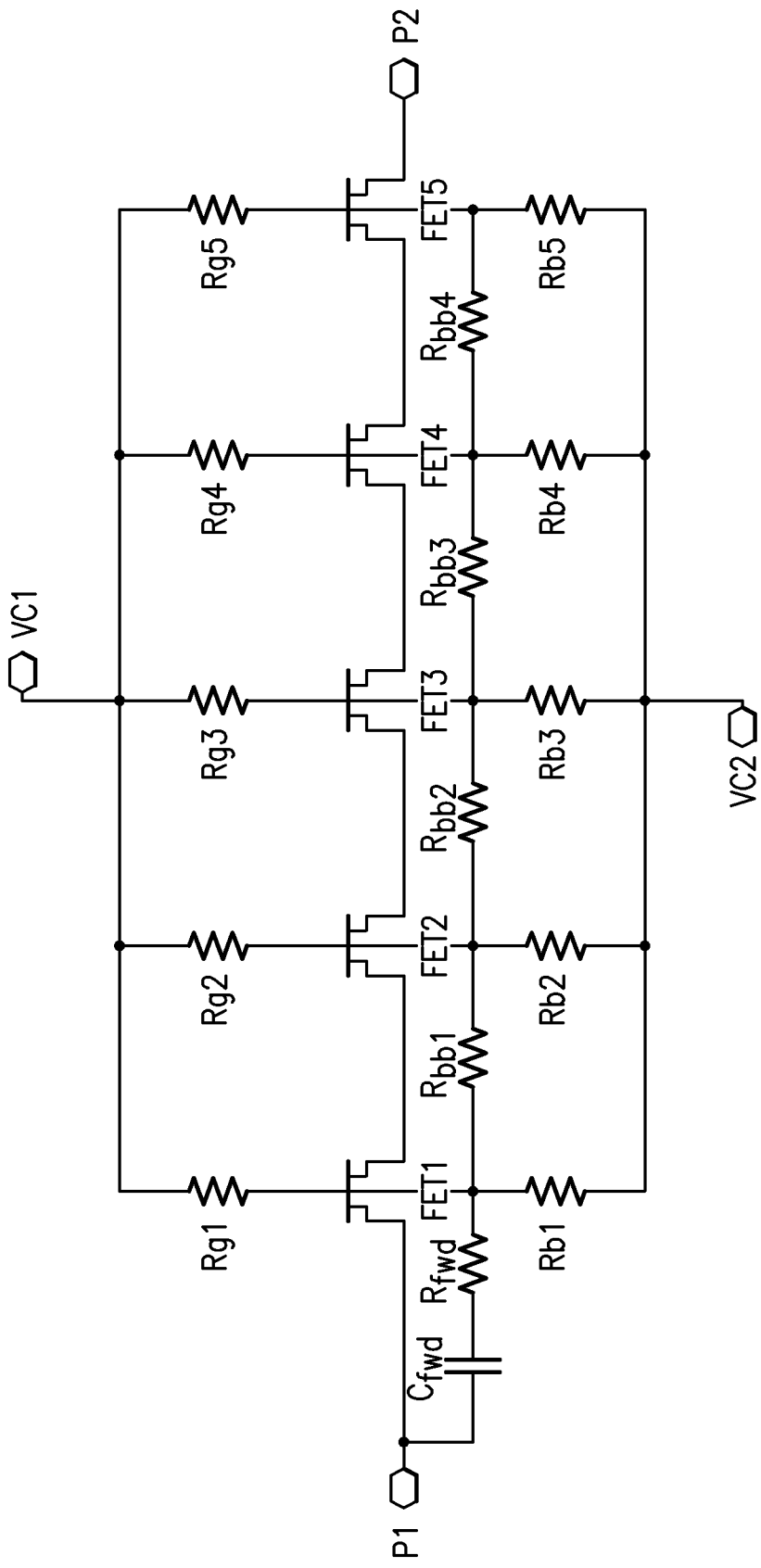
FIG. 38 shows a switching circuit including five FETs connected in series defining an RF signal path between an input end and an output end, and including an implementation of the body node voltage compensation technique.

Referring to FIG. 38, a resistive element Rbb may be coupled to a body node of an FET in an FET stack of a switching circuit to improve device performance. In some embodiments, a resistive element Rbb may be coupled to the body node of each FET in an FET stack to provide increased voltage distribution uniformity across the FET stack of a switching circuit. For example, a switching circuit used in transmission of RF signals at lower frequencies may optionally implement an embodiment of the body node voltage compensation technique where a resistive element Rbb is coupled to the body node of each FET in the FET stack to increase voltage swing uniformity across the FET stack. Resistance of resistive elements Rbb may be selected to increase uniformity of voltage swing across an FET stack. Resistive elements Rbb coupled to body nodes of FETs in an FET stack of a switching circuit may have distinct resistance values. In some embodiments, the resistive elements Rbb may have resistance values in decreasing order, starting from the resistive element Rbb coupled to a first FET in an FET stack.

For example, as shown in FIG. 38, in some embodiments of a switching circuit having an FET stack of five FETs connected in series, resistive elements Rbb1, Rbb2, Rbb3 and Rbb4 can be coupled to each of the body nodes of FET1, FET2, FET3, FET4 and FET5. To improve uniformity of voltage swing distribution across the FET stack, resistive elements Rbb1, Rbb2, Rbb3 and Rbb4 may also have resistance values in decreasing order, such that the resistance value of Rbb1 is greater than that of Rbb2, and the resistance value of Rbb2 is greater than that of Rbb3, and the resistance value of Rbb3 is greater than that of Rbb4.

Referring to FIG. 38, in some embodiments of the body node voltage compensation technique, a feed-forward resistive element may also be optionally used from the main RF signal path to the body node of the FET stack. Further, in some embodiments of the body node voltage compensation technique where a resistive element Rbb is coupled to a body node of an FET in an FET stack, a feed-forward capacitive element, Cfwd, can be used from the main RF signal path to the body node of the FET stack. The RF signal path may be coupled to the body node through an FET in the FET stack. In some embodiments where both a feed-forward capacitive element and a feed-forward resistive element are implemented, the feed-forward capacitive element may be connected in series with the feed-forward resistive element. Referring to FIG. 38, a feed-forward capacitive element Cfwd connected in series with a feed-forward resistive element can be used to couple the RF signal to the body node of a first FET in an FET stack. In such embodiments, the RF signal path is coupled through the source or drain of the first FET to the body node of the first FET. In the alternative, the RF signal path can be optionally coupled through the source or drain of another FET within the FET stack.

Referring to FIG. 38, in some embodiments of the body node voltage compensation technique where resistive elements Rbb are coupled to the body node of an FET in an FET stack, the switching circuit may also include resistive elements Rb, such as resistive elements Rb1, Rb2, Rb3, Rb4 and Rb5 in FIG. 38, implemented to float the body node of each FET in the FET stack. Meanwhile, resistive elements Rg, such as resistive elements Rg1, Rg2, Rg3, Rg4, Rg5 in FIG. 38, can be implemented to float the gate node of each FET in the FET stack.

Figure 39:
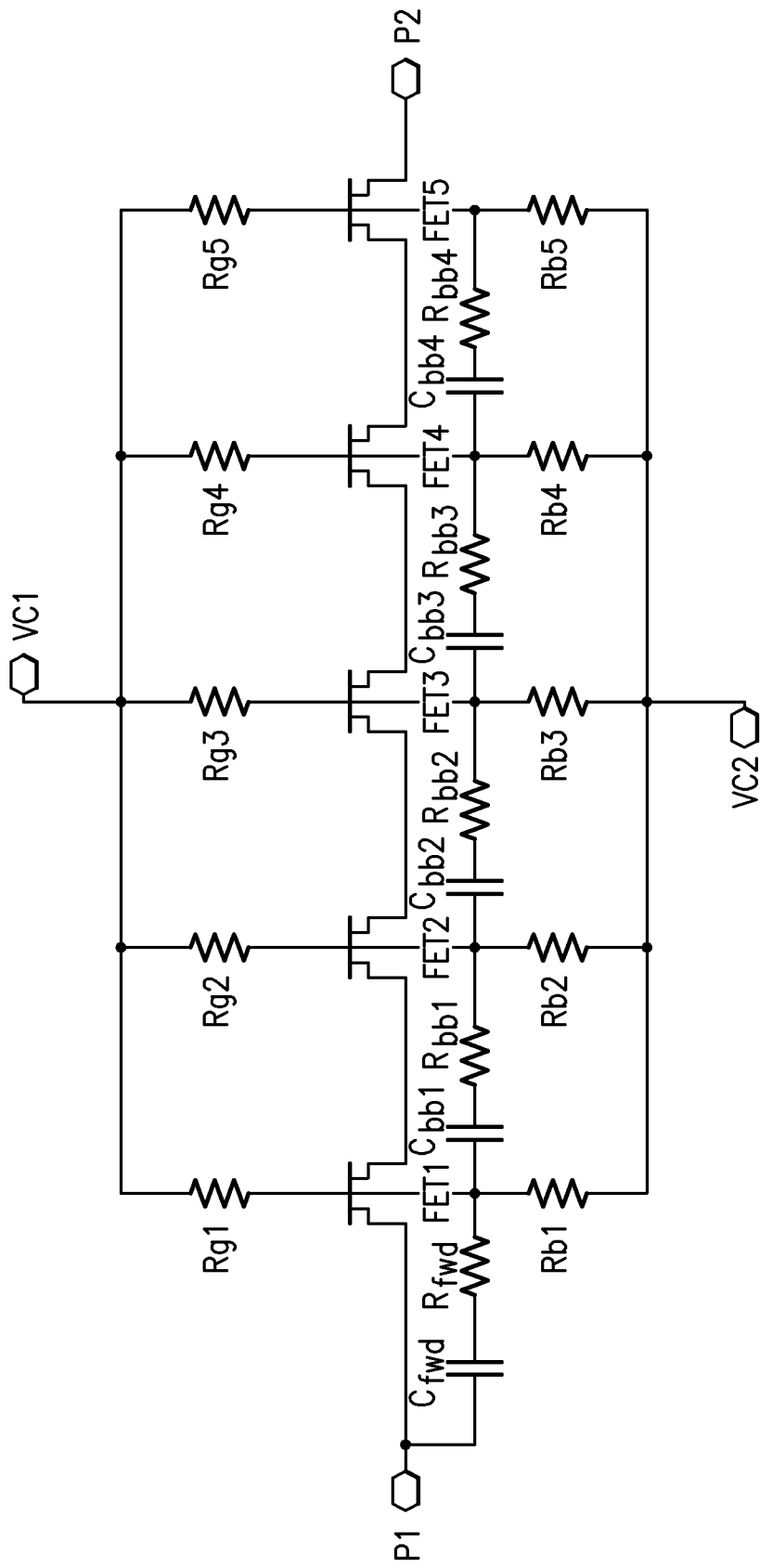
FIG. 39 shows a switching circuit including five FETs connected in series defining an RF signal path between and input end and an output end, and including an implementation of the body node voltage compensation technique.

A switching circuit having a voltage distribution equalizing circuit may implement an embodiment of the body node voltage compensation technique where an FET in an FET stack is coupled to a capacitive element Cbb that is connected in series with a resistive element Rbb. Referring to FIG. 39, an example switching circuit implementing an embodiment of the body node voltage compensation technique may couple the body node of each FET in an FET stack to a capacitive element Cbb that is connected in series with a resistive element Rbb. For example, the body nodes of FET1, FET2, FET3, FET4, and FET5 are respectively coupled to Cbb1 connected in series with Rbb1, Cbb2 connected in series with Rbb2, Cbb3 connected in series with Rbb3, and Cbb4 connected in series with Rbb4.

Referring to FIG. 39, in some embodiments where the body node of an FET in an FET stack is coupled to a capacitive element Cbb that is connected in series with a resistive element Rbb, a feed-forward capacitive element Cfwd can be used from the main RF signal path to the body node of the FET stack. A feed-forward resistive element Rfwd may also be optionally used from the main RF signal path to the body node of the FET stack. In some embodiments where both a feed-forward capacitive element Cfwd and a feed-forward resistive element Rfwd are implemented, the feed-forward capacitive element Cfwd may be connected in series with the feed-forward resistive element Rfwd. Referring to FIG. 39, a feed-forward capacitive element Cfwd connected in series with a feed-forward resistive element Rfwd can be used to couple the RF signal to the body node of a first FET in an FET stack. In such embodiments, the RF signal path is coupled through the source or drain of the first FET to the body node of the first FET within the FET stack. In the alternative, the RF signal path can be optionally coupled through the source or drain of another FET within the FET stack.

Further, as shown in FIG. 39, in some implementations of the body node voltage compensation technique where the body node of an FET in an FET stack is coupled to a capacitive element Cbb that is connected in series with a resistive element Rbb, resistive elements Rb, such as resistive elements Rb1, Rb2, Rb3, Rb4 and Rb5 in FIG. 39, may be implemented to float the body node of each FET in the FET stack. Meanwhile, resistive elements Rg, such as resistive elements Rg1, Rg2, Rg3, Rg4, Rg5 in FIG. 39, can be implemented to float the gate node of each FET in the FET stack.

Figure 40:
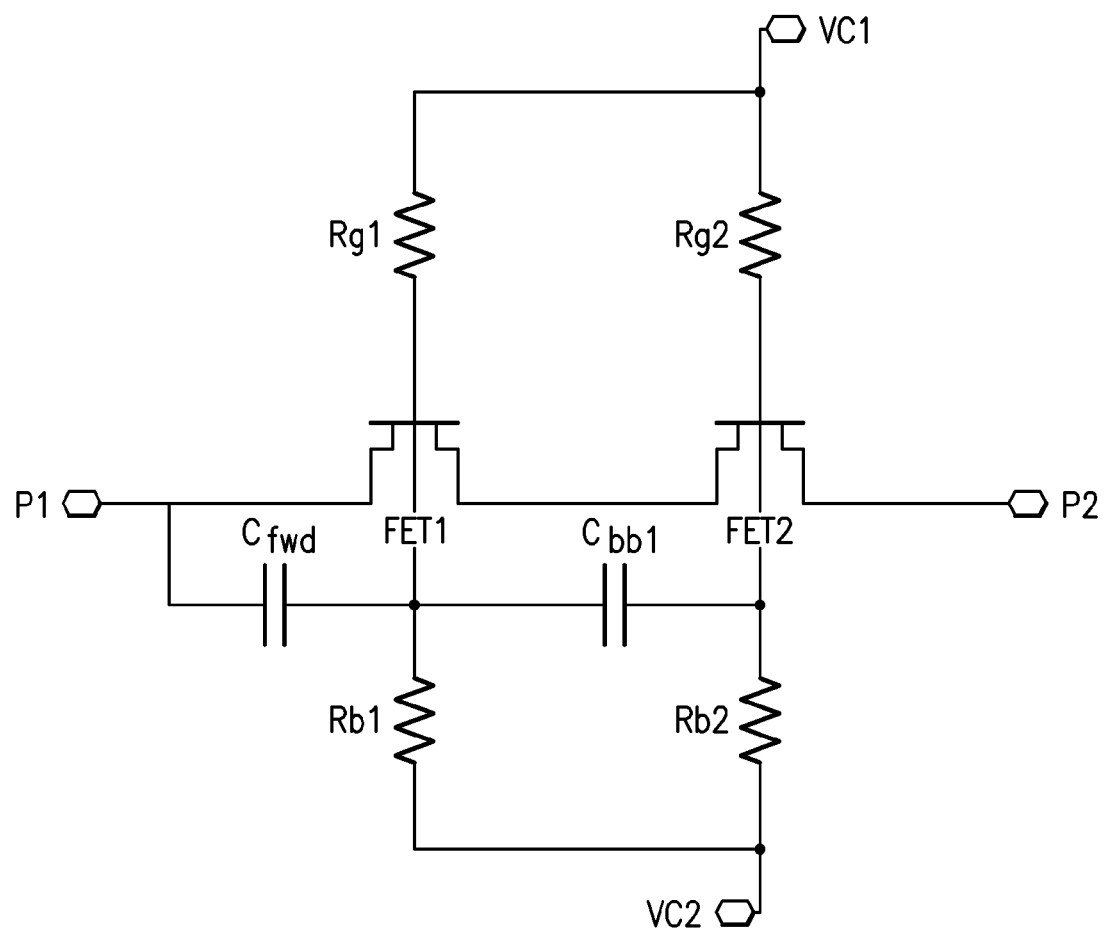
FIG. 40 shows an example switching circuit including two FETs connected in series defining an RF signal path between an input end and an output end, and including an implementation of the body node voltage compensation technique.

The voltage distribution equalizing circuit may be implemented for switching circuits that include varying numbers of FETs in the FET stack. For example, FIG. 40 shows a switching circuit having two FETs, FET1 and FET2. A voltage distribution equalizing circuit including an embodiment of the body node voltage compensation technique having characteristics as discussed herein may be implemented for such a switching circuit. In some embodiments of such a switching circuit, implementation of the body node voltage compensation technique may include a capacitive element Cbb1 coupled to the body nodes of FET1 and FET2. The body node voltage compensation technique of the example switching circuit may further optionally include a feed-forward capacitive element Cfwd coupling the main RF signal path to the body node of an FET in an FET stack, such as the first FET, FET1. Additionally, resistive elements Rb1 and Rb2 may be implemented to float the body nodes of FET1 and FET2 respectively. Meanwhile, resistive elements Rg1 and Rg2 may be implemented to float the gate nodes of FET1 and FET2.

Figure 41:
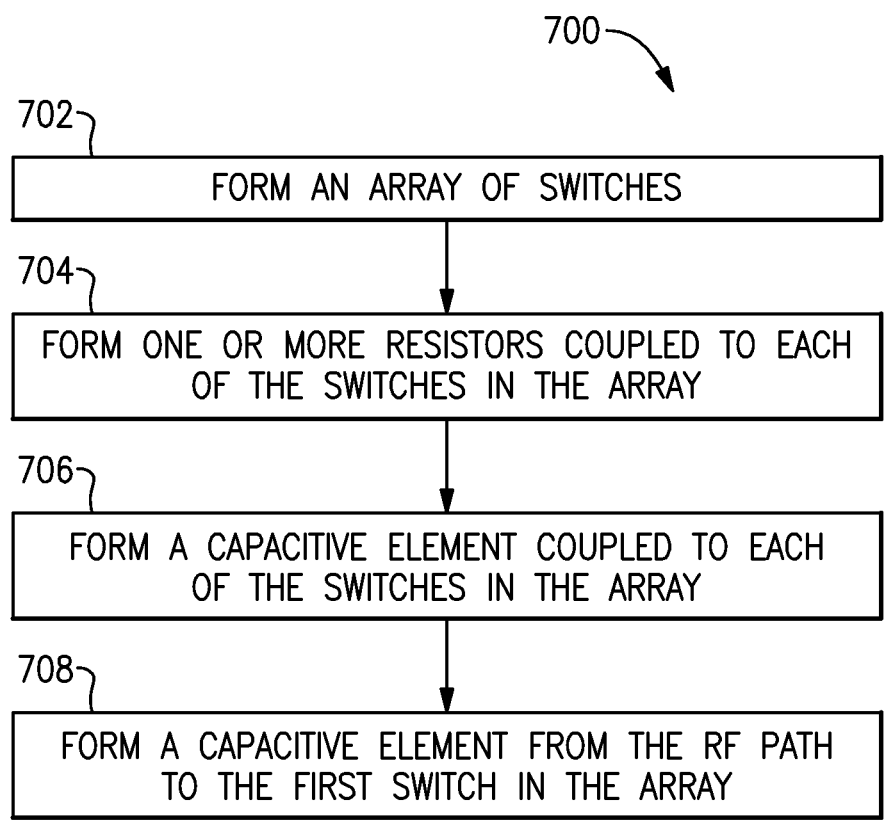
FIG. 41 shows a process that can be applied to fabricate a switching circuit having one or more features as described herein.

FIG. 41 shows a process 700 that can be implemented to fabricate a voltage swing distribution equalizing circuit having one or more features as described herein. In block 702, an array of switches can be formed. In embodiments where the switches are formed on a semiconductor substrate, semiconductor switches such as FETs can be formed on the substrate. In block 704, resistive elements coupled to each of the switches can be formed. In the semiconductor substrate context, resistive elements can be coupled to the body node or gate node of the FETs. As shown in block 706, capacitive elements coupled to the switches can be formed. In the context where switches including FETs are formed on a semiconductor substrate, capacitive elements coupled to the body nodes of FETs can be formed. In block 708, a capacitive element may also be formed from the RF path to a switch in the array. Such a capacitive element may be optionally formed from the RF path to any switch in the array, including the first switch in the array. In some embodiments where the array of switches include FETs formed on a semiconductor substrate, the capacitive element of block 708 can be formed from the source or drain of the first FET to the body node of the first FET.

Figure 42:
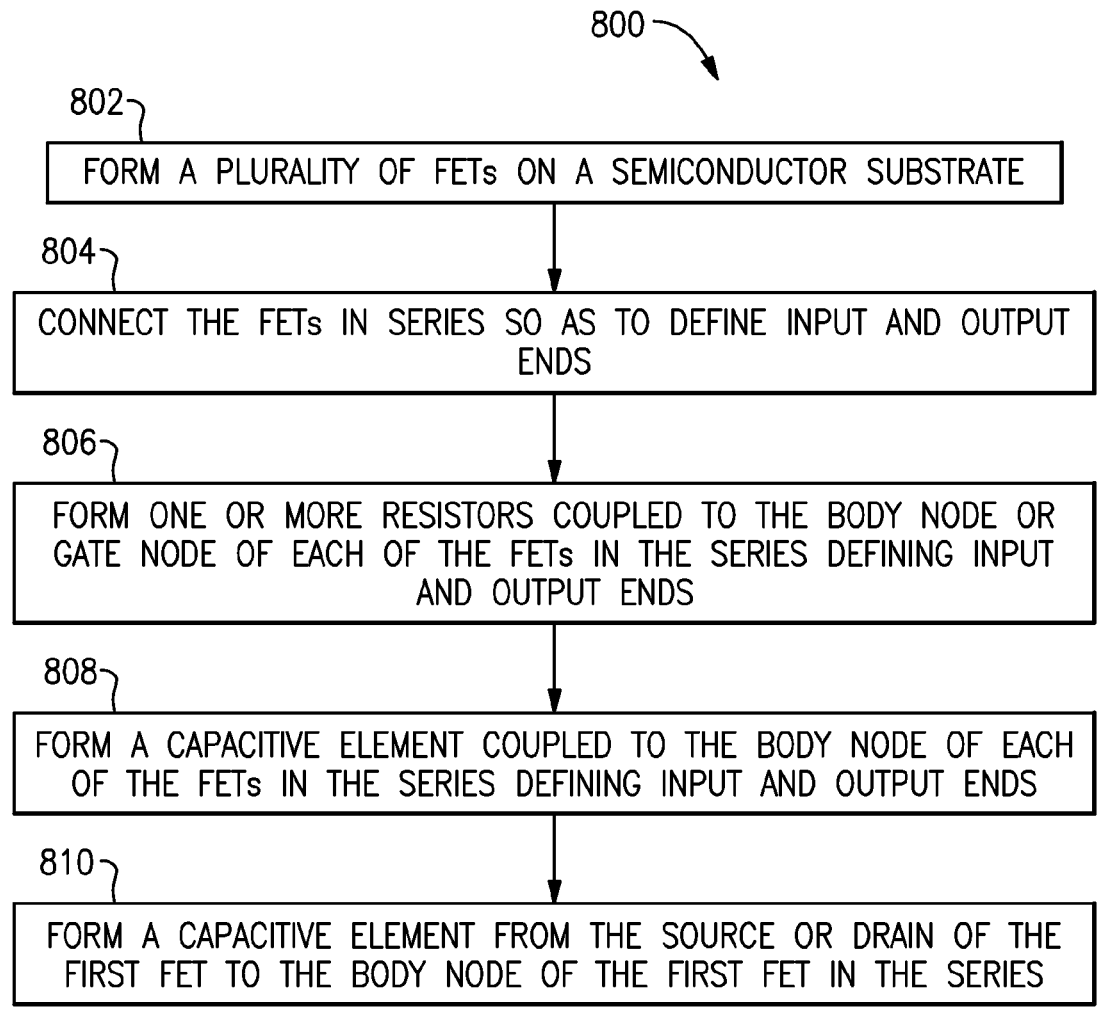
FIG. 42 shows a process that can be applied as a more specific example of the process of FIG. 10.

FIG. 42 shows a process 800 that can be a more specific example of the process shown in FIG. 41. In block 802, a plurality of FETs can be formed on a semiconductor substrate. In block 804, the plurality of FETs can be connected in series so as to define an input end and an output end. In block 806, a resistive element can be coupled to the body node or gate node of each of the FETs in the series defining an input end and an output end. In block 808, a capacitive element coupled to the body node of each of the FETs can be formed. Further, in block 810, a capacitive element can be formed from the source or drain of an FET to the body node of the FET to couple the main RF signal to a body node of an FET. The capacitive element can be optionally formed from the source or drain of the first FET to the body node of the first FET in the series of FETs defining an input end and an output end.

Summary of Example 12

In some implementations, Example 12 relates to a radio-frequency (RF) switch that includes a plurality of field-effect transistors (FETs) connected in series between first and second nodes, with each FET having a body. The RF switch further includes a compensation network having a coupling circuit that couples the bodies of each pair of neighboring FETs.

In some embodiments, at least some of the FETs can be silicon-on-insulator (SOI) FETs. In some embodiments, the compensation network can be configured to reduce voltage swings across each of the plurality of FETs. In some embodiments, The switch can further include a feed-forward circuit that couples a source of an end FET to the body of the end FET. The feed-forward circuit can include a capacitor. The feed-forward circuit can further include a resistor in series with the capacitor.

In some embodiments, the coupling circuit can include a capacitor. The coupling circuit can further include a resistor in series with the capacitor.

In some embodiments, the coupling circuit can include a resistor. In some embodiments, the switch can further include a body bias network connected to and configured to provide bias signals to the bodies of the FETs. The body bias network can be configured so that all of the bodies receive a common bias signal.

In some embodiments, the switch can further include a gate bias network connected to and configured to provide bias signals to the gates of the FETs. The gate bias network can be configured so that all of the gates receive a common bias signal.

In some embodiments, the first node can be configured to receive an RF signal having a power value and the second node can be configured to output the RF signal when the FET is in an ON state. The at least one FET can include N FETs connected in series, with the quantity N being selected to allow the switch circuit to handle the power of the RF signal.

According to a number of implementations, Example 12 relates to a method for operating a radio-frequency (RF) switch. The method includes controlling a plurality of field-effect transistors (FETs) connected in series between first and second nodes so that the FETs are collectively in an ON state or an OFF state, with each FET having a body. The method further includes coupling the bodies of each of neighboring FETs to reduce voltage swings across each of the plurality of FETs.

In accordance with a number of implementations, Example 12 relates to a semiconductor die that includes a semiconductor substrate and a plurality of field-effect transistors (FETs) formed on the semiconductor substrate and connected in series, with each FET having a body. The die further includes a compensation network formed on the semiconductor substrate, the compensation network including a coupling circuit that couples the bodies of each pair of neighboring FETs.

In some embodiments, the die can further include an insulator layer disposed between the FETs and the semiconductor substrate. The die can be a silicon-on-insulator (SOI) die.

In a number of implementations, Example 12 relates to a method for fabricating a semiconductor die. The method includes providing a semiconductor substrate and forming a plurality of field-effect transistors (FETs) on the semiconductor substrate so as to be connected in series, with each FET having a body. The method further includes forming a coupling circuit on the semiconductor substrate so as to couple the bodies of each pair of neighboring FETs.

In some embodiments, the method can further include forming an insulator layer between the FETs and the semiconductor substrate.

In a number of implementations, Example 12 relates to a radio-frequency (RF) switch module that includes a packaging substrate configured to receive a plurality of components. The module further includes a semiconductor die mounted on the packaging substrate. The die includes a plurality of field-effect transistors (FETs) connected in series, with each FET having a body. The module further includes a compensation network having a coupling circuit that couples the bodies of each pair of neighboring FETs.

In some embodiments, the semiconductor die can be a silicon-on-insulator (SOI) die. In some embodiments, the compensation network can be part of the same semiconductor die as the at least one FET. In some embodiments, the compensation network can be part of a second die mounted on the packaging substrate. In some embodiments, the compensation network can be disposed at a location outside of the semiconductor die.

According to some implementations, Example 12 relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes a plurality of field-effect transistors (FETs) connected in series, with each FET having a body. The switch further includes a compensation network having a coupling circuit that couples the bodies of each pair of neighboring FETs.

In some implementations, Example 12 relates to a switching circuit that includes an input port configured to receive a radio-frequency (RF) signal and an output port configured to output the RF signal. The switching circuit may also include one or more field effect transistors (FETs) defining an RF signal path between the input port and the output port, each FET having a source, a drain, a gate node, and a body node. The switch may be configured to be capable of being in first and second states, the first state corresponding to the input and output ports being electrically connected so as to allow passage of the RF signal therebetween, the second state corresponding to the input and output ports being electrically isolated. The switching circuit may further include a voltage distribution circuit configured to reduce voltage distribution variation across the switch, the voltage distribution circuit including one or more elements coupled to a selected body node of one or more FETs to reduce voltage distribution variation across the switch when the switch is in the first state and encountered by an RF signal at the input port.

In some embodiments, the one or more elements coupled to the selected body node of one or more FETs may include a capacitive element. The one or more elements coupled to the selected body node of one or more FETs may include a resistive element. Further, in some embodiments the one or more elements coupled to the selected body node of one or more FETs may include a capacitive element connected in series to a resistive element.

In some embodiments, the voltage distribution circuit may include a feed-forward capacitive element configured to couple the RF signal path to the body node of an FET defining the RF signal path, including the body node of a first FET defining the RF signal path. In some embodiments, the voltage distribution circuit includes a feed-forward capacitive element connected in series to a feed-forward resistive element, configured to couple the RF signal path to the body node of an FET defining the RF signal path.

In some embodiments, a voltage distribution circuit may include a resistive element coupled to the gate node of an FET defining the RF signal path to thereby enable floating of the gate node of the FET. A resistive element may also be coupled to the body node of an FET defining the RF signal path to thereby enable floating of the body node of the FET.

According to some implementations, Example 12 relates to an integrated circuit (IC) formed on a die. The IC may include a switch having one or more field effect transistors (FETs) defining an RF signal path between an input port and an output port, each FET having a body node. The switch may be configured to be capable of being in ON and OFF states. In some embodiments, a voltage distribution circuit may be coupled to the switch and configured to reduce voltage distribution variation across the switch. The voltage distribution circuit may include one or more elements coupled to a selected body node of one or more FETs to reduce voltage distribution variation across the switch when the switch is in an ON state and is encountered by a respective RF signal at the input port.

In some embodiments, a transceiver circuit may be electrically connected to the switch and configured to process RF signals.

As taught in a number of implementations, Example 12 relates to a packaged module for a radio-frequency (RF) device. The module includes a packaging substrate and an integrated circuit (IC) formed on a semiconductor die and mounted on the packaging substrate. The IC may include a switch having one or more field effect transistors (FET) defining an RF signal path between an input port and an output port, each FET having a body node, and the switch may be configured to be capable of being in ON and OFF states. A voltage distribution circuit may be coupled to the switch to reduce voltage distribution variation across the switch when the switch is in an ON state and encountered by a respective RF signal at the input port. In some embodiments, the voltage distribution circuit may include one or more elements coupled to a selected body node of one or more FETs defining the RF signal path.

In some embodiments, the packaged module may also include at least one connection configured to facilitate passage of signals to and from the switch. In some embodiments, the packaged module may also include packaging structure configured to provide protection for the switch.

In accordance with some implementations, Example 12 relates to a wireless device. The wireless device may include at least one antenna configured to facilitate transmission and reception of radio-frequency (RF) signals. Further, the wireless device may also include a transceiver coupled to the antenna and configured to process radiofrequency (RF) signals. In some embodiments, the wireless device may include a switch having one or more field effect transistors (FETs) defining an RF signal path between an input port and an output port, each FET having a body node. Additionally, the switch may be configured to be capable of being in ON and OFF states. In some embodiments, a voltage distribution circuit may be coupled to the switch to reduce voltage distribution variation across the switch when the switch is in an ON state and encountered by an RF signal at the input port, the voltage distribution circuit including one or more elements coupled to a selected body node of one or more FETs defining the RF signal path.

In some embodiments, the wireless device may also include a receptacle configured to receive a battery and to provide electrical connection between the battery and the switch.

According to some implementations, Example 12 relates to a method of fabricating a radio-frequency (RF) switching circuit. The method may include providing or forming a substrate, and forming on the substrate one or more FETs connected in series to define an RF signal path between an input end and an output end, each FET having a source, a drain, a gate node and a body node. The method may further include forming an element coupled to a selected body node of the one or more FETs connected in series to thereby provide reduced voltage distribution variation across the switching circuit.

In some embodiments, forming the element coupled to the selected body node of the one or more FETs includes forming a capacitive element. Forming the element coupled to the selected body node of the one or more FETs may also include forming a resistive element. In some embodiments, the substrate may include a semiconductor substrate. In some embodiments, the method may further include forming a feed-forward capacitive element from the RF signal path to the body node of a selected FET defining the RF signal path between the input end and the output end. The method may further include forming a resistive element coupled to the gate node of an FET defining the input end and the output end to thereby enable floating of the gate node of the FET. In some embodiments, the method may optionally include forming a resistive element coupled to the body node of an FET defining the input end and output end to thereby enable floating of the body node of the FET.

Examples of Implementations in Products:

Various examples of FET-based switch circuits and bias/coupling configurations described herein can be implemented in a number of different ways and at different product levels. Some of such product implementations are described by way of examples.

Semiconductor Die Implementation

Figure 43A:
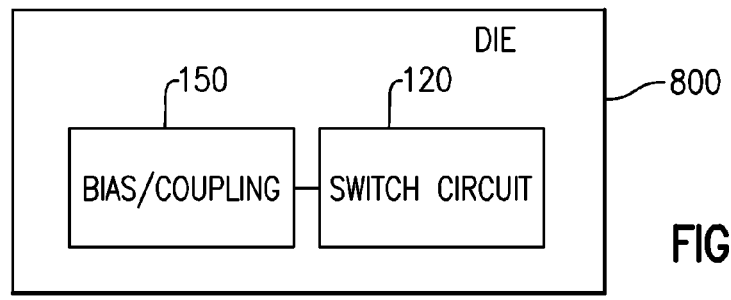
FIGS. 43A-43D show examples of how various components for biasing, coupling, and/or facilitating the example configurations of FIGS. 9-42 can be implemented.
Figure 43B:
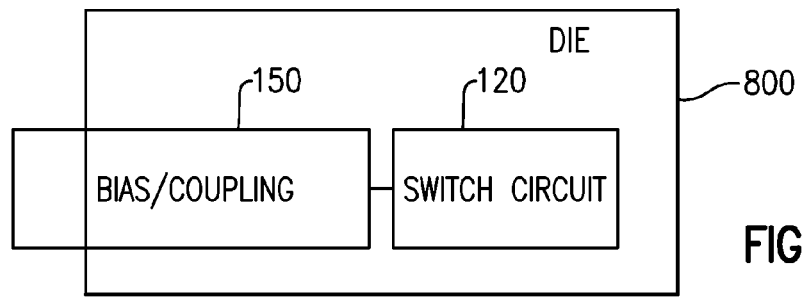

FIGS. 43A-43D schematically show non-limiting examples of such implementations on one or more semiconductor die. FIG. 43A shows that in some embodiments, a switch circuit 120 and a bias/coupling circuit 150 having one or more features as described herein can be implemented on a die 800. FIG. 43B shows that in some embodiments, at least some of the bias/coupling circuit 150 can be implemented outside of the die 800 of FIG. 43A.

Figure 43C:
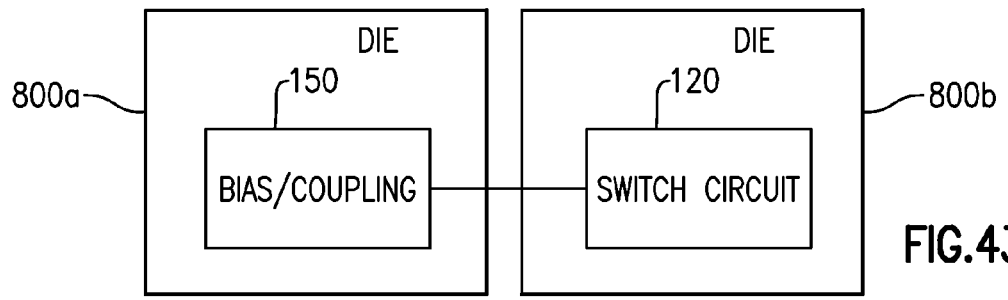
Figure 43D:
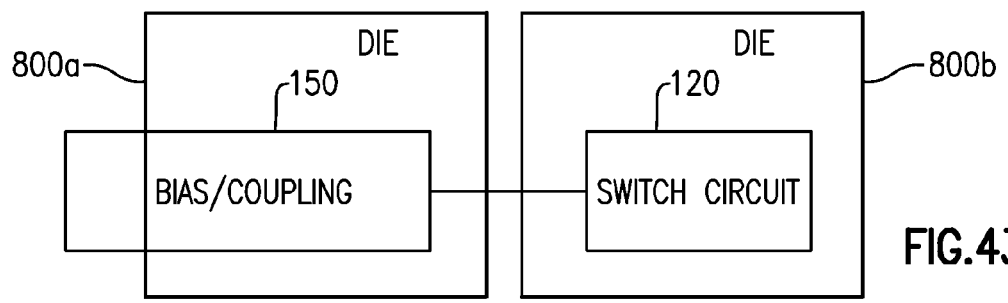

FIG. 43C shows that in some embodiments, a switch circuit 120 having one or more features as described herein can be implemented on a first die 800a, and a bias/coupling circuit 150 having one or more features as described herein can be implemented on a second die 800b. FIG. 43D shows that in some embodiments, at least some of the bias/coupling circuit 150 can be implemented outside of the first die 800a of FIG. 43C.

Packaged Module Implementation

Figure 44A:
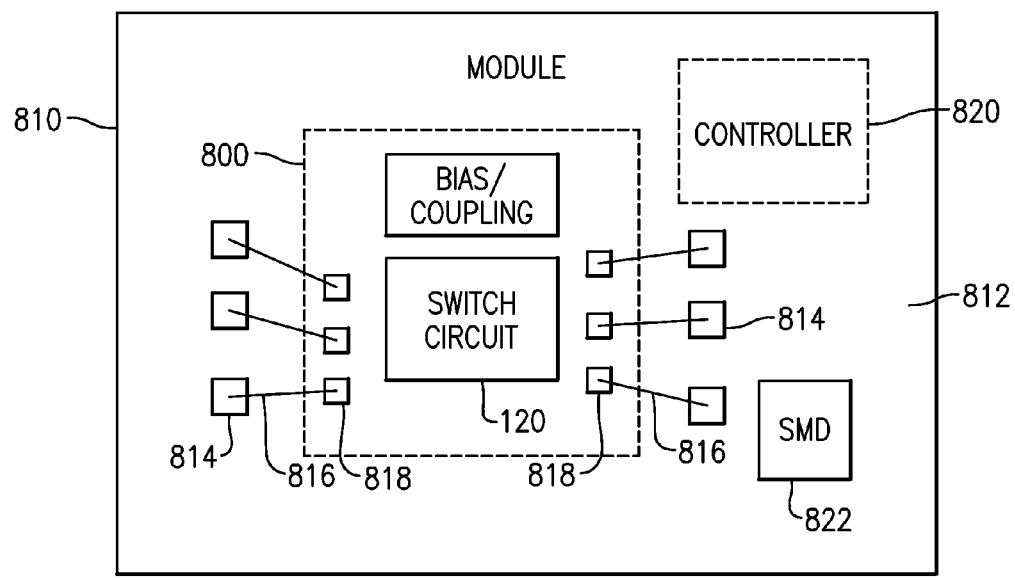
FIGS. 44A and 44B show an example of a packaged module that can include one or more features described herein.

In some embodiments, one or more die having one or more features described herein can be implemented in a packaged module. An example of such a module is shown in FIGS. 44A (plan view) and 44B (side view). Although described in the context of both of the switch circuit and the bias/coupling circuit being on the same die (e.g., example configuration of FIG. 44A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 44B:
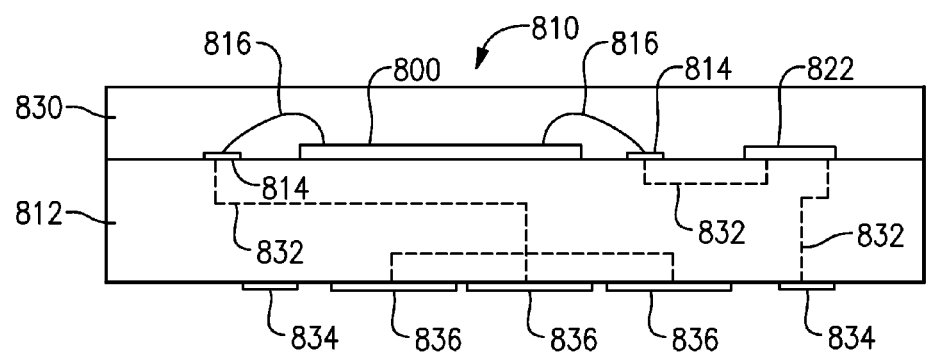
Figure 45:
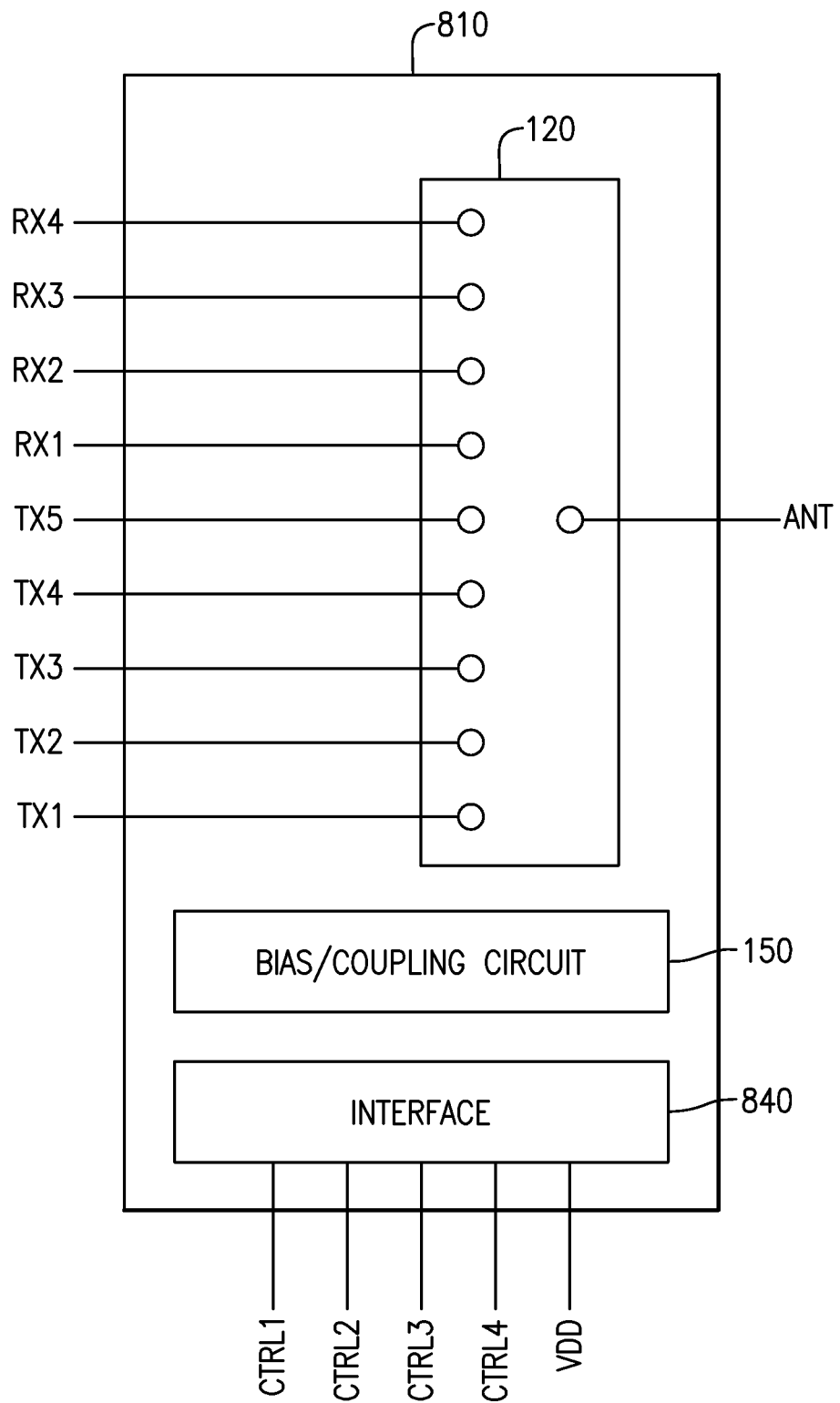
FIG. 45 shows that in some embodiments, one or more features of the present disclosure can be implemented in a switch device such as a single-pole-multi-throw (SPMT) switch configured to facilitate multi-band multi-mode wireless operation.

FIG. 45 shows a schematic diagram of an example switching configuration that can be implemented in the module 810 described in reference to FIGS. 44A and 44B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 46:
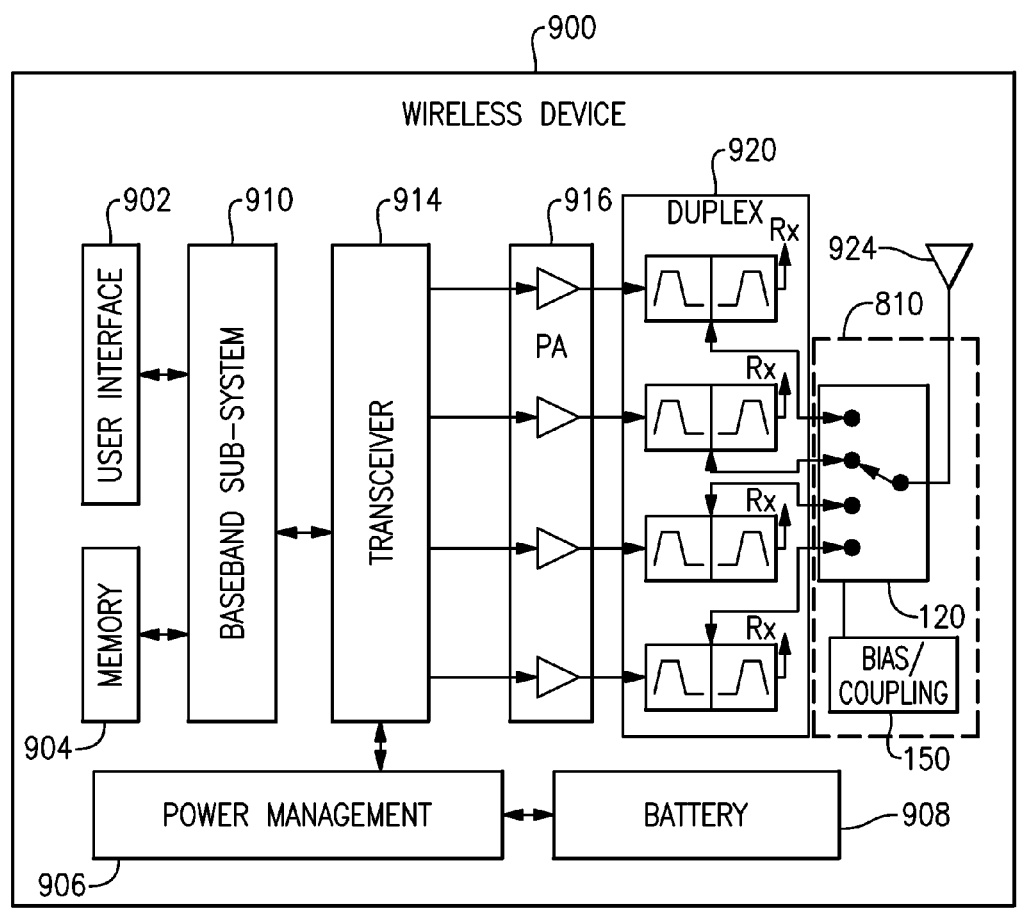
FIG. 46 shows an example of a wireless device that can include one or more features described herein.

FIG. 46 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 46, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 47:
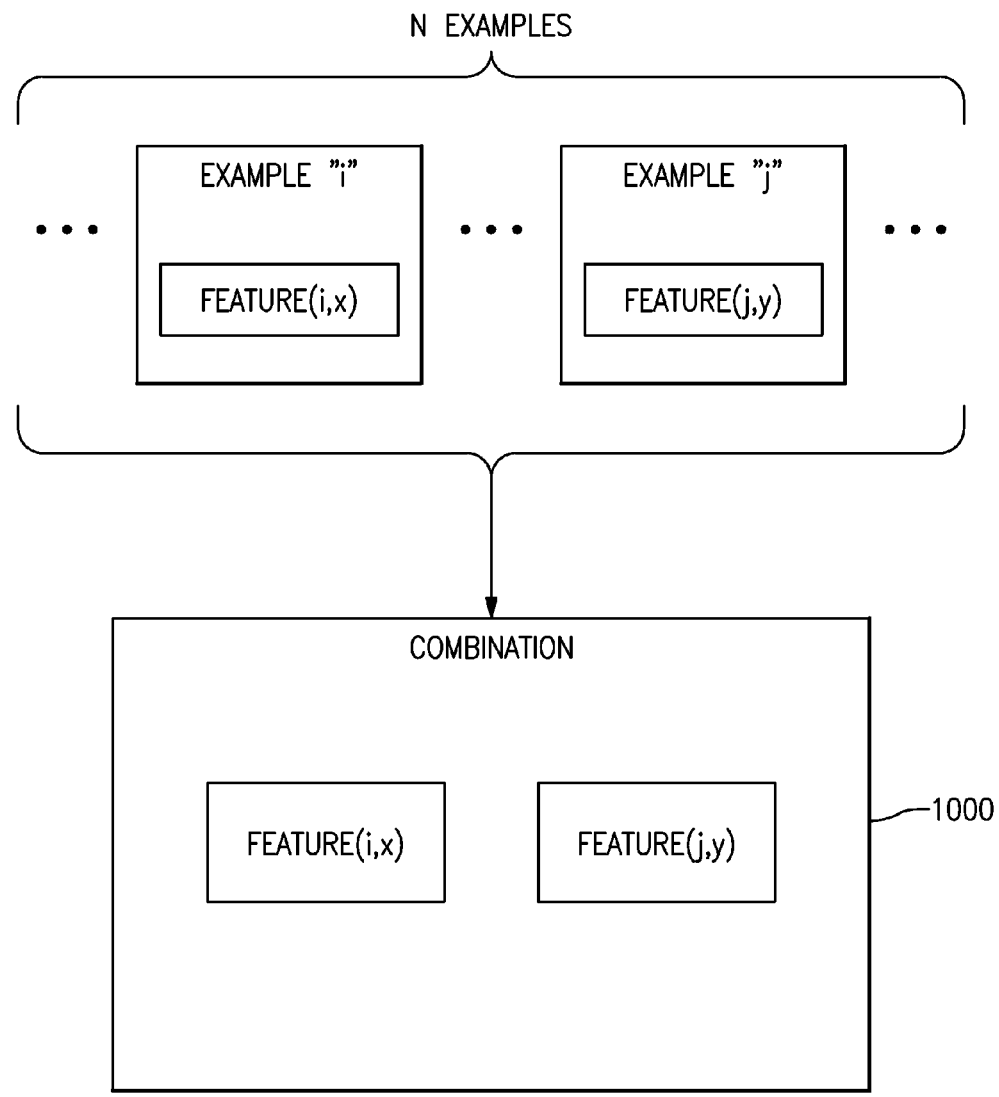
FIG. 47 shows that in some implementations, one or more features associated with a given example configuration can be combined with one or more features associated with another example configuration.

Combination of Features from Different Examples:

In some implementations, various features from different Examples described herein can be combined to yield one or more desirable configurations. FIG. 47 schematically depicts a combination configuration 1000 where a first feature (i,x) is shown to be combined with second feature (j,y). The indices "i" and "j" are for Example numbers among N Examples, with i=1, 2, . . . , N−1, N, and j=1, 2, . . . , N−1, N. In some implementations, i≠j for the first and second features of the combination configuration 1000. The index "x" can represent an individual feature associated with the i-th Example. The index "x" can also represent a combination of features associated with the i-th Example. Similarly, the index "y" can represent an individual feature associated with the j-th Example. The index "y" can also represent a combination of features associated with the j-th Example. As described herein, the value of N can be 12.

Although described in the context of combining features from two different Examples, it will be understood that features from more than two Examples can also be combined. For example, features from three, four, five, etc. Examples can be combined to yield a combination configuration.

GENERAL COMMENTS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) switch comprising:
a plurality of field-effect transistors (FETs) disposed between a first node and a second node, each of the plurality of FETs having a respective source, drain, gate and body, the plurality of FETs including a first FET connected in series with a second FET;
a coupling circuit that connects the body of each of the plurality of FETs to the gate of each of the plurality of FETs, the coupling circuit including a first circuit coupled in series to a resistance, the first circuit including a capacitance and a diode, the coupling circuit configured to behave as an approximately closed circuit at low frequencies below a selected value and an approximately open circuit at an operating frequency, the approximately closed circuit allowing removal of surface charge from the body;
a bias circuit that connects the gate of each of the plurality of FETs to a gate bias voltage, the bias circuit configured to bias the gate of each of the plurality of FETs; and
a compensation circuit including a non-linear capacitor connected at a first end to both the source of the first FET and the drain of the second FET, and further connected at a second end to a ground reference, the compensation circuit configured to generate one or more harmonics to substantially cancel a non-linearity effect generated by at least one of the plurality of FETs.

2. The switch of claim 1 wherein the diode comprises a PMOS diode.

3. The switch of claim 1 wherein the capacitance and the diode are coupled in parallel.

4. The RF switch of claim 1 wherein the FET comprises a silicon-on-insulator (SOI) FET.

5. The RF switch of claim 1 wherein the first node is configured to receive an RF signal having a power value and the second node is configured to output the RF signal when the FET is in an ON state.

6. The RF switch of claim 5 wherein the plurality of FETs comprises N FETs connected in series, the quantity N selected to allow the switch circuit to handle the power of the RF signal.

7. The switch of claim 1 wherein the non-linear capacitor includes a metal-oxide-semiconductor (MOS) capacitor.

8. The switch of claim 7 wherein the MOS capacitor includes an FET structure.

9. The switch of claim 8 wherein the one or more harmonics generated by the MOS capacitor is controlled at least in part by a body bias signal provided to the FET structure of the MOS capacitor.

10. The switch of claim 8 wherein the first end of the non-linear capacitor is connected to a drain and a source of the FET structure.

11. A method for operating a radio-frequency (RF) switch, the method comprising:
controlling a plurality of field-effect transistors (FETs) disposed between first and second nodes so that each of the plurality of FETs is in an ON state or an OFF state;
selectively removing surface charge from a respective body of each of the plurality of FETs at low frequencies below a selected value, the selective removal facilitated by a coupling circuit that behaves as an approximately closed circuit at the low frequencies, the coupling circuit including a first circuit coupled in series to a resistance, the first circuit including a capacitance and a diode;

biasing the gate of each of the plurality of FETs when the plurality of FETs is in an OFF state; and compensating a non-linear effect of the plurality of FETs by applying another non-linear signal to a source or a drain of the plurality of FETs and by generating one or more harmonics to substantially cancel the non-linear effect of the plurality of FETs, the compensating facilitated by a compensation circuit, and the compensation circuit include a non-linear capacitor.

12. The method of claim 11 wherein the coupling circuit further behaves as an approximately open circuit at an operating frequency.

13. The method of claim 12 wherein the capacitance and the diode are coupled in parallel.

14. A radio-frequency (RF) switch module comprising:
a packaging substrate configured to receive a plurality of components;
a semiconductor die mounted on the packaging substrate, the die including a plurality of field-effect transistors (FETs);
a coupling circuit that connects a respective body of each of the plurality of FETs to a respective gate of each of the plurality of FETs, the coupling circuit including a first circuit coupled in series to a resistance, the first circuit including a capacitance and a diode, the coupling circuit configured to behave as an approximately closed circuit at low frequencies below a selected value and as an approximately open circuit at an operating frequency, the approximately closed circuit allowing removal of surface charge from the respective body;
a bias circuit that connects a gate of each of the plurality of FETs to the reference node, the bias circuit configured to bias the gate; and
a compensation circuit including a non-linear capacitor connected at a first end to both the source of the first FET and the drain of the second FET, and further connected at a second end to a ground reference, the compensation circuit configured to generate one or more harmonics to substantially cancel a non-linearity effect generated by at least one of the plurality of FETs.

15. The switch module of claim 14 wherein the semiconductor die comprises a silicon-on-insulator (SOI) die.

16. The switch module of claim 14 wherein the coupling circuit is part of the same semiconductor die as the plurality of FETs.

17. The switch module of claim 14 wherein the coupling circuit is part of a second die mounted on the packaging substrate.

18. The switch module of claim 14 wherein the coupling circuit is disposed at a location outside of the semiconductor die.

* * * * *